(12) United States Patent
Yamamoto et al.

(10) Patent No.: US 7,005,230 B2
(45) Date of Patent: Feb. 28, 2006

(54) RADIATION-SENSITIVE RESIN COMPOSITION

(75) Inventors: Masafumi Yamamoto, Tokyo (JP); Hidemitsu Ishida, Tokyo (JP); Hiroyuki Ishii, Tokyo (JP); Toru Kajita, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/345,157

(22) Filed: Jan. 16, 2003

(65) Prior Publication Data

US 2004/0146802 A1 Jul. 29, 2004

(51) Int. Cl.
*G03F 7/004* (2006.01)

(52) U.S. Cl. .............................. 430/270.1; 430/286.1; 430/905; 430/910

(58) Field of Classification Search ............. 430/270.1, 430/286.1, 905, 910
See application file for complete search history.

(56) References Cited

U.S. PATENT DOCUMENTS

| | | | | |
|---|---|---|---|---|
| 2001/0023050 A1 * | 9/2001 | Numata et al. | ........... | 430/270.1 |
| 2001/0026901 A1 * | 10/2001 | Maeda et al. | ............ | 430/270.1 |
| 2002/0132181 A1 * | 9/2002 | Nishimura et al. | ...... | 430/270.1 |
| 2003/0044717 A1 * | 3/2003 | Kodama | ................. | 430/270.1 |
| 2003/0077540 A1 * | 4/2003 | Kodama et al. | ......... | 430/270.1 |
| 2003/0186161 A1 * | 10/2003 | Fujimori et al. | ......... | 430/270.1 |
| 2003/0203309 A1 * | 10/2003 | Nishimura et al. | ...... | 430/270.1 |
| 2003/0219680 A1 * | 11/2003 | Nishimura et al. | ...... | 430/270.1 |

FOREIGN PATENT DOCUMENTS

| | | |
|---|---|---|
| JP | 227660 | 6/1990 |
| JP | 4226461 | 10/1991 |
| JP | 7234511 | 9/1995 |

* cited by examiner

*Primary Examiner*—Amanda Walke
(74) *Attorney, Agent, or Firm*—Merchant & Gould PC; Steven B. Kelber

(57) ABSTRACT

A radiation-sensitive resin composition comprising (A) a resin which comprises at least one recurring unit (I-1), (I-2), or (I-3), and a recurring unit (II), and is insoluble or scarcely soluble in alkali, but becomes alkali soluble by action of an acid, (B) a photoacid generator, and (C) a polycyclic compound. The resin composition is used as a chemically-amplified resist for microfabrication utilizing deep UV rays

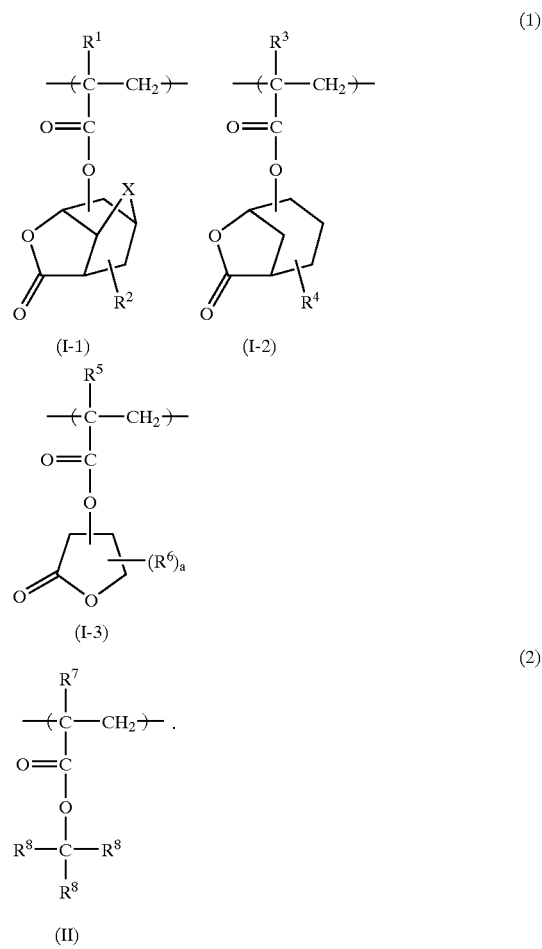

6 Claims, No Drawings

RADIATION-SENSITIVE RESIN COMPOSITION

BACKGROUND OF THE INVENTION

1. Field of the Invention

The present invention relates to a radiation-sensitive resin composition. More particularly, the present invention relates to a radiation-sensitive resin composition suitably used as a chemically-amplified resist useful for microfabrication utilizing various types of radiation such as deep ultraviolet rays such as a KrF excimer laser, ArF excimer laser, or $F_2$ excimer laser, X-rays such as synchrotron radiation, and charged particle rays such as electron beams.

2. Description of Background Art

In the field of microfabrication represented by the manufacture of integrated circuit devices, lithographic technology enabling microfabrication with a line width of 0.20 μm or less has been demanded in order to increase the degree of integration.

In a conventional lithographic process, near ultraviolet rays such as i-line radiation have been used. However, it is difficult to perform microfabrication with a line width of sub-quarter micron using near ultraviolet rays.

Therefore, in order to enable microfabrication with a line width of 0.20 μm or less, utilization of radiation with a shorter wavelength has been studied. As examples of radiation with a shorter wavelength, deep ultraviolet rays represented by a line spectrum of a mercury lamp and an excimer laser, X-rays, electron beams, and the like can be given. Of these, a KrF excimer laser (wavelength: 248 nm), an ArF excimer laser (wavelength: 193 nm), and an $F_2$ excimer laser (wavelength: 157 nm) have attracted attention.

As a resist suitable for irradiation by an excimer laser, a number of chemically-amplified resists utilizing a chemical amplification effect caused by a component having an acid-dissociable functional group and a component which generates an acid upon irradiation (hereinafter referred to as "exposure") (hereinafter referred to as "photoacid generator") have been proposed.

Japanese Patent Publication No. 2-27660 discloses a chemically-amplified resist containing a polymer having a t-butyl ester group of a carboxylic acid or t-butylcarbonate group of a phenol, and a photoacid generator. This resist utilizes a phenomenon in which a t-butyl ester group or a t-butyl carbonate group contained in the polymer dissociates by the action of an acid generated upon exposure to form an acidic functional group such as a carboxyl group or a phenolic hydroxyl group, whereby the exposed region of the resist film becomes readily soluble in an alkaline developer.

Generally, conventional chemically-amplified resists contain a phenol resin as a base resin. However, since deep ultraviolet rays used as radiation are absorbed due to the presence of aromatic ring in the resin, a sufficient amount of deep ultraviolet rays cannot reach a lower portion of the resist film. Therefore, the irradiation dose is increased in the upper portion of the resist film and decreased in the lower portion. As a result, the resist pattern after development is in the shape of a trapezoid in which the resist pattern is thinner in the upper portion and thicker in the lower portion, whereby sufficient resolution cannot be obtained. If the resist pattern after development is in the shape of a trapezoid, desired dimensional accuracy cannot be achieved in a succeeding step such as an etching step or ion implantation step. Moreover, if the shape of the upper part of the resist pattern is not rectangular, the rate of removal of the resist by dry etching is increased, whereby it is difficult to control etching conditions.

The shape of the resist pattern can be improved by increasing the radiation transmittance of the resist film. For example, a (meth)acrylate resin represented by polymethylmethacrylate is a desirable resin from the viewpoint of radiation transmittance because the (meth)acrylate resin has high transparency to deep ultraviolet rays. Japanese Patent Application Laid-open No. 4-226461 discloses a chemically-amplified resist using a methacrylate resin, for example. However, this composition has insufficient dry etching resistance due to the absence of an aromatic ring, although the composition excels in microfabrication performance. This makes it difficult to perform etching with high accuracy. Therefore, a composition having both transparency to radiation and dry etching resistance cannot be provided.

As a means to improve dry etching resistance of the chemically-amplified resist without impairing transparency to radiation, a method of introducing an aliphatic ring into the resin component in the resist instead of an aromatic ring is known. For example, Japanese Patent Application Laid-open No. 7-234511 discloses a chemically-amplified resist using a (meth)acrylate resin having an aliphatic ring.

This resist uses a group which comparatively easily dissociates by the action of a conventional acid (acetal functional group such as a tetrahydropyranyl group), or a group which comparatively scarcely dissociates by the action of an acid (t-butyl functional group such as a t-butyl ester group or t-butylcarbonate group) as the acid-dissociable functional group in the resin component. However, in the case of using the resin component containing the former acid-dissociable functional group, although the resist excels in basic properties such as sensitivity and pattern shape, storage stability as a composition is insufficient. In the case of using the resin component containing the latter acid-dissociable functional group, the resist exhibits insufficient basic properties such as sensitivity and pattern shape, although storage stability as a composition is excellent. Moreover, since the aliphatic ring is introduced into the resin component in this resist, hydrophobicity of the resin is considerably increased. This results in insufficient adhesion to a substrate.

When forming a resist pattern by using a chemically-amplified resist, a heat treatment is usually performed after exposure in order to promote the dissociation of the acid-dissociable functional group. The line width of the resist pattern is inevitably changed to some extent as the heating temperature is changed. However, in order to deal with a recent decrease in size of integrated circuit devices, development of a resist which shows only a small change in line width due to a change in heating temperature after exposure (specifically, temperature dependency) has been demanded.

As a means to improve properties of a chemically-amplified radiation sensitive composition as a resist, a number of multi-component compositions containing three or more components to which a high-molecular-weight or low-molecular-weight additive is added have been proposed. For example, Japanese Patent Application Laid-open No. 7-234511 discloses that effects of post exposure delay from exposure to heat treatment are reduced by adding t-butyl 3-adamantanecarboxylate as a hydrophobic compound to a resist containing a p-hydroxystyrene copolymer such as a copolymer of p-hydroxystyrene and tetrahydropyranyl (meth)acrylate or t-butyl (meth) acrylate or a copolymer of p-hydroxystyrene and p-tetrahydropyranyloxycarbonyloxystyrene or p-t-butoxycarbonyloxystyrene as a resin having a hydrophilic group, and that stable patterning can be performed even in the case of a resist containing a group having strong hydrophobicity.

However, conventional multi-component chemically-amplified radiation sensitive compositions including the composition disclosed in Japanese Patent Application Laid-open No. 7-234511 show a large amount of change in line width of the line pattern depending on the density of the line and space pattern. Therefore, the performance as a resist of these compositions is not satisfactory.

In view of the above-described situation, in order to develop technology capable of dealing with the progress of miniaturization and an increase in the application field of integrated circuit devices, development of a chemically-amplified resist which is applicable to short wavelength radiation represented by deep ultraviolet rays, shows only a small change in line width of the line pattern depending on the density of the line and space pattern, and excels in transparency to radiation, sensitivity, resolution, and the like has been strongly demanded.

Accordingly, an object of the present invention is to provide a radiation-sensitive resin composition useful as a chemically-amplified resist capable of forming a minute line pattern even if the width of the space of the line and space pattern is increased, and excelling in transparency to radiation, sensitivity, resolution, and the like.

SUMMARY OF THE INVENTION

According to the present invention, the above object can be achieved by a radiation-sensitive resin composition comprising:

(A) a resin which comprises at least one recurring unit selected from the group consisting of recurring units (I-1), (I-2), and (I-3) shown by the following formula (1), and a recurring unit (II) shown by the following formula (2), and is insoluble or scarcely soluble in alkali, but becomes alkali soluble by action of an acid,

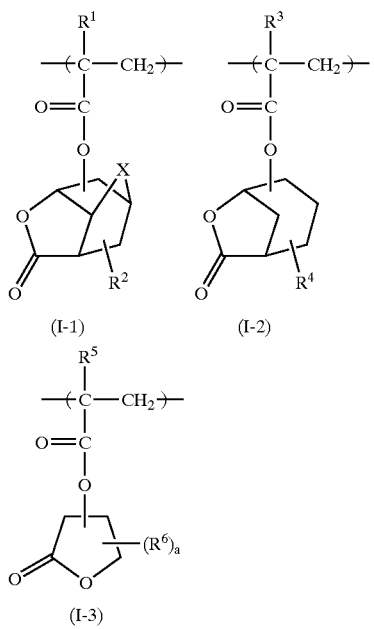

wherein $R^1$, $R^3$, and $R^5$ individually represent a hydrogen atom or a methyl group, and $R^2$, $R^4$, and $R^6$ individually represent a hydrogen atom or a linear or branched alkyl group having 1-4 carbon atoms, X represents a methylene group, an oxygen atom, or a sulfur atom, and a is an integer of 1-5,

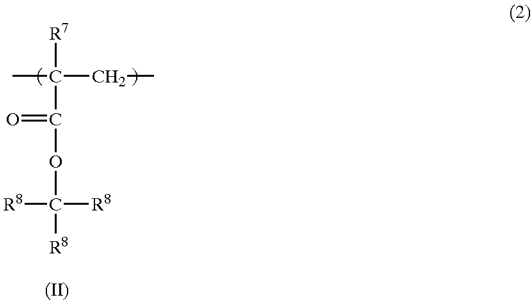

wherein $R^7$ represents a hydrogen atom or a methyl group, $R^8$s individually represent a monovalent alicyclic hydrocarbon group having 4–20 carbon atoms or a derivative thereof, or a linear or branched alkyl group having 1–4 carbon atoms, provided that at least one $R^8$ represents a monovalent alicyclic hydrocarbon group having 4–20 carbon atoms or a derivative thereof, or two $R^8$s form, in combination with the carbon atom to which the two $R^8$s bond, a divalent alicyclic hydrocarbon group having 4–20 carbon atoms or a derivative thereof, with the remaining $R^8$ being a linear or branched alkyl group having 1–4 carbon atoms or a monovalent alicyclic hydrocarbon group having 4–20 carbon atoms or a derivative thereof;

(B) a photoacid generator; and (C) a polycyclic compound which has a molecular weight of 1,000 or less and includes a group —COOR$^9$, wherein R$^9$ represents a hydrogen atom, a substituted or unsubstituted linear or branched alkyl group having 1–20 carbon atoms, a substituted or unsubstituted monovalent alicyclic hydrocarbon group having 3–20 carbon atoms, or —CH$_2$COOR$^{10}$ (wherein R$^{10}$ represents a hydrogen atom, a substituted or unsubstituted linear or branched alkyl group having 1–20 carbon atoms, or a substituted or unsubstituted monovalent alicyclic hydrocarbon group having 3–20 carbon atoms).

In the radiation-sensitive resin composition according to the present invention, at least one recurring unit selected from the group consisting of the recurring units (I-1), (I-2), and (I-3) shown by the formula (1) is preferably the recurring unit (I-1).

In the radiation-sensitive resin composition according to the present invention, the group —COOC(R$^8$) 3 in the recurring unit (II) is preferably at least one group selected from the group consisting of a t-butoxycarbonyl group and groups of the following formulas (i-1), (i-2), (i-10), (i-11), (i-13), (i-14), (i-16), (i-17), (i-34), (i-35), (i-40), (i-41), (i-43), (i-47), (i-48), and (i-49).

(i-1) 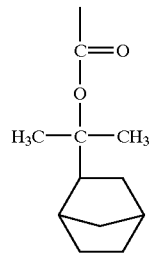
(i-2) 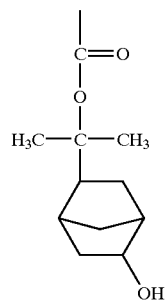
(i-10) 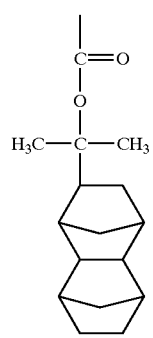
(i-11) 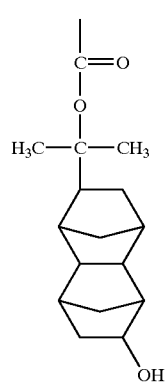
(i-13) 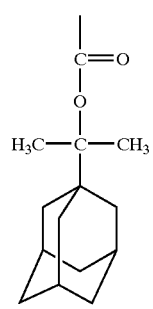
(i-14) 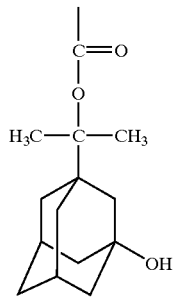
(i-16) 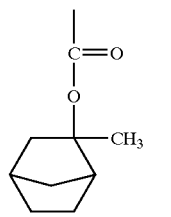
(i-17) 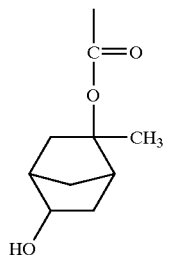
(i-34) 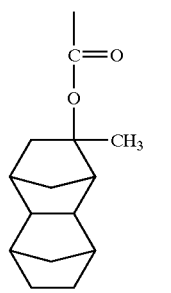
(i-35) 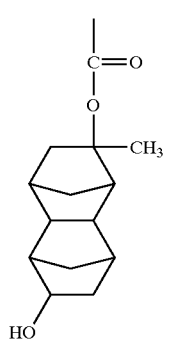

-continued

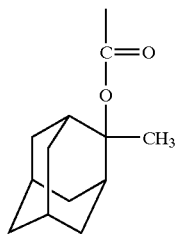
(i-40)

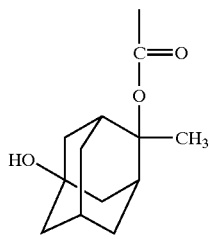
(i-41)

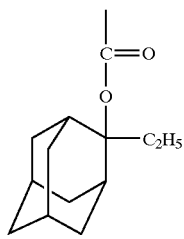
(i-43)

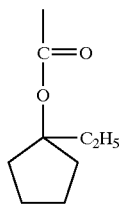
(i-47)

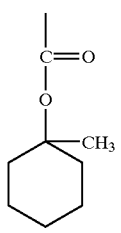
(i-48)

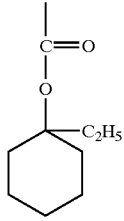
(i-49)

In the radiation-sensitive resin composition according to the present invention, the resin (A) may further comprise at least one recurring unit other than the recurring units (I-1), (I-2), (I-3), and (II).

In the radiation-sensitive resin composition according to the present invention, the photoacid generator (B) is preferably at least one compound selected from the group consisting of onium salt compounds, halogen-containing compounds, diazoketone compounds, sulfone compounds, and sulfonic acid compounds.

In the radiation-sensitive resin composition according to the present invention, the amount of the photoacid generator (B) is preferably 0.1–20 parts by weight for 100 parts by weight of the resin (A).

In the radiation-sensitive resin composition according to the present invention, the polycyclic compound (C) may be at least one compound selected from the group consisting of compounds shown by the following formulas (4) to (9):

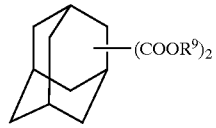
(4)

wherein $R^9$ represents a hydrogen atom, a substituted or unsubstituted linear or branched alkyl group having 1–20 carbon atoms, a substituted or unsubstituted monovalent alicyclic hydrocarbon group having 3–20 carbon atoms, or —CH$_2$COOR$^{10}$ (wherein $R^{10}$ represents a hydrogen atom, a substituted or unsubstituted linear or branched alkyl group having 1–20 carbon atoms, or a substituted or unsubstituted monovalent alicyclic hydrocarbon group having 3–20 carbon atoms);

$$Z-(O\overset{O}{\overset{\|}{C}}C_2H_4\overset{O}{\overset{\|}{C}}OCH_2\overset{O}{\overset{\|}{C}}OR^9)_m \quad (5)$$

wherein $R^9$ is the same as defined for the formula (4), Z represents a hydrocarbon group with a valence of m which has a polycyclic carbon ring in which the number of carbon atoms which make up the ring is 6–20 or a derivative thereof, and m is an integer of 1–4;

(6)

wherein $R^9$ is the same as defined for the formula (4);

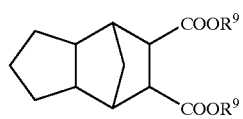 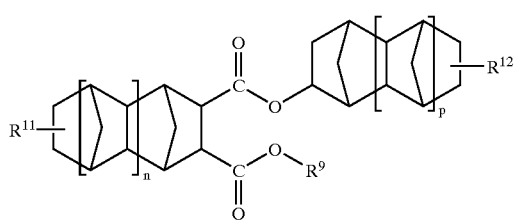
(7)

wherein $R^9$ is the same as defined for the formula (4), $R^{11}$ and $R^{12}$ individually represent a hydrogen atom, a linear or branched alkyl group having 1–4 carbon atoms, a linear or branched hydroxyalkyl group having 1–4 carbon atoms, —$OR^{13}$ (wherein $R^{13}$ represents a hydrogen atom, a linear or branched alkyl group having 1–4 carbon atoms, or —$CH_2COOR^{14}$ (wherein $R^{14}$ represents a hydrogen, atom or an alkyl group having 1–4 carbon atoms)), or —COOR's (wherein $R^{15}$ represents a hydrogen atom, a substituted or unsubstituted alkyl group having 1–20 carbon atoms, or —$CH_2COOR^{16}$ (wherein $R^{16}$ represents a hydrogen atom or an alkyl group having 1-18 carbon atoms)), and n and p are integers of (8)

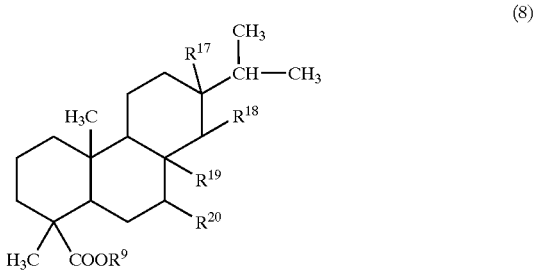

wherein $R^9$ is the same as defined for the formula (4), and $R^{17}, R^8, R^9$, and $R^{20}$ individually represent a hydrogen atom, a hydroxyl group, a linear or branched alkyl group having 1–4 carbon atoms, or a linear or branched alkoxyl group having 1–4 carbon atoms;

(9)

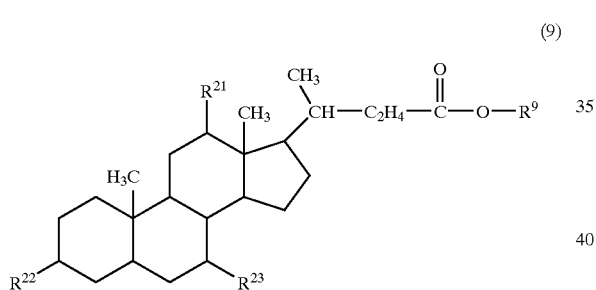

wherein $R^9$ is the same as defined for the formula (4), and $R^{21}, R^{22}$, and $R^{23}$ individually represent a hydrogen atom or a hydroxyl group, provided that at least one of $R^{21}, R^{22}$, and $R^{23}$ represents a hydroxyl group.

In the radiation-sensitive resin composition according to the present invention, the polycyclic compound (C) is preferably the compound shown by the formula (9).

Other objects, features and advantages of the invention will hereinafter become more readily apparent from the following description.

DETAILED DESCRIPTION OF THE INVENTION AND PREFERRED EMBODIMENT

The present invention is described below in detail.

Resin (A)

A component (A) in the present invention is a resin which comprises at least one recurring unit selected from the group consisting of the recurring units (I-1), (I-2), (I-3) shown by the above formula (1) and the recurring unit (II) shown by the above formula (2), and is insoluble or scarcely soluble in alkali, but becomes alkali soluble by the action of an acid (hereinafter referred to as "resin (A)").

The definition of the term "insoluble or scarcely soluble in alkali" used herein is as follows. In the case of developing a resist film using only the resin (A) under alkaline development conditions employed when forming a resist pattern of a resist film formed of a radiation-sensitive resin composition containing the resin (A), the term "insoluble or scarcely soluble in alkali" refers to properties in which 50% or more of the initial thickness of the resist film remains after development.

The carbonyloxy group bonded to the carbon atom in the main chain of each of the recurring units (I-1) and (I-2) maybe bonded to a carbon atom at an optional position other than the carbon atoms which form the lactone group in the ring and the carbon atom to which the group $R^2$ or $R^4$ is bonded. The carbonyloxy groups in the recurring units (I-1) and (I-2) are preferably bonded at a position shown by the following formulas (3-1) and (3-2), respectively.

The carbonyloxy group bonded to the carbon atom in the main chain of the recurring unit (I-3) may be bonded to a carbon atom at an optional position other than the carbon atoms which form the lactone group and the carbon atom to which the group $R^6$ is bonded. The carbonyloxy group in the recurring unit (I-3) preferably bonded at a position shown by the following formula (3-3) (α-position with respect to the carbonyl group in the lactone group) or a position shown by the following formula (3-4) (β-position with respect to the carbonyl group in the lactone group).

(3-1)

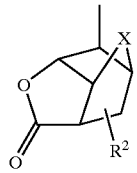

(3-2)

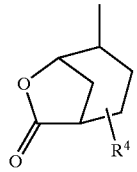

(3-3)

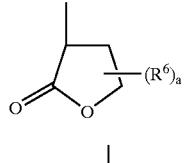

(3-4)

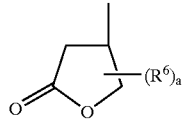

The groups $R^2$, $R^4$, and $R^6$ in the recurring units (I-1), (I-2), and (I-3) may be bonded to a carbon atom at an optional position other than the carbon atom to which the carbonyloxy group in each recurring unit is bonded and the carbon atoms which form the lactone group.

As examples of a linear or branched alkyl group having 1–4 carbon atoms represented by $R^2$, $R^4$, and $R^6$, a methyl group, ethyl group, n-propyl group, i-propyl group, n-butyl group, 2-methylpropyl group, 1-methylpropyl group, t-butyl group, and the like can be given.

Of these alkyl groups, a methyl group is preferable. a in the recurring unit (I-3) is preferably either 1 or 2.

As preferable examples of the recurring unit (I-1), an acrylic recurring unit in which $R^2$ is a hydrogen atom, the carbonyloxy group bonded to the carbon atom in the main chain is bonded at the position shown by the formula (3-1), and $R^1$ is a hydrogen atom; a methacrylic recurring unit in which $R^2$ is a hydrogen atom, the carbonyloxy group bonded to the carbon atom in the main chain is bonded at the position shown by the formula (3-1), and $R^1$ is a methyl group; an acrylic recurring unit in which $R^2$ is a methyl group, the carbonyloxy group bonded to the carbon atom in the main chain is bonded at the position shown by the formula (3-1), and $R^1$ is a hydrogen atom; a methacrylic recurring unit in which $R^2$ is a methyl group, the carbonyloxy group bonded to the carbon atom in the main chain is bonded at the position shown by the formula (3-1), and $R^1$ is a methyl group; and the like can be given.

As preferable examples of the recurring units (I-2), an acrylic recurring unit in which $R^4$ is a hydrogen atom, the carbonyloxy group bonded to the carbon atom in the main chain is bonded at the position shown by the formula (3-2), and $R^3$ is a hydrogen atom; a methacrylic recurring unit in which $R^4$ is a hydrogen atom, the carbonyloxy group bonded to the carbon atom in the main chain is bonded at the position shown by the formula (3-2), and $R^3$ is a methyl group; an acrylic recurring unit in which $R^4$ is a methyl group, the carbonyloxy group bonded to the carbon atom in the main chain is bonded at the position shown by the formula (3-2), and R is a hydrogen atom; a methacrylic recurring unit in which $R^4$ is a methyl group, the carbonyloxy group bonded to the carbon atom in the main chain is bonded at the position shown by the formula (3-2), and $R^3$ is a methyl group; and the like can be given.

As preferable examples of the recurring units (I-3), an acrylic recurring unit in which $R^6$ is a hydrogen atom, the carbonyloxy group bonded to the carbon atom in the main chain is bonded at the position shown by the formula (3-3) or (3-4), and $R^5$ is a hydrogen atom; a methacrylic recurring unit in which $R^6$ is a hydrogen atom, the carbonyloxy group bonded to the carbon atom in the main chain is bonded at the position shown by the formula (3-3) or (3-4), and $R^5$ is a methyl group; an acrylic recurring unit in which $R^6$ is a methyl group, the carbonyloxy group bonded to the carbon atom in the main chain is bonded at the position shown by the formula (3-3) or (3-4), and $R^5$ is a hydrogen atom; a methacrylic recurring unit in which $R^6$ is a methyl group, the carbonyloxy group bonded to the carbon atom in the main chain is bonded at the position shown by the formula (3-3) or (3-4), and $R^5$ is a methyl group; and the like can be given.

In the present invention, use of the recurring units (I-1) and (I-2) is preferable. Use of the recurring unit (I-1) is particularly preferable.

Each of the recurring units (I-1), (I-2), and (I-3) may be present in the resin (A) either individually or in combination of two or more.

The recurring units (I-1), (I-2), and (I-3) are derived from (meth)acrylates corresponding to each recurring unit.

As examples of a monovalent alicyclic hydrocarbon group having 4–20 carbon atoms represented by $R^8$ and a divalent alicyclic hydrocarbon group having 4–20 carbon atoms formed by two $R^8$s in the recurring unit (II), alicyclic groups derived from a cycloalkane such as norbornane, tricyclodecane, tetracyclododecane, adamantane, cyclobutane, cyclopentane, cyclohexane, cycloheptane, and cyclooctane, groups in which these alicyclic groups are replaced with at least one linear, branched, or cyclic alkyl group having 1–4 carbon atoms such as a methyl group, ethyl group, n-propyl group, i-propyl group, n-butyl group, 2-methylpropyl group, 1-methylpropyl group, or t-butyl group, and the like can be given.

Of these monovalent and divalent alicyclic hydrocarbon groups, an alicyclic group derived from norbornane, tricyclodecane, tetracyclododecane, or adamantane, a group in which the alicyclic group is replaced with the above alkyl group, and the like are preferable.

As examples of derivatives of the monovalent or divalent alicyclic hydrocarbon groups, groups having at least one substituent such as a hydroxyl group; a carboxyl group; an oxo group (=O); hydroxyalkyl groups having 1–4 carbon atoms such as a hydroxymethyl group, 1-hydroxyethyl group, 2-hydroxyethyl group, 1-hydroxypropyl group, 2-hydroxypropyl group, 3-hydroxypropyl group, 1-hydroxybutyl group, 2-hydroxybutyl group, 3-hydroxybutyl group, and 4-hydroxybutyl group; alkoxyl groups having 1–4 carbon atoms such as a methoxy group, ethoxy group, n-propoxy group, i-propoxy group, n-butoxy group, 2-methylpropoxy group, 1-methylpropoxy group, and t-butoxy group; a cyano group; cyanoalkyl groups having 2–5 carbon atoms such as a cyanomethyl group, 2-cyanoethyl group, 3-cyanopropyl group, and 4-cyanobutyl group; and the like can be given.

Of these substituents, a hydroxyl group, carboxyl group, hydroxymethyl group, cyano group, cyanomethyl group, and the like are preferable.

As examples of a linear or branched alkyl group having 1–4 carbon atoms represented by $R^8$, a methyl group, ethyl group, n-propyl group, i-propyl group, n-butyl group, 2-methylpropyl group, 1-methylpropyl group, t-butyl group, and the like can be given.

Of these alkyl groups, a methyl group and an ethyl group are particularly preferable.

The group —COOC($R^8$)$_3$ in the recurring unit (II) is an acid-dissociable group which dissociates by the action of an acid and forms a carboxyl group. This group is hereinafter referred to as an acid-dissociable group (i).

As specific examples of a preferable acid-dissociable group (i), a t-butoxycarbonyl group, groups shown by the following formulas (i-1) to (i-49), and the like can be given.

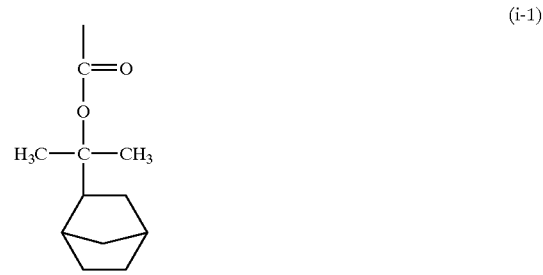

(i-1)

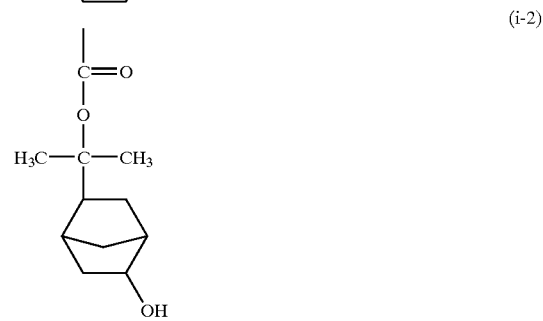

(i-2)

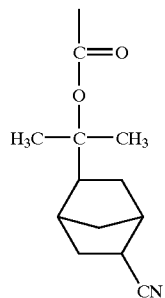
(i-3)
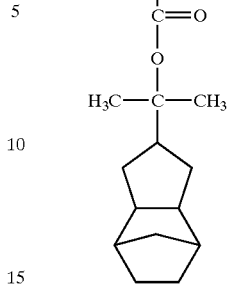
(i-7)
(i-4)
(i-8)
(i-5)
(i-9)
(i-6)
(i-10)

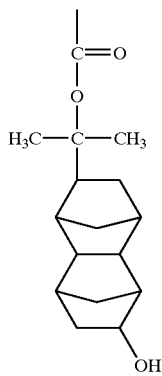
(i-11)
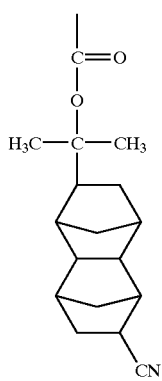
(i-12)
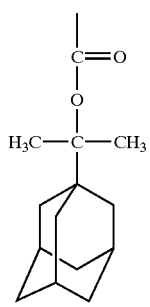
(i-13)
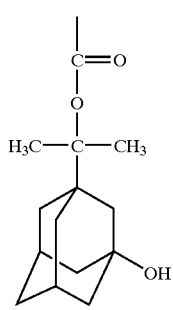
(i-14)
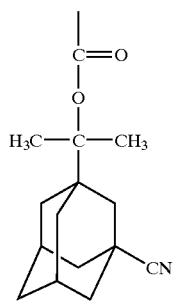
(i-15)
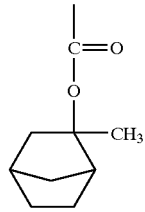
(i-16)
(i-17)
(i-18)
(i-19)
(i-20)

(i-21) 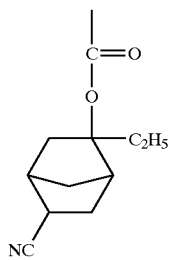
(i-22) 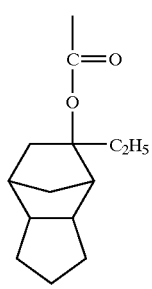
(i-23) 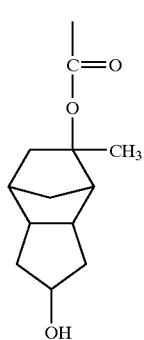
(i-24) 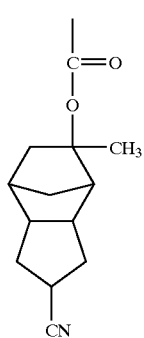
(i-25) 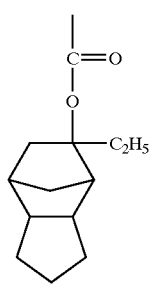
(i-26) 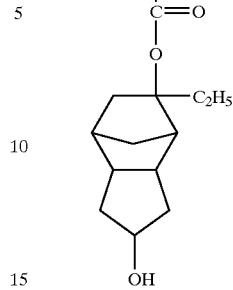
(i-27) 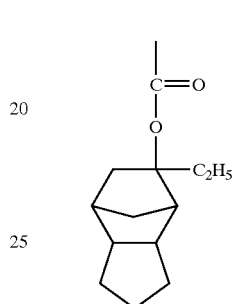
(i-28) 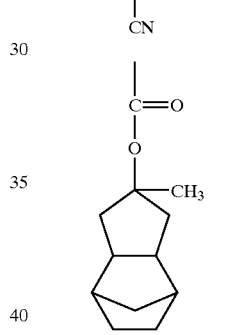
(i-29) 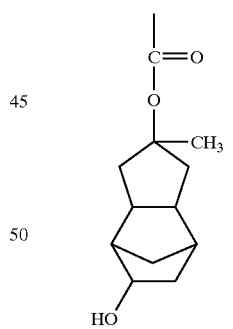
(i-30) 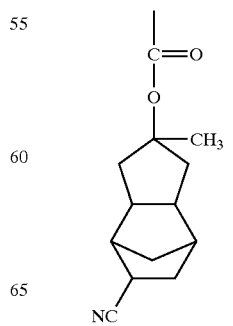

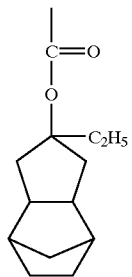
(i-31)
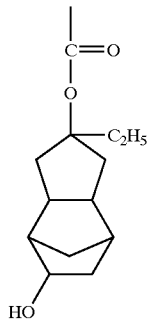
(i-32)
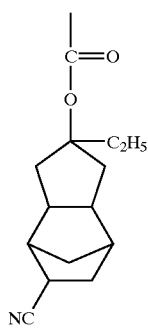
(i-33)
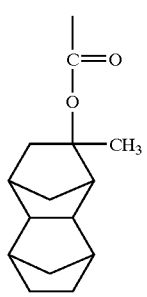
(i-34)
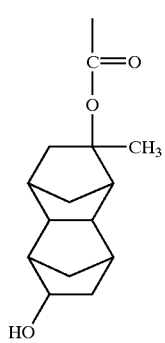
(i-35)
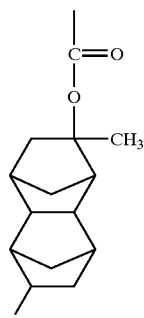
(i-36)
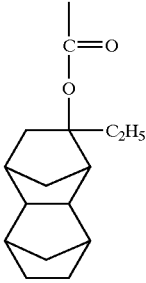
(i-37)
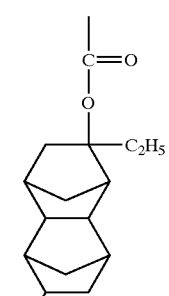
(i-38)
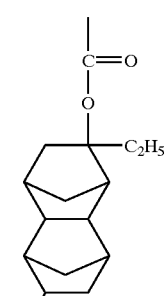
(i-39)
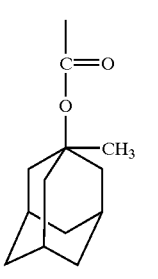
(i-40)

-continued (i-41) 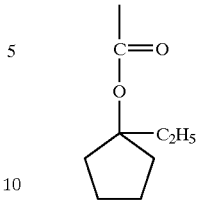

(i-42) 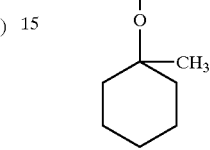

(i-43) 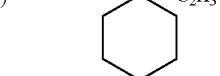

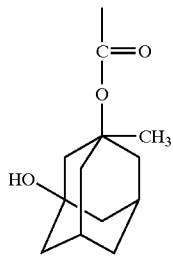 (i-44)

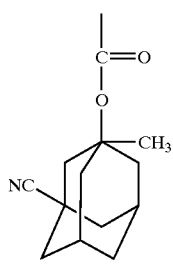 (i-45)

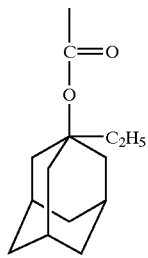 (i-46)

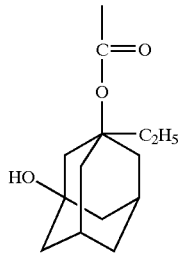

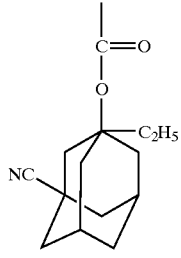

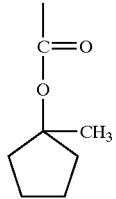

-continued (i-47) 

(i-48) 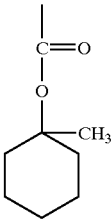

(i-49) 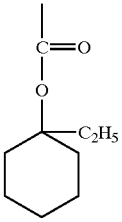

Of these acid-dissociable groups (i), a t-butoxycarbonyl group, the group shown by the formula (i-1), (i-2), (i-10), (i-11), (i-13), (i-14), (i-16), (i-17), (i-34), (i-35), (i-40), (i-41), (i-43), (i-47), (i-48), or (i-49), and the like are preferable.

In the resin (A), the recurring unit (II) maybe used either individually or in combination of two or more.

The recurring unit (II) is derived from a (meth)acrylate corresponding thereto.

The resin (A) may comprise one or more recurring units other than the recurring units (I-1), (I-2), (I-3), and (II) (hereinafter referred to as "other recurring unit"). Examples of polymerizable unsaturated monomers which provide other recurring unit include: monofunctional monomers such as (meth) acrylates having a bridged hydrocarbon skeleton such as norbornyl (meth)acrylate, isobornyl (meth)acrylate, tricyclodecanyl(meth)acrylate, tetracyclodecanyl (meth)acrylate, dicyclopentenyl(meth)acrylate, adamantyl (meth)acrylate, 3-hydroxyadamantyl(meth)acrylate, and adamantylmethyl (meth)acrylate; carboxyl group-containing esters having a bridged hydrocarbon skeleton of an unsaturated carboxylic acid such as carboxynorbornyl(meth)acrylate, carboxytricyclodecanyl(meth)acrylate, and carboxytetracyclodecanyl(meth)acrylate;

other monofunctional monomers having a bridged hydrocarbon skeleton such as norbornene(bicyclo[2.2.1]hept-2-ene), 5-methylbicyclo[2.2.1]hept-2-ene, 5-ethylbicyclo[2.2.1]hept-2-ene, 5-n-propylbicyclo[2.2.1]hept-2-ene, 5-n-butylbicyclo[2.2.1]hept-2-ene, 5-n-pentylbicyclo[2.2.1]hept-2-ene, 5-n-hexylbicyclo[2.2.1]hept-2-ene, 5-hydroxybicyclo[2.2.1]hept-2-ene, 5-hydroxymethylbicyclo[2.2.1]hept-2-ene, tetracyclo[4.4.0.1$^{2,15}$.1$^{7,10}$]dodec-3-ene, 8-methyltetracyclo[4.4.0.1$^{2,5}$.1$^{7,10}$] dodec-3-ene, 8-ethyltetracyclo[4.4.0.1$^{2,5}$.1$^{7,10}$] dodec-3-ene, 8-n-propyltetracyclo[4.4.0.1$^{2,5}$.1$^{7,10}$] dodec-3-ene, 8-n- butyltetracyclo[4.4.0.1$^{2,5}$.1$^{7,10}$]dodec-3-ene, 8-n-pentyltetracyclo[4.4.0.1$^{2,5}$.1$^{7,10}$]dodec-3-ene, 8-n-hexyltetracyclo[4.4.0.1$^{2,5}$.1$^{7,10}$] dodec-3-ene, 8-hydroxytetracyclo[4.4.0.1$^{2,5}$.1$^{7,10}$]dodec-3-ene, 8-hydroxymethyltetracyclo[4.4.0.1$^{2,5}$.1$^{7,10}$] dodec-3-ene, 8-fluorotetracyclo[4.4.0.1$^{2,5}$.1$^{7,10}$] dodec-3-ene, 8-fluoromethyltetracyclo[4.4.0.1$^{2,5}$.1$^{7,10}$]dodec-3-ene, 8-difluoromethyltetracyclo[4.4.0.1$^{2,5}$.1$^{7,10}$]dodec-3-ene, 8-trifluoromethyltetracyclo[4.4.0.1$^{2,5}$.1$^{7,10}$] dodec-3-ene, 8-pentafluoroethyltetracyclo[4.4.0.1$^{2,5}$.1$^{7,10}$]dodec-3-ene, 8,8-difluorotetracyclo[4.4.0.1$^{2,5}$.1$^{7,10}$]dodec-3-ene, 8,9-difluorotetracyclo[4.4.0.1$^{2,5}$.1$^{7,10}$]dodec-3-ene, 8,8-bis(trifluoromethyl)tetracyclo[4.4.0.1$^{2,5}$.1$^{7,10}$] dodec-3-ene, 8,9-bis(trifluoromethyl)tetracyclo[4.4.0.1$^{2,5}$.1$^{7,10}$]dodec-3-ene, 8-methyl-8-trifluoromethyltetracyclo[4.4.0.1$^{2,5}$.1$^{7,10}$] dodec-3-ene, 8,8,9-trifluorotetracyclo[4.4.0.1$^{2,5}$.1$^{7,10}$] dodec-3-ene, 8,8,9-tris(trifluoromethyl)tetracyclo[4.4.0.1$^{2,}$$_5$.1$^{7,10}$] dodec-3-ene, 8,8,9,9-tetrafluorotetracyclo[4.4.0.1$^{2,}$$_5$.1$^{7,10}$] dodec-3-ene, 8,8,9,9-tetrakis(trifluoromethyl)tetracyclo [4.4.0.1$^{2,5}$.1$^{7,10}$]dodec-3-ene, 8,8-difluoro-9,9-bis(trifluoromethyl)tetracyclo [4.4.0.1$^{2,5}$.1$^{7,10}$] dodec-3-ene, 8,9-difluoro-8,9-bis(trifluoromethyl)tetracyclo [4.4.0.1$^{2,}$$_5$.1$^{7,10}$]dodec-3-ene, 8,8,9-trifluoro-9-trifluoromethyltetracyclo [4.4.0.1$^{2,5}$.1$^{7,10}$] dodec-3-ene, 8,8,9-trifluoro-9-trifluoromethoxytetracyclo [4.4.0.1$^{2,5}$.1$^{7,10}$] dodec-3-ene, 8,8,9-trifluoro-9-pentafluoropropoxytetracyclo [4.4.0.1$^{2,5}$.1$^{7,10}$] dodec-3-ene, 8-fluoro-8-pentafluoroethyl-9,9-bis(trifluoromethyl)tetracyclo[4.4.0.1$^{2,5}$.1$^{7,10}$]dodec-3-ene, 8,9-difluoro-8-heptafluoroisopropyl-9-trifluoromethyltetracyclo[4.4.0.1$^{2,5}$.1$^{7,10}$]dodec-3-ene, 8-chloro-8,9,9-trifluorotetracyclo[4.4.0.1$^{2,5}$.1$^{7,10}$]dodec-3-ene, 8,9-dichloro-8,9-bis(trifluoromethyl)tetracyclo [4.4.0.1$^{2,5}$.1$^{7,10}$]dodec-3-ene, 8-(2',2',2'-trifluorocarboethoxy)tetracyclo [4.4.0.1$^{2,5}$.1$^{7,10}$] dodec-3-ene, 8-methyl-8-(2',2',2'-trifluorocarboethoxy)tetracyclo [4.4.0.1$^{2,5}$.1$^{7,10}$]dodec-3-ene, dicyclopentadiene, tricyclo[5.2.1.0$^{2,6}$]dec-8-ene, tricyclo[5.2.1.0$^{2,6}$] dec-3-ene, tricyclo[4.4.0.1$^{2,5}$]undec-3-ene, tricyclo[6.2.1.0$^{1,8}$] undec-9-ene, tricyclo[6.2.1.0$^{1,8}$] undec-4-ene, tetracyclo[4.4.0.1$^{2,}$$_5$.1$^{7,10}$ 0$^{1,6}$]dodec-3-ene, 8-methyltetracyclo[4.4.0.1$^{2,5}$.1$^{7,10}$.0$^{1,6}$]dodec-3-ene, 8-ethylidenetetracyclo[4.4.0.1$^{2,5}$.1$^{7,10}$.0$^{1,6}$]dodec-3-ene, 8-ethylidenetetracyclo[4.4.0.1$^{2,50}$.1$^{7,10}$.0$^{1,6}$] dodec-3-ene, pentacyclo[6.5.1.1$^{3,6}$.0$^{2,7}$.0$^{9,13}$]pentadec-4-ene, and pentacyclo[7.4.0.1$^{2,5}$.1$^{9,12}$. 0$^{8,13}$]pentadec-4-ene; (meth)acrylates having no bridged hydrocarbon skeleton such as methyl(meth)acrylate, ethyl(meth)acrylate, n-propyl (meth) acrylate, n-butyl (meth)acrylate, 2-methylpropyl (meth) acrylate, 2-hydroxyethyl (meth)acrylate, 2-hydroxypropyl(meth)acrylate, 3-hydroxypropyl(meth) acrylate, cyclopropyl (meth)acrylate, cyclopentyl(meth) acrylate, cyclohexyl (meth)acrylate, 4-methoxycyclohexyl (meth) acrylate, 2-cyclopentyloxycarbonylethyl (meth)acrylate, 2-cyclohexyloxycarbonylethyl (meth)acrylate, and 2-(4-methoxycyclohexyl)oxycarbonylethyl (meth)acrylate; α-hydroxymethylacryiic acid esters such as methyl α-hydroxymethyl acrylate, ethyl α-hydroxymethyl acrylate, n-propyl α-hydroxymethyl acrylate, and n-butyl α-hydroxymethyl acrylate; unsaturated nitryl compounds such as (meth) acrylonitrile, α-chloroacrylonitrile, crotonitrile, maleinitrile, fumaronitrile, mesaconitrile, citraconitrile, and itaconitrile; unsaturated amide compounds such as (meth) acrylamide, N,N-dimethyl (meth)acrylamide, crotonamide, maleinamide, fumaramide, mesaconamide, citraconamide, and itaconamide; other nitrogen-containing vinyl compounds such as N-(meth)acryloylmorpholine, N-vinyl-ε-caprolactam, N-vinylpyrrolidone, vinylpyridine, and vinylimidazole; unsaturated carboxylic acids (anhydrides) such as (meth)acrylic acid, crotonic acid, maleic acid, maleic anhydride, fumaric acid, itaconic acid, itaconic anhydride, citraconic acid, citraconic anhydride, and mesaconic acid; carboxyl group-containing esters of unsaturated carboxylic acid having no bridged hydrocarbon skeleton such as 2-carboxyethyl (meth)acrylate, 2-carboxypropyl (meth)acrylate, 3-carboxypropyl (meth)acrylate, 4-carboxybutyl (meth) acrylate, and 4-carboxycyclohexyl (meth)acrylate; (meth) acryloyloxylactone compounds having an acid-dissociable group such as α-(meth)acryloyloxy-β-methoxycarbonyl-γ-butyrolactone, α-(meth)acryloyloxy-β-ethoxycarbonyl-γ-butyrolactone, α-(meth)acryloyloxy-β-n-propoxycarbonyl-γ-butyrolactone, α-(meth) acryloyloxy-β-i-propoxycarbonyl-γ-butyrolactone, α-(meth)acryloyloxy-β-n-butoxycarbonyl-γ-butyrolactone, α-(meth)acryloyloxy-β-(2-methylpropoxy)carbonyl-γ-butyrolactone, α-(meth) acryloyloxy-β-(1-methylpropoxy)carbonyl-γ-butyrolactone, α-(meth) acryloyloxy-β-t-butoxycarbonyl-γ-butyrolactone, α-(meth)acryloyloxy-β-cyclohexyloxycarbonyl-γ-butyrolactone, α-(meth)acryloyloxy-β-(4-t-butylcyclohexyloxy)carbonyl-γ-butyrolactone, α-(meth)acryloyloxy-β-phenoxycarbonyl-γ-butyrolactone, α-(meth)acryloyloxy-β-(1-ethoxyethoxy)carbonyl-γ-butyrolactone, α-(meth) acryloyloxy-β-(1-cyclohexyloxyethoxy)carbonyl-γ-butyrolactone, α-(meth)acryloyloxy-β-t-butoxycarbonylmethoxycarbonyl-γ-butyrolactone, α-(meth) acryloyloxy-β-tetrahydrofuranyloxycarbonyl-γ-butyrolactone, α-(meth)acryloyloxy-β-tetrahydropyranyloxycarbonyl-γ-butyrolactone, α-methoxycarbonyl-β-(meth)acryloyloxy-γ-butyrolactone, α-ethoxycarbonyl-β-(meth)acryloyloxy-γ-butyrolactone, α-n-propoxycarbonyl-β-(meth)acrylyloxy-γ-butyrolactone, α-i-propoxycarbonyl-β-(meth)acryloyloxy-γ-butyrolactone, α-n-butoxycarbonyl-β-(meth)acryloyloxy-γ-butyrolactone, α-(2-methylpropoxy)carbonyl-β-(meth)acryloyloxy-γ-butyrolactone, α-(1-methylpropoxy)carbonyl-β-(meth)acryloyloxy-γ-butyrolactone, α-t-butoxycarbonyl-β-(meth)acryloyloxy-γ-butyrolactone, α-cyclohexyloxycarbonyl-β-(meth) acryloyloxy-γ-butyrolactone, α-(4-t-butylcyclohexyloxy) carbonyl-β-(meth)acryloyloxy-γ-butyrolactone, α-phenoxycarbonyl-β-(meth)acryloyloxy-γ-butyrolactone, α-(1-ethoxyethoxy)carbonyl-β-(meth)acryloyloxy-γ-butyrolactone, α-(1-cyclohexyloxyethoxy)carbonyl-β-(meth) acryloyloxy-γ-butyrolactone, α-t-butoxycarbonylmethoxycarbonyl-β-(meth)acryloyloxy-γ-butyrolactone, α-tetrahydrofuranyloxycarbonyl-β-(meth)acryloyloxy-γ-butyrolactone, and α-tetrahydropyranyloxycarbonyl-β-(meth)acryloyloxy-γ-butyrolactone; (meth)acryloyloxylactone compounds having no acid-dissociable group such as x-(meth)acryloyloxy-β-fluoro-γ-butyrolactone, α-(meth) acryloyloxy-β-hydroxy-γ-butyrolactone, α-(meth)acryloyloxy-β-methyl-γ-butyrolactone, α-(meth)acryloyloxy-β-ethyl-γ-butyrolactone, α-(meth)acryloyloxy-β, β-dimethyl-γ-butyrolactone, α-(meth)acryloyloxy-β-methoxy-γ-butyrolactone, α-fluoro-β-(meth)acryloyloxy-γ-butyrolactone, α-hydroxy-β-(meth)acryloyloxy-γ-butyrolactone, α-methyl-β-(meth)acryloyloxy-γ-butyrolactone, α-ethyl-β-(meth)acryloyloxy-γ-butyroiactone, α,α-dimethyl-β-(meth)acryloyloxy-γ-butyrolactone, α-methoxy-β-(meth)acryloyloxy-γ-butyrolactone, and α-(meth)acryloyloxy-δ-mevalonolactone; and compounds in which a carboxyl group in the above unsaturated carboxylic acids or carboxyl group-containing esters having no bridged hydrocarbon skeleton of the unsaturated carboxylic acids is converted into the acid-dissociable group (i); and polyfunctional monomers having a bridged hydrocarbon skeleton such as 1,2-adamantanediol di(meth)acrylate, 1,3-adamantanediol di(meth)acrylate, 1,4-adamantanediol di(meth)acrylate, and tricyclodecanyldimethylol di(meth)acrylate; and polyfunctional monomers having no bridged hydrocarbon skeleton such as methylene glycol di(meth)acrylate, ethylene glycol di(meth)acrylate, propylene glycol di(meth)acrylate, 1,6-hexanediol di(meth)acrylate, 2,5-dimethyl-2,5-hexanediol di(meth)acrylate, 1,8-octanediol di(meth)acrylate, 1,9-nonanediol di(meth)acrylate, 1,4-bis(2-hydroxypropyl)benzene di(meth)acrylate, and 1,3-bis(2-hydroxypropyl)benzene di(meth)acrylate.

The content of the recurring units (I-1), (I-2), and (I-3) in total in the resin (A) is usually 10–80 mol %, preferably 20–70 mol %, and still more preferably 30–70 mol % of the total recurring units. If the content is less than 10 mol %, developability and adhesion to a substrate of the resulting resist may be decreased. If the content exceeds 80 mol %, resolution of the resulting resist may be decreased.

The content of the recurring unit (II) is 10–80 mol %, preferably 20–70 mol %, and still more preferably 20–60 mol % of the total recurring units. If the content of the recurring unit (II) is less than 10 mol %, resolution of the resulting resist may be decreased. If the content exceeds 80 mol %, developability of the resulting resist may be decreased or scum may easily remain.

The content of other recurring unit is usually 50 mol % or less, and preferably 40 mol % or less.

The resin (A) is produced by polymerizing polymerizable unsaturated monomers corresponding to each recurring unit in an appropriate solvent in the presence of a chain transfer agent, as required, using a radical polymerization initiator such as a hydroperoxide, dialkyl peroxide, diacyl peroxide, or azo compound.

As examples of the solvent used for polymerization, alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylic acid esters such as ethyl acetate, n-butyl acetate, i-butyl acetate, and methyl propionate; ketones such as methyl ethyl ketone, methyl isobutyl ketone, and 2-heptanone; ethers such as tetrahydrofuran, dimethoxyethanes, and diethoxyethanes; and the like can be given.

The solvent may be used either individually or in combination of two or more.

The polymerization temperature is usually 40–120° C., and preferably 50–90° C. The reaction time is usually 1–48 hours, and preferably 1–24 hours.

The polystyrene-reduced weight average molecular weight (hereinafter referred to as "Mw") of the resin (A) measured by gel permeation chromatography (GPC) is usually 3,000–30,000, preferably 5,000–30,000, and still more preferably 5,000–20,000. If the Mw of the resin (A) is less than 3,000, heat resistance of the resulting resist may be decreased. If the Mw exceeds 30,000, developability of the resulting resist may be decreased.

The ratio of the Mw to the polystyrene-reduced number average molecular weight (hereinafter referred to as "Mn") measured by gel permeation chromatography (GPC) (Mw/Mn) of the resin (A) is usually 1–5, and preferably 1–3.

The content of impurities such as halogens and metals in the resin (A) is preferably as small as possible. The smaller the content of impurities, the more improved the sensitivity, resolution, process stability, pattern shape, and the like of the resulting resist. The resin (A) may be purified by using a chemical purification process such as washing with water or liquid-liquid extraction or a combination of the chemical purification process and a physical purification process such as ultrafiltration or centrifugation, for example.

Acid Generator (B)

The component (B) in the present invention is a radiation-sensitive acid generating compound which generates an acid upon exposure (hereinafter referred to as "acid generator (B)").

As examples of the acid generator (B), onium salt compounds, halogen-containing compounds, diazoketone compounds, sulfone compounds, sulfonate compounds, and the like can be given.

Examples of the acid generator (B) are given below.

Onium Salt Compound:

As examples of onium salt compounds, iodonium salts, sulfonium salts (including thiophenium salts), phosphonium salts, diazonium salts, pyridinium salts, and the like can be given.

As preferable examples of onium salt compounds, diphenyliodonium trifluoromethanesulfonate, diphenyliodonium nonafluoro-n-butanesulfonate, diphenyliodonium perfluoro-n-octanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, triphenylsulfonium trifluoromethanesulfonate, triphenylsulfonium nonafluoro-n-butanesulfonate, triphenylsulfonium 1,1,2,2,-tetrafluoro-2-(bicyclo[2.2.1]hept-2-yl)ethanesulfonate, triphenylsulfonium perfluoro-n-octanesulfonate, triphenylsulfonium 10-camphorsulfonate, cyclohexyl.2-oxocyclohexyl-methylsulfonium trifluoromethanesulfonate, dicyclohexyl.2-oxocyclohexylsulfonium trifluoromethanesulfonate, 2-oxocyclohexyldimethylsulfonium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 4-methylphenyl-1-tetrahydrothiophenium nonafluoro-n-butanesulfonate, 4-methylphenyl-1-tetrahydrothiophenium perfluoro-n-octanesulfonate, 4-hydroxy-1-naphthyltetrahydrothiophenium nonafluoro-n-butanesulfonate, 4-hydroxy-1-naphthyltetrahydrothiophenium perfluoro-n-octanesulfonate, 4-n-butoxy-1-naphthyltetrahydrothiophenium nonafluoro-n-butanesulfonate, 4-n-butoxy-1-naphthyltetrahydrothiophenium perfluoro-n-octanesulfonate, 1-(1-naphthylacetomethyl)tetrahydrothiophenium nonafluoro-n-butanesulfonate, 1-(1-naphthylacetomethyl) tetrahydrothiophenium perfluoro-n-octanesulfonate, cyclohexylphenyldiphenylsulfonium nonafluoro-n-butanesulfonate, and the like can be given.

Halogen-Containing Compound:

As examples of halogen-containing compounds, haloalkyl group-containing hydrocarbon compounds, haloalkyl group-containing heterocyclic compounds, and the like can be given.

As examples of preferable halogen-containing compounds, (trichloromethyl)-s-triazine derivatives such as phenylbis(trichloromethyl)-s-triazine, 4-methoxyphenylbis (trichloromethyl)-s-triazine, and 1-naphthylbis (trichloromethyl)-s-triazine, 1,1-bis(4-chlorophenyl)-2,2,2-trichloroethane, and the like can be given.

Diazoketone Compound:

As examples of diazoketone compounds, 1,3-diketo-2-diazo compounds, diazobenzoquinone compounds, diazonaphthoquinone compounds, and the like can be given.

As examples of preferable diazoketone compounds, 1,2-naphthoquinonediazido-4-sulfonyl chloride, 1,2-naphthoquinonediazido-5-sulfonyl chloride, 1,2-naphthoquinonediazido-4-sulfonate or 1,2-naphthoquinonediazido-5-sulfonate of 2,3,4,4'-tetrahydroxybenzophenone, 1,2-naphthoquinonediazido-4-sulfonate or 1,2-naphthoquinonediazido-5-sulfonate of 1,1,1-tris(4-hydroxyphenyl)ethane, and the like can be given.

Sulfone Compound:

As examples of sulfone compounds, β-ketosulfone, β-sulfonylsulfone, α-diazo compounds of these compounds, and the like can be given.

As preferable examples of sulfone compounds, 4-trisphenacylsulfone, mesitylphenacylsulfone, bis(phenylsulfonyl)methane, and the like can be given.

Sulfonate Compound:

As examples of sulfonate compounds, alkyl sulfonate, alkylimide sulfonate, haloalkyl sulfonate, aryl sulfonate, imino sulfonate, and the like can be given.

As preferable examples of sulfonate compounds, benzointosylate, tris(trifluoromethanesulfonate) of pyrogallol, nitrobenzyl-9,10-diethoxyanthracene-2-sulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, N-hydroxysuccinimidetrifluoromethanesulfonate, N-hydroxysuccinimidenonafluoro-n-butanesulfonate, N-hydroxysuccinimideperfluoro-n-octanesulfonate, 1,8-naphthalenedicarboxylic acid imide trifluoromethanesulfonate, 1,8-naphthalenedicarboxylic acid imide nonafluoro-n-butanesulfonate, 1,8-naphthaienedicarboxylic acid imide perfluoro-n-octanesulfonate, and the like can be given.

Of these acid generators (B), diphenyliodonium trifiuoromethanesulfonate, diphenyliodonium nonafluoro-n-butanesulfonate, diphenyliodonium perfluoro-n-octanesulfonate, bis(4-t-butylphenyl)iodonium trifiuoromethanesulfonate, bis(4-t-butylphenyl)iodonium nonafluoro-n-butanesulfonate, bis(4-t-butylphenyl)iodonium perfluoro-n-octanesulfonate, triphenylsulfonium trifluoromethanesulfonate, triphenylsulfonium nonafiuoro-n-butanesulfonate, triphenylsulfonium perfluoro-n-octanesulfonate, cyclohexyl-2-oxocyclohexylmethylsulfonium trifluoromethanesulfonate, dicyclohexyl 2-oxocyclohexylsulfonium trifluoromethanesulfonate, 2-oxocyclohexyldimethylsulfonium trifluoromethanesulfonate, 4-n-butoxy-1-naphthyltetrahydrothiophenium nonafluoro-n-butanesulfonate, 4-n-butoxy-1-naphthyltetrahydrothiophenium perfluoro-n-octanesulfonate, trifluoromethanesulfonylbicyclo[2.2.1]hept-5-ene-2,3-dicarboxyimide, nonafluoro-n-butanesulfonylbicyclo[2.2.1]hept-5-ene-2,3-dicarboxyimide, perfluoro-n-octanesulfonylbicyclo[2.2.1]hept-5-ene-2,3-dicarboxyimide, N-hydroxysuccinimido trifluoromethanesulfonate, N-hydroxysuccinimido nonafluoro-n-butanesulfonate, N-hydroxysuccinimido perfluoro-n-octanesulfonate, 1,8-naphthalenedicarboxylic acid imide trifluoromethanesulfonate, and the like are preferable.

The acid generator (B) may be used either individually or in combination of two or more.

The amount of the acid generator (B) used in the present invention is usually 0.1–20 parts by weight, and preferably 0.5–10 parts by weight for 100 parts by weight of the resin (A) in order to ensure sensitivity and developability of the resulting resist. If the amount of the acid generator (B) is less than 0.1 part by weight, sensitivity and developability of the resulting resist may be decreased. If the amount exceeds 20 parts by weight, it may be difficult to obtain a rectangular resist pattern due to a decrease in transparency to radiation.

Polycyclic Compound (C)

The component (C) used in the present invention is a polycyclic compound which has a molecular weight of 1,000 or less and includes a group shown by —COOR$^9$ (wherein R$^9$ represents a hydrogen atom, a substituted or unsubstituted linear or branched alkyl group having 1–20 carbon atoms, a substituted or unsubstituted monovalent alicyclic hydrocarbon group having 3–20 carbon atoms, or —CH$_2$COOR10 (wherein R$^{10}$ represents a hydrogen atom, a substituted or unsubstituted linear or branched alkyl group having 1–20 carbon atoms, or a substituted or unsubstituted monovalent alicyclic hydrocarbon group having 3–20 carbon atoms)) (hereinafter referred to as "polycyclic compound (C)").

In the case where two or more groups shown by —COOR$^9$ are present in the polycyclic compound (C), the R$^9$s may be either the same or different.

As examples of a substituted or unsubstituted alkyl group having 1–20 carbon atoms represented by R$^9$ in the polycyclic compound (C), unsubstituted linear, branched, cyclic alkyl groups such as a methyl group, ethyl group, n-propyl group, i-propyl group, n-butyl group, 2-methyl propyl group, 1-methyl propyl group, t-butyl group, n-pentyl group, n-hexyl group, n-heptyl group, n-octyl group, n-decyl group, n-dodecyl group, n-tetradecyi group, n-hexadecyl group, n-octadecyl group, n-eicosyl group, cyclopentyl group, cyclohexyl group, and cyclooctyl group; groups obtained by replacing these unsubstituted linear, branched, cyclic alkyl groups with at least one of a hydroxyl group; carboxyl group; oxo group; hydroxyalkyl groups having 1–4 carbon atoms such as a hydroxymethyl group, hydroxyethyl group, 1-hydroxypropyl group, 2-hydroxypropyl group, 3-hydroxypropyl group, 1-hydroxybutyl group, 2-hydroxybutyl group, 3-hydroxybutyl group, and 4-hydroxybutyl group; alkoxyl groups having 1–4 carbon atoms such as a methoxy group, ethoxy group, n-propoxy group, i-propoxy group, n-butoxy group, 2-methylpropoxy group, 1-methylpropoxy group, and t-butoxy group; and cyanoalkyl groups having 2–5 carbon atoms such as a cyanomethyl group, 2-cyanoethyl group, 3-cyanopropyl group, and 4-cyanobutyl group can be given.

As examples of a substituted or unsubstituted monovalent alicyclic hydrocarbon group having 3–20 carbon atoms represented by R$^9$, unsubstituted alicyclic groups derived from cycloalkanes such as a norbornane, tricyclodecane, tetracyclododecane, adamantane, cyclobutane, cyclopentane, cyclohexane, cycloheptane, and cyclooctane; groups obtained by replacing these unsubstituted alicyclic groups with at least one of a hydroxyl group; carboxyl group; oxo group; hydroxyalkyl group having 1–4 carbon atoms such as a hydroxymethyl group, hydroxyethyl group, 1-hydroxypropyl group, 2-hydroxypropyl group, 3-hydroxypropyl group, 1-hydroxybutyl group, 2-hydroxybutyl group, 3-hydroxybutyl group, and 4-hydroxybutyl group; alkoxyl group having 1–4 carbon atoms such as a methoxy group, ethoxy group, n-propoxy group, i-propoxy group, n-butoxy group, 2-methylpropoxy group, 1-methylpropoxy group, or t-butoxy group; and cyanoalkyl group having 2–5 carbon atoms such as a cyanomethyl group, 2-cyanoethyl group, 3-cyanopropyl group, and 4-cyanobutyl group; and the like can be given.

As examples of a substituted or unsubstituted linear or branched alkyl group having 1–20 carbon atoms and a substituted or unsubstituted monovalent alicyclic hydrocarbon group having 3–20 carbon atoms represented by $R^{10}$, the groups illustrated for $R^9$ can be given.

As $R^9$ in the polycyclic compound (C), a hydrogen atom, 1-methylpropyl group, t-butyl group, 1-methylpropoxycarbonylmethyl group, t-butoxycarbonylmethyl group, and the like are preferable. Of these, a t-butyl group and a t-butoxycarbonylmethyl group are particularly preferable.

In the case where $R^9$ in the polycyclic compound (C) is a 1-branched alkyl group or a substituted derivative of the 1-branched alkyl group, $R^9$ dissociates in the presence of an acid. The group —$CH_2COOR10$ represented by $R^9$ dissociates in the presence of an acid. In the case where $R^{10}$ is a 1-branched alkyl group or a substituted derivative of the 1-branched alkyl group, $R^{10}$ dissociates in the presence of an acid. In these cases, —$COOR^9$ and —$COO$—$CH_2COOR^{10}$ in the polycyclic compound (C) form acid-dissociable groups.

As examples of the polycyclic compound (C), a compound shown by the following formula (4) (hereinafter referred to as "polycyclic compound (C4)"), a compound shown by the following formula (5) (hereinafter referred to as "polycyclic compound (C5)"), a compound shown by the following formula (6) (hereinafter referred to as "polycyclic compound (C6)"), a compound shown by the following formula (7) (hereinafter referred to as "polycyclic compound (C7)"), a compound shown by the following formula (8) (hereinafter referred to as "polycyclic compound (C8)"), a compound shown by the following formula (9) (hereinafter referred to as "polycyclic compound (C9)"), and the like can be given.

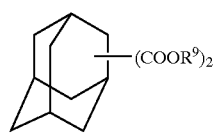

(4)

wherein $R^9$ represents a hydrogen atom, a substituted or unsubstituted linear or branched alkyl group having 1–20 carbon atoms, a substituted or unsubstituted monovalent alicyclic hydrocarbon group having 3–20 carbon atoms, or —$CH_2COOR^{10}$ (wherein $R^{10}$ represents a hydrogen atom, a substituted or unsubstituted linear or branched alkyl group having 1–20 carbon atoms, or a substituted or unsubstituted monovalent alicyclic hydrocarbon group having 3–20 carbon atoms);

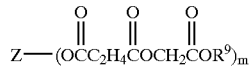

(5)

wherein $R^9$ is the same as defined for the formula (4), Z represents a hydrocarbon group with a valence of m which has a polycyclic carbon ring in which the number of carbon atoms which make up the ring is 6-20 or a derivative thereof, and m is an integer of 1–4;

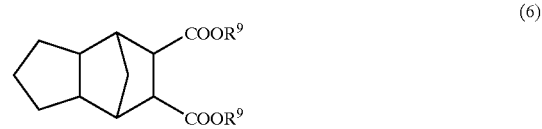

(6)

wherein $R^9$ is the same as defined for the formula (4);

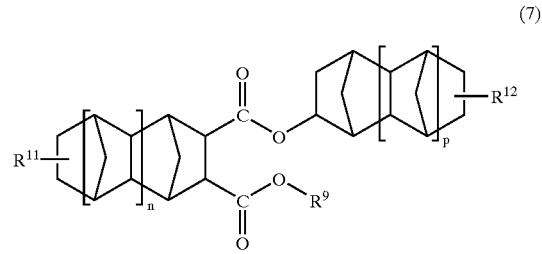

(7)

wherein $R^9$ is the same as defined for the formula (4), $R^{11}$ and $R^{12}$ individually represent a hydrogen atom, a linear or branched alkyl group having 1–4 carbon atoms, a linear or branched hydroxyalkyl group having 1–4 carbon atoms, —$OR^{13}$ (wherein $R^{13}$ represents a hydrogen atom, a linear or branched alkyl group having 1–4 carbon atoms, or —$CH_2COOR^{14}$ (wherein $R^{14}$ represents a hydrogen atom or an alkyl group having 1–4 carbon atoms)), or —$COOR^{15}$ (wherein $R^{15}$ represents a hydrogen atom, a substituted or unsubstituted alkyl group having 1–20 carbon atoms, or —$CH_2COOR^{16}$ (wherein $R^{16}$ represents a hydrogen atom or an alkyl group having 1–18 carbon atoms)), and n and p are integers of 0–2;

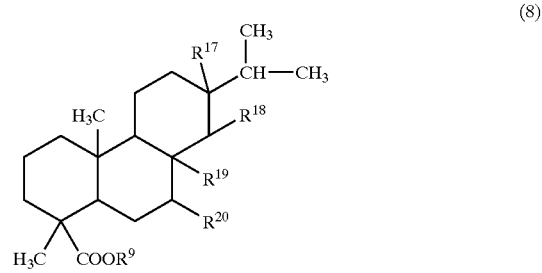

(8)

wherein $R^9$ is the same as defined for the formula (4), and $R^{17}$, $R^{18}$, $R^{19}$, and $R^{20}$ individually represent a hydrogen atom, a hydroxyl group, a linear or branched alkyl group having 1–4 carbon atoms, or a linear or branched alkoxyl group having 1–4 carbon atoms;

(9)

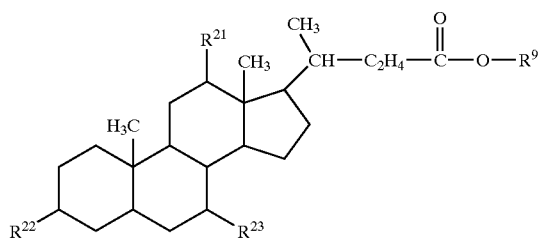

(ii)

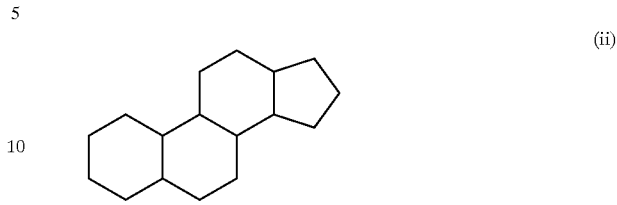

wherein $R^9$ is the same as defined for the formula (4), and $R^{21}$, $R^{22}$, and $R^{23}$ individually represent a hydrogen atom or a hydroxyl group, provided that at least one of $R^{21}$, $R^{22}$, and $R^{23}$ represents a hydroxyl group.

As specific examples of the cyclic compound (C4), di-t-butyl 1,2-adamantanedicarboxylate, di-t-butyl 1,3-adamantanedicarboxylate, di-t-butyl 1,4-adamantanedicarboxylate, di-t-butyl 2,2-adamantanedicarboxylate, di-t-butyl 2,4-adamantanedicarboxylate, di-t-butyl 2,9-adamantanedicarboxylate, di-t-butoxycarbonylmethyl 1,2-adamantanedicarboxylate, di-t-butoxycarbonylmethyl 1,3-adamantanedicarboxylate, di-t-butoxycarbonylmethyl 1,4-adamantanedicarboxylate, di-t-butoxycarbonylmethyl 2,2-adamantanedicarboxylate, di-t-butoxycarbonylmethyl 2,4-adamantanedicarboxylate, di-t-butoxycarbonylmethyl 2,9-adamantanedicarboxylate, 1-t-butoxycarbonyl-2-t-butoxycarbonylmethoxycarbonyladamantane, 1-t-butoxycarbonyl-3-t-butoxycarbonylmethoxycarbonyladamantane, 1-t-butoxycarbonyl-4-t-butoxycarbonylmethoxycarbonyladamantane, 2-t-butoxycarbonyl-2-t-butoxycarbonylmethoxycarbonyladamantane, 2-t-butoxycarbonyl-4-t-butoxycarbonylmethoxycarbonyladamantane, 2-t-butoxycarbonyl-9-t-butoxycarbonylmethoxycarbonyladamantane, 1-t-butoxycarbonylmethoxycarbonyl-2-t-butoxycarbonyladamantane, 1-t-butoxycarbonylmethoxycarbonyl-4-t-butoxycarbonyladamantane, and the like can be given.

Of these polycyclic compounds (C4), di-t-butyl 1,3-adamantanedicarboxylate, di-t-butoxycarbonylmethyl 1,3-adamantanedicarboxylate, and the like are preferable.

The polycyclic compound (C4) is synthesized as follows. For example, di-t-butyl 1,3-adamantanedicarboxylate is synthesized by dissolving 1,3-adamantanedicarboxylic acid in tetrahydrofuran in a nitrogen atmosphere, adding trifluoroacetic anhydride dropwise to the solution while cooling with ice, stirring the mixture at room temperature, adding a tetrahydrofuran solution of t-butanol to the mixture while cooling with ice, and stirring the mixture to react at room temperature overnight. Di-t-butoxycarbonylmethyl 1,3-adamantanedicarboxylate is synthesized by allowing 1,3-adamantanedicarboxylic acid to react with t-butyl bromoacetate in the presence of a potassium carbonate catalyst.

As examples of the hydrocarbon group with a valence of m which has a polycyclic carbon ring in which the number of carbon atoms which make up the ring is 6–20 represented by Z in the alicyclic compound (C5), groups derived from a polycyclic carbon ring such as norbornane, tricyclodecane, tetracyclododecane, adamantane, and a compound shown by the following formula (ii);

hydrocarbon groups derived from groups in which these polycyclic carbon rings are replaced with at least one linear, branched, or cyclic alkyl group having 1–8 carbon atoms such as a methyl group, ethyl group, n-propyl group, i-propyl group, n-butyl group, 2-methylpropyl group, 1-methylpropyl group, or t-butyl group; and the like can be given.

In the polycyclic compound (C5), m pieces of the groups —OCOC$_2$H$_4$COOCH$_2$COOR$^9$ may be bonded to the polycyclic carbon ring in the hydrocarbon group with a valence of m or the alkyl group which replaces the polycyclic carbon ring.

As examples of the derivative of the hydrocarbon group with a valence of m which has a polycyclic carbon ring in which the number of carbon atoms which make up the ring is 6–20 represented by Z, groups having at least one substituent such as a hydroxyl group; carboxyl group; oxo group; hydroxyalkyl groups having 1–4 carbon atoms such as a hydroxymethyl group, hydroxyethyl group, 1-hydroxypropyl group, 2-hydroxypropyl group, 3-hydroxypropyl group, 1-hydroxybutyl group, 2-hydroxybutyl group, 3-hydroxybutyl group, and 4-hydroxybutyl group; alkoxyl groups having 1–4 carbon atoms such as a methoxy group, ethoxy group, n-propoxy group, i-propoxy group, n-butoxy group, 2-methylpropoxy group, 1-methylpropoxy group, and t-butoxy group; an alkoxycarbonyl group having 2–5 carbon atoms such as a methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, and t-butoxycarbonyl group; and alkoxycarbonylmethoxycarbonyl groups having 4–7 carbon atoms such as a methoxycarbonylmethoxycarbonyl group, to cmethoxycarbonylmethoxycarbonyl group, n-propoxycarbonylmethoxycarbonyl group, i-propoxycarbonylmethoxycarbonyl group, n-butoxycarbonylmethoxycarbonyl group, 2-methylpropoxycarbonylmethoxycarbonyl group, 1-methylpropoxycarbonylmethoxycarbonyl group, and t-butoxycarbonylmethoxycarbonyl group can be given. These substituents may be bonded to the polycyclic carbon ring in the hydrocarbon group with a valence of m or the alkyl group which replaces the polycyclic carbon ring.

Of these substituents, a hydroxyl group, 1-methylpropoxycarbonylmethoxycarbonyl group, t-butoxycarbonylmethoxycarbonyl group, and the like are preferable. A hydroxyl group is particularly preferable.

As m in the polycyclic compound (C5), either 1 or 2 is preferable.

In the case where the polycyclic compound (C5) has a (1-branched alkoxy)-COCH$_2$—OCO group as the substituent, the group may dissociate between the 1-branched alkoxy group and COCH$_2$, and between (1-branched alkoxy)-COCH$_2$ and OCO in the presence of an acid.

As specific examples of the polycyclic compound (C5), compounds shown by the following formulas (5-1) to (5-44) and the like can be given.
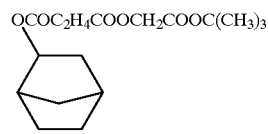 (5-1)
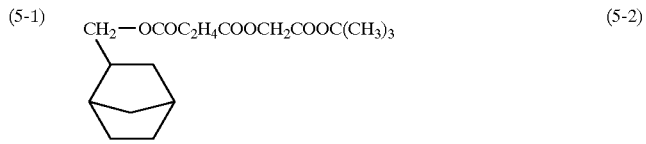 (5-2)
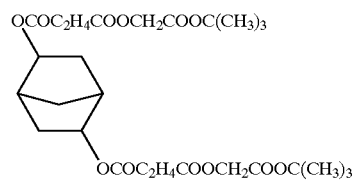 (5-3)
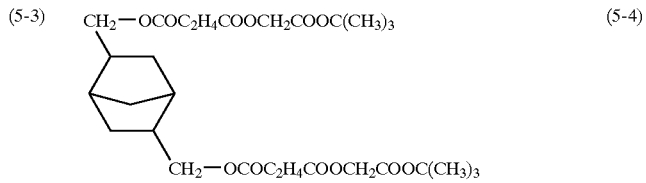 (5-4)
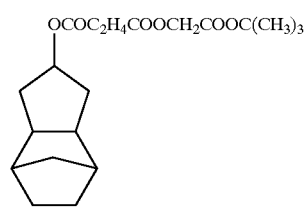 (5-5)
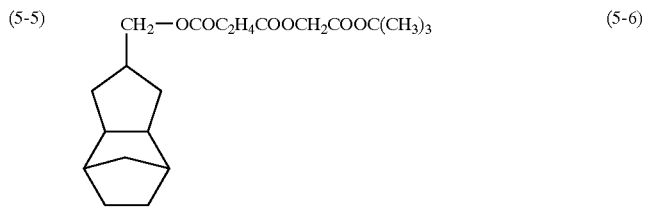 (5-6)
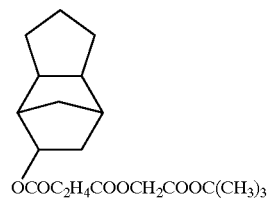 (5-7)
 (5-8)
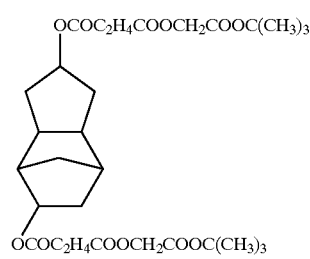 (5-9)
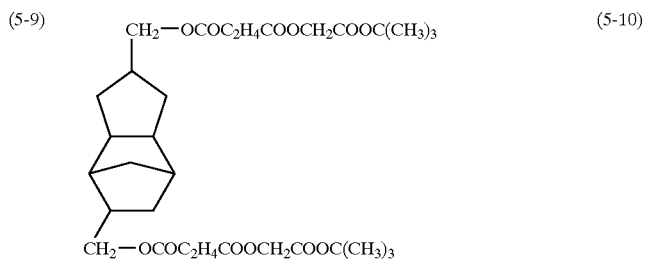 (5-10)
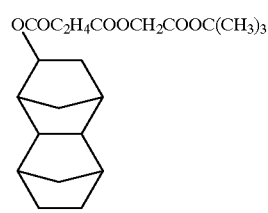 (5-11)
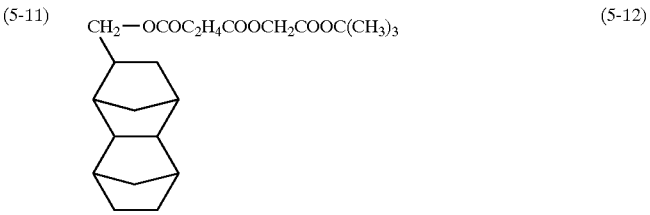 (5-12)
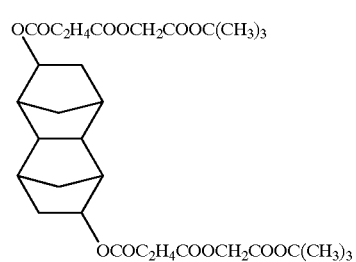 (5-13)
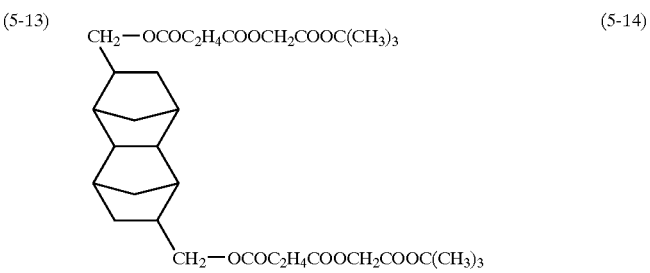 (5-14)

-continued
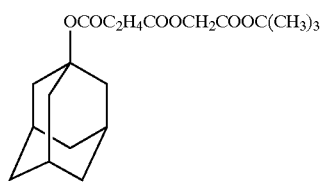 (5-15)
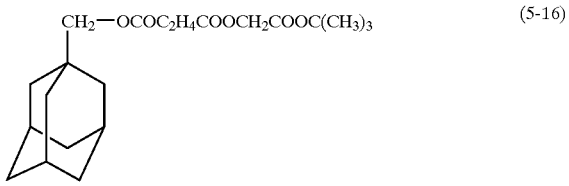 (5-16)
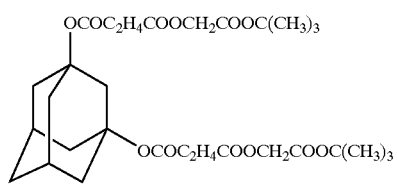 (5-17)
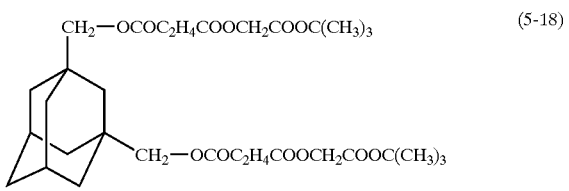 (5-18)
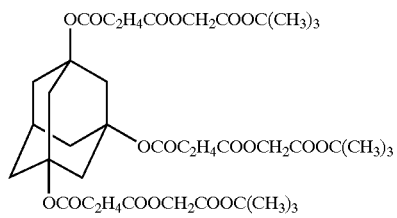 (5-19)
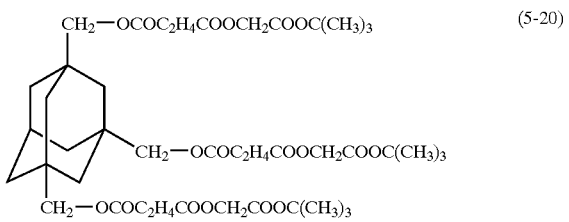 (5-20)
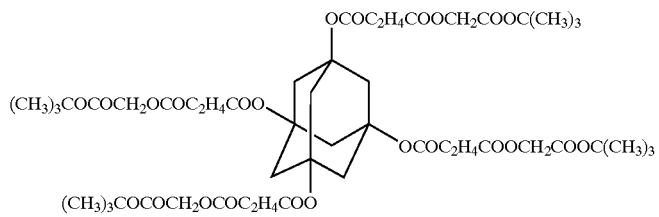 
 (5-21)
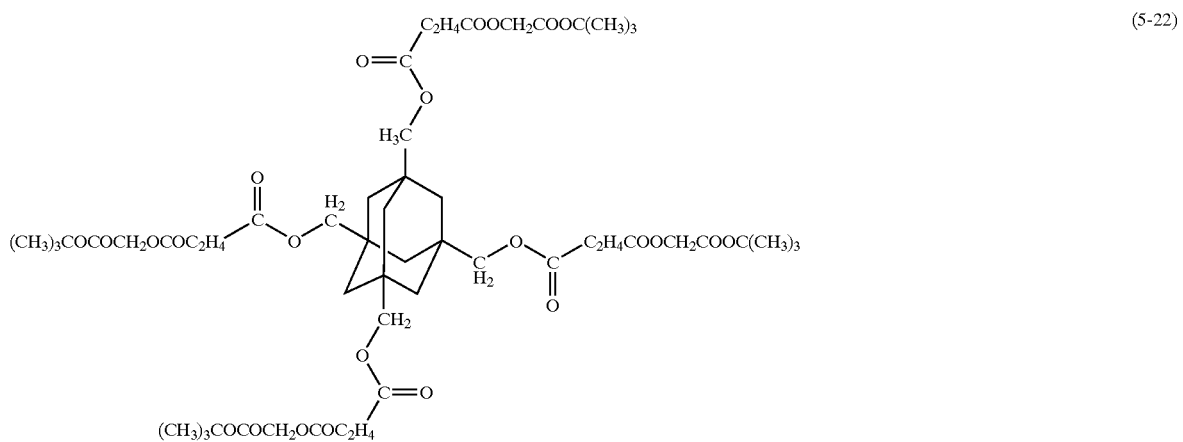 (5-22)
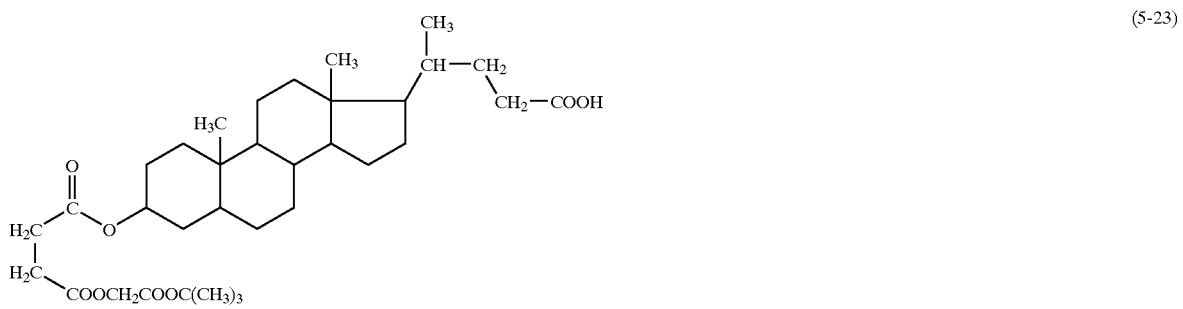 (5-23)

-continued
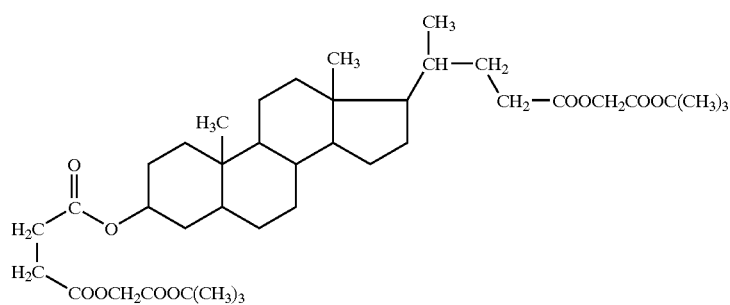
(5-24)
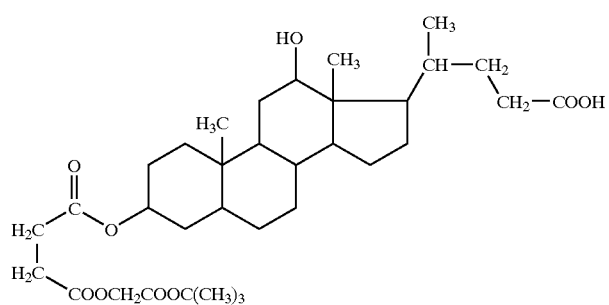
(5-25)
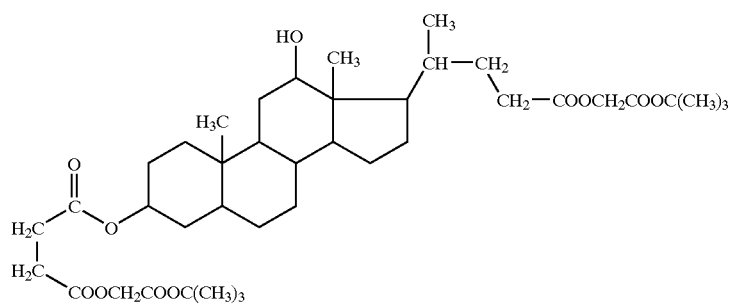
(5-26)
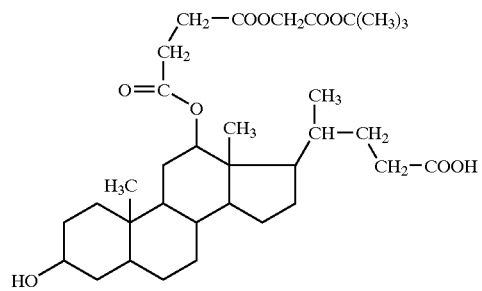
(5-27)
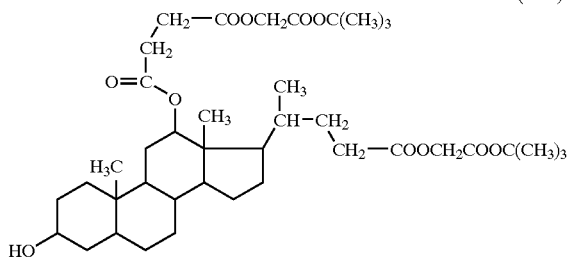
(5-28)
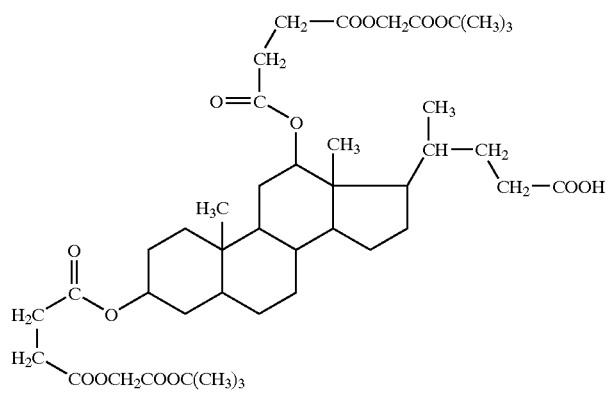
(5-29)

-continued
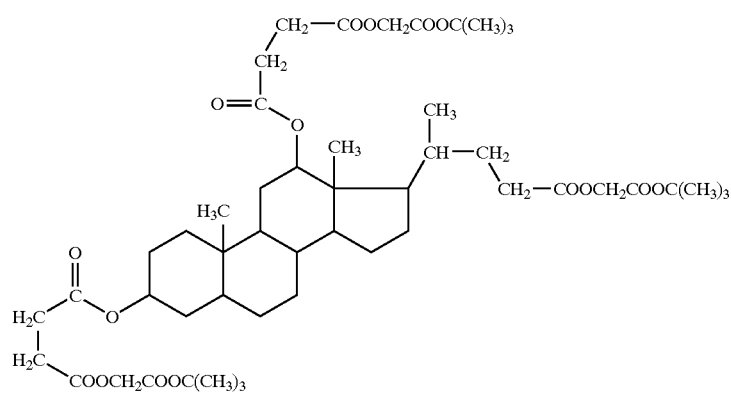
(5-30)
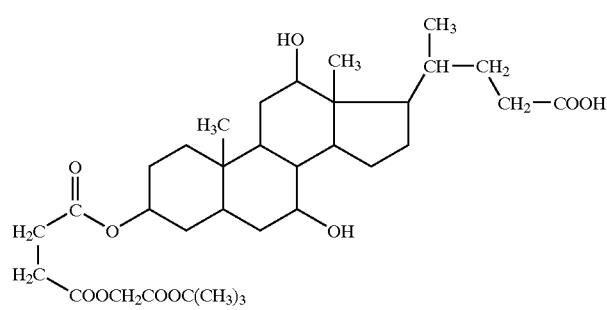
(5-31)
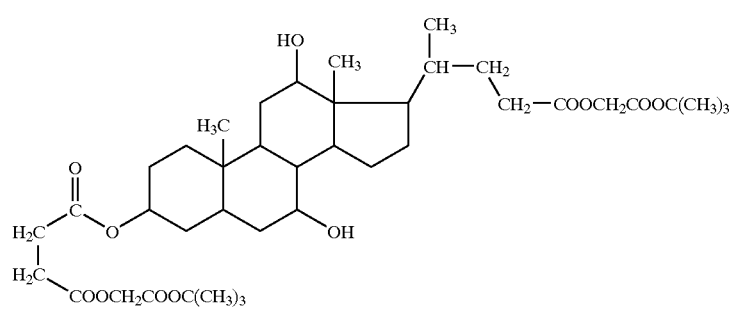
(5-32)
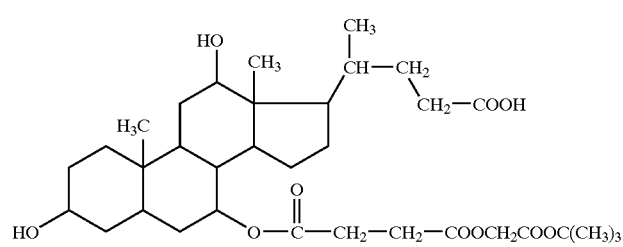
(5-33)
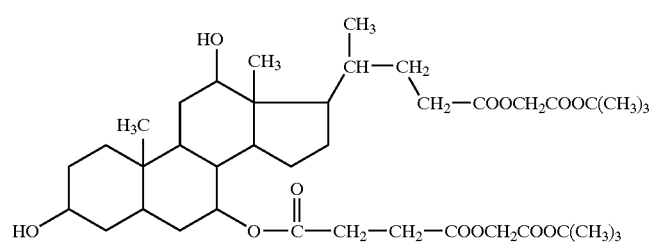
(5-34)

-continued
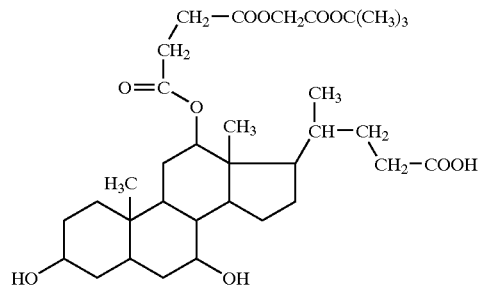 (5-35)
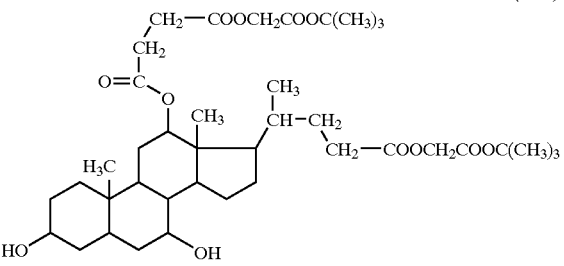 (5-36)
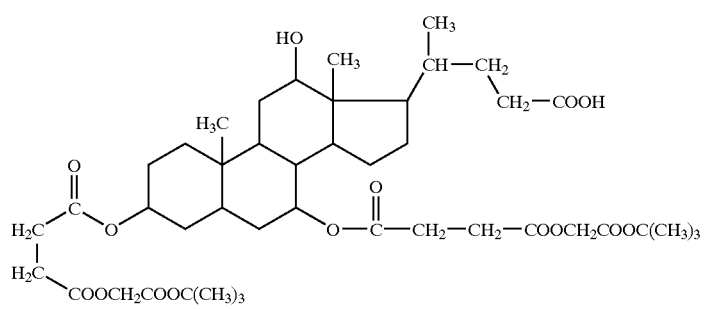 (5-37)
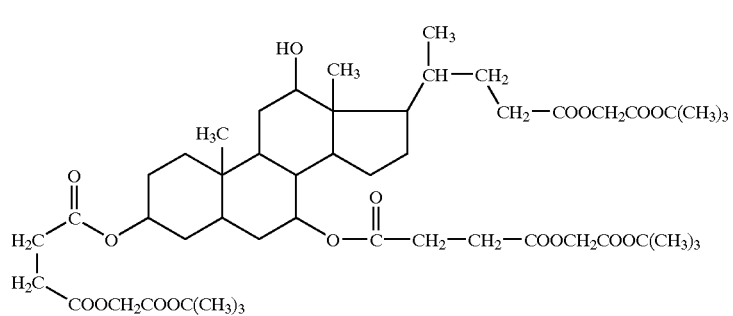 (5-38)
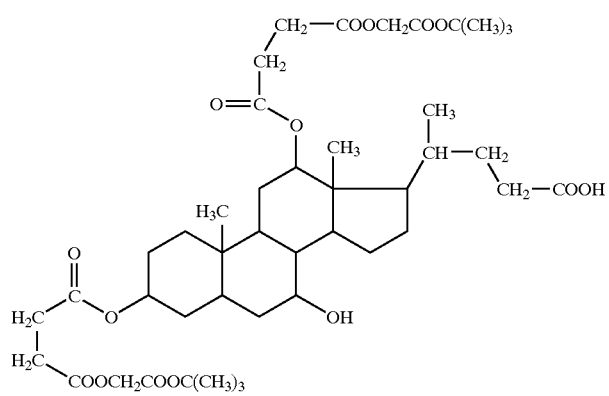 (5-39)

-continued
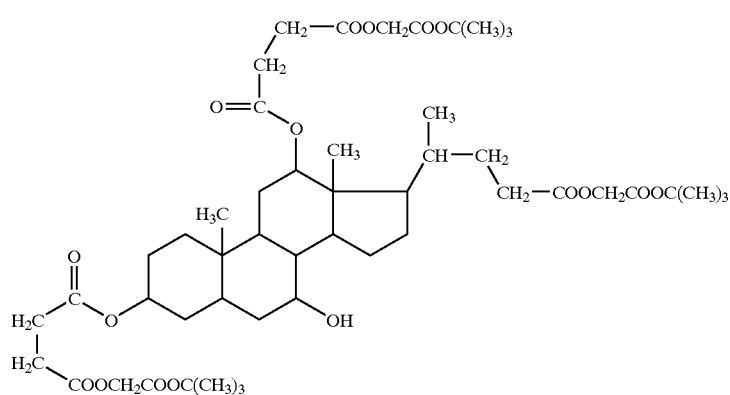
(5-40)
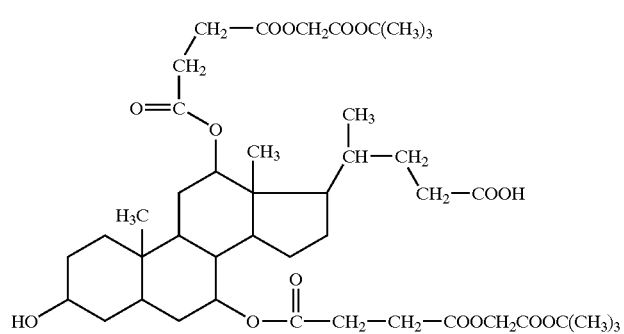
(5-41)
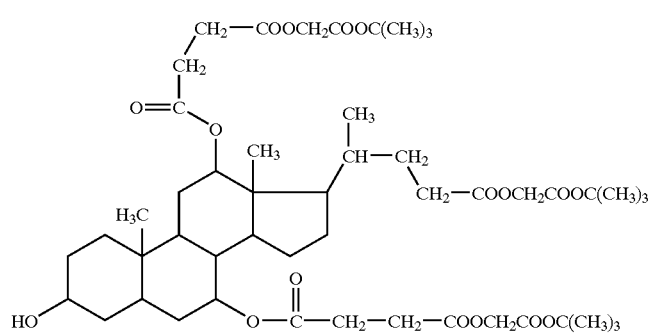
(5-42)
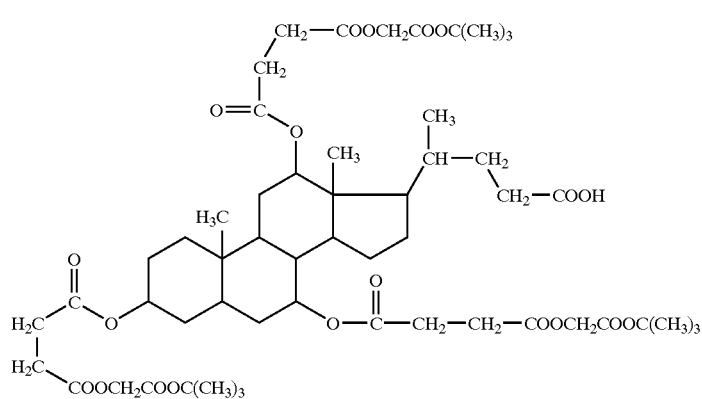
(5-43)

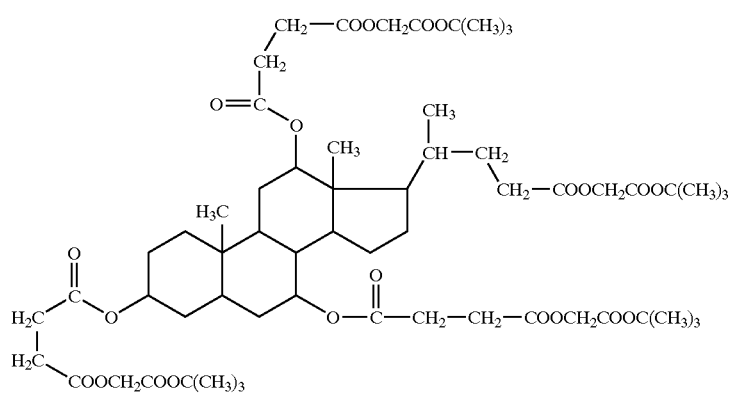

(5-44)

Of these polycyclic compounds (C5), the compounds shown by the formulas (5-9), (5-10), (5-13), (5-14), (5-17), (5-18), (5-21), (5-22), (5-24), (5-30) and (5-44) are preferable. The compounds shown by the formula (5-10), (5-17) (5-21), (5-24), (5-30), and (5-44) are particularly preferable.

The polycyclic compound (C5) may be synthesized by reacting an alcohol having an alicyclic carbon ring with succinic anhydride, and reacting the resulting reaction product with t-butyl bromoacetate, for example. In more detail, the compound shown by the formula (5-30) is synthesized by reacting deoxycholic acid with succinic anhydride in n-butyl acetate in a nitrogen atmosphere under reflux, dissolving the resulting precipitated white solid in n-butyl acetate and washing the white solid with water several times, removing the solvent by distillation, adding tetrahydrofuran, distilled water, potassium carbonate, and t-butyl bromoacetate, and reacting the mixture for several hours, for example.

As specific examples of the polycyclic compound (C6), compounds shown by the following formulas (6-1) to (6-29) and the like can be given.

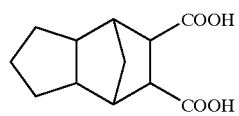

(6-1)

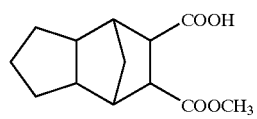

(6-2)

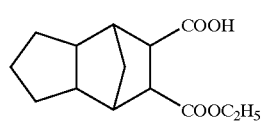

(6-3)

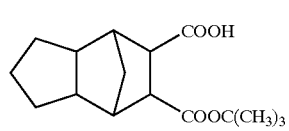

(6-4)

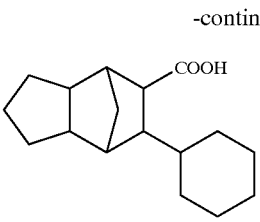

(6-5)

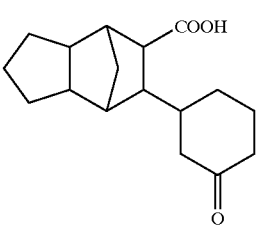

(6-6)

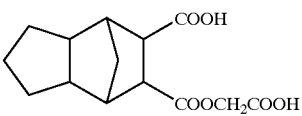

(6-7)

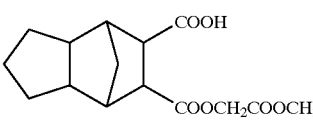

(6-8)

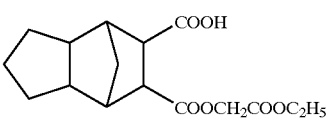

(6-9)

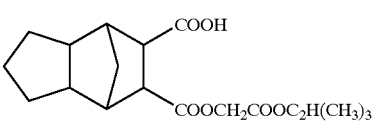

(6-10)

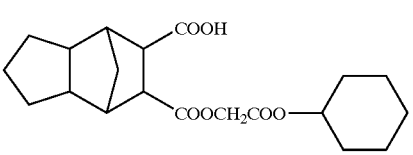

(6-11)

-continued
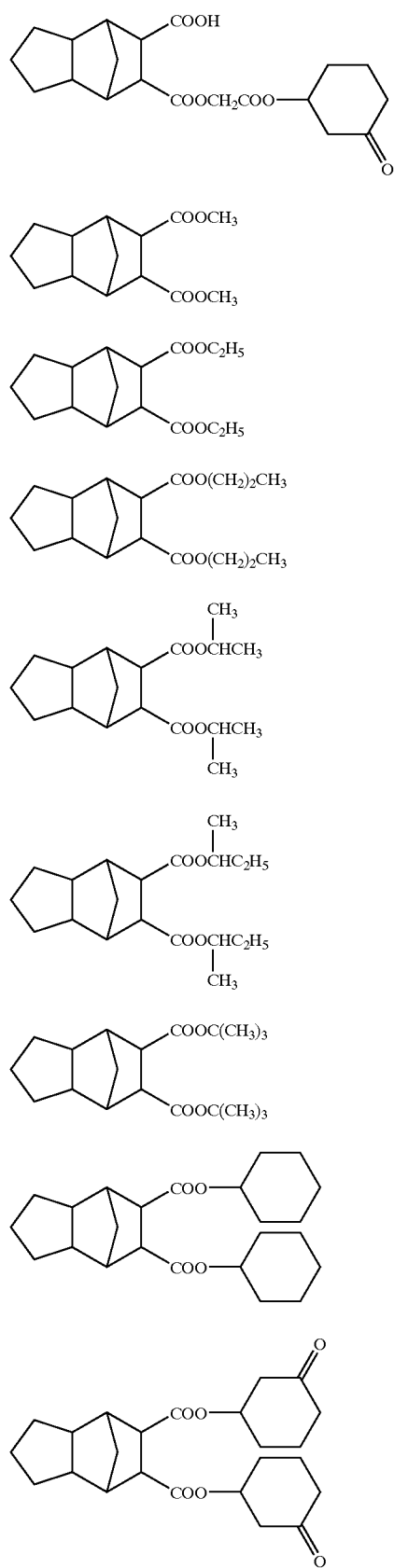
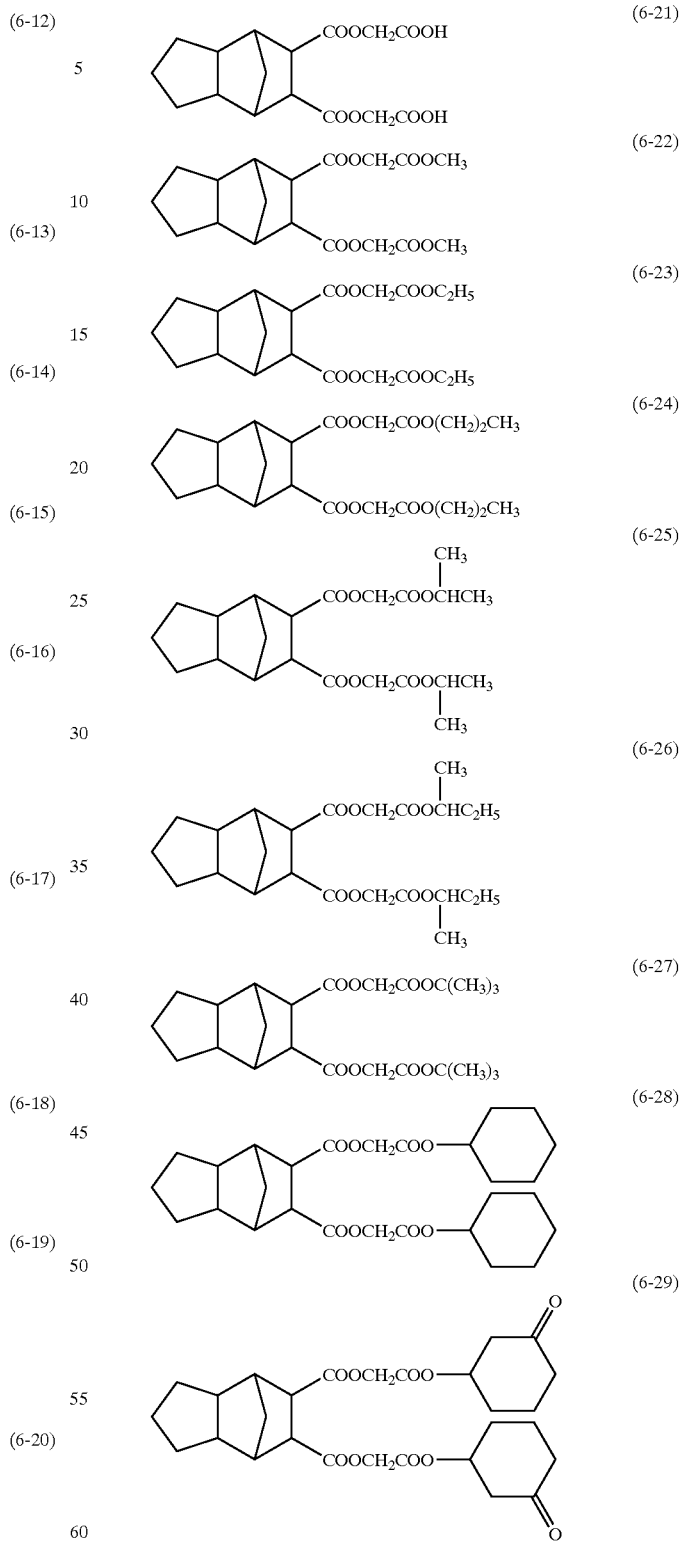
Of these polycyclic compounds (C6), the compounds shown by the formulas (6-18) and (6-27) are preferable.
Among the polycyclic compounds (C6), the compound shown by the formula (6-1) is commercially available. The polycyclic compounds (C6) other than the compound shown by the formula (6-1) may be synthesized from the compound shown by the formula (6-1) as the starting material. For example, the compound shown by the formula (6-18) may be synthesized by reacting the compound shown by the formula (6-1) with potassium t-butoxide at a high temperature in the presence of a catalyst such as thionyl chloride. The compound shown by the formula (6-27) may be synthesized by reacting the compound shown by the formula (6-1) with t-butyl bromoacetate in the presence of a catalyst such as potassium carbonate.

In the polycyclic compound (C7), in the case where n and p are 0, provided that the divalent carbonyloxy group or the divalent oxycarbonyl group which connects two carbon rings in the formula (7) is at the 2-position, $R^{11}$ and $R^{12}$ are bonded at the 5-position or 6-position. In the case where n and p are 1, provided that the divalent carbonyloxy group or the divalent oxycarbonyl group which connects two carbon rings in the formula (7) is at the 3-position, $R^{11}$ and $R^{12}$ are bonded at the 8-position or 9-position. In the case where n and p are 2, provided that the divalent carbonyloxy group or the divalent oxycarbonyl group which connects two carbon rings in the formula (7) is at the 3-position, $R^{11}$ and $R^{12}$ are bonded at the 10-position or 11-position.

As examples of the linear or branched alkyl group having 1–4 carbon atoms represented by $R^{11}$ and $R^{12}$ in the polycyclic compound (C7), a methyl group, ethyl group, n-propyl group, i-propyl group, n-butyl group, 2-methylpropyl group, 1-methylpropyl group, t-butyl group, and the like can be given.

As examples of the linear or branched hydroxyalkyl group having 1–4 carbon atoms represented by $R^{11}$ and $R^{12}$ in the polycyclic compound (C7), a hydroxymethyl group, 2-hydroxyethyl group, 1-hydroxypropyl group, 2-hydroxypropyl group, 3-hydroxypropyl group, 1-hydroxybutyl group, 2-hydroxybutyl group, 3-hydroxybutyl group, 4-hydroxybutyl group, and the like can be given.

As examples of —$OR^{13}$ represented by $R^{11}$ and $R^{12}$ in which $R^{13}$ represents a linear or branched alkyl group having 1–4 carbon atoms, a methoxy group, ethoxy group, n-propoxy group, i-propoxy group, n-butoxy group, 2-methylpropoxy group, 1-methylpropoxy group, t-butoxy group, and the like can be given.

As examples of —$OR^{13}$ represented by $R^{11}$ and $R^{12}$ in which $R^{13}$ represents —$CH_2COOR^{14}$, a carboxymethoxy group and linear, branched, or cyclic alkoxycarbonylmethoxy groups such as a methoxycarbonylmethoxy group, ethoxycarbonylmethoxy group, n-propoxycarbonylmethoxy group, i-propoxycarbonylmethoxy group, n-butoxycarbonylmethoxy group, 2-methylpropoxycarbonylmethoxy group, 1-methylpropoxycarbonylmethoxy group, t-butoxycarbonylmethoxy group, n-pentyloxycarbonylmethoxy group, n-hexyloxycarbonylmethoxy group, n-octyloxycarbonylmethoxy group, n-decyloxycarbonylmethoxy group, n-dodecyloxycarbonylmethoxy group, n-tetradecyloxycarbonylmethoxy group, n-hexadecyloxycarbonylmethoxy group, n-octadecyloxycarbonylmethoxy group, cyclopentyloxycarbonylmethoxy group, cyclohexyloxycarbonylmethoxy group, and cyclooctyloxycarbonylmethoxy group can be given.

As examples of —$COOR^{15}$ represented by $R^{11}$ and $R^{12}$ in which $R^{15}$ represents a substituted or unsubstituted alkyl group having 1–20 carbon atoms, linear, branched, or cyclic unsubstituted alkoxycarbonyl groups such as a methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, t-butoxycarbonyl group, n-pentyloxycarbonyl group, n-hexyloxycarbonyl group, n-octyloxycarbonyl group, n-decyloxycarbonyl group, n-dodecyloxycarbonyl group, n-tetradecyloxycarbonyl group, n-hexadecyloxycarbonyl group, n-octadecyloxycarbonyl group, n-eicosyloxycarbonyl group, cyclopentyloxycarbonyl group, cyclohexyloxycarbonyl group, and cyclooctyloxycarbonyl group; and derivatives in which the alkoxyl group in these unsubstituted alkoxycarbonyl groups is replaced with at least one substituent such as a hydroxyl group, carboxyl group, oxo group, hydroxymethyl group, or linear or branched alkoxyl group having 1–4 carbon atoms can be given.

As examples of —$COOR^{15}$ represented by $R^{11}$ and $R^{12}$ in which $R^{15}$ represents —$CH_2COOR^1$, a carboxymethoxycarbonyl group and linear, branched, or cyclic alkoxycarbonylmethoxycarbonyl groups such as a methoxycarbonylmethoxycarbonyl group, ethoxycarbonylmethoxycarbonyl group, n-propoxycarbonylmethoxycarbonyl group, i-propoxycarbonylmethoxycarbonyl group, n-butoxycarbonylmethoxycarbonyl group, 2-methylpropoxycarbonylmethoxycarbonyl group, 1-methylpropoxycarbonylmethoxycarbonyl group, t-butoxycarbonylmethoxycarbonyl group, n-pentyloxycarbonylmethoxycarbonyl group, n-hexyloxycarbonylmethoxycarbonyl group, n-octyloxycarbonylmethoxycarbonyl group, n-decyloxycarbonylmethoxycarbonyl group, n-dodecyloxycarbonylmethoxycarbonyl group, n-tetradecyloxycarbonylmethoxycarbonyl group, n-hexadecyloxycarbonylmethoxycarbonyl group, n-octadecyloxycarbonylmethoxycarbonyl group, cyclopentyloxycarbonylmethoxycarbonyl group, cyclohexyloxycarbonylmethoxycarbonyl group, cyclooctyloxycarbonylmethoxycarbonyl group, and the like can be given.

As $R^{11}$ and $R^{12}$ in the polycyclic compound (C7), a hydrogen atom, a hydroxymethyl group, hydroxyl group, t-butoxycarbonylmethoxy group, t-butoxycarbonyl group, t-butoxycarbonylmethoxycarbonyl group, and the like are preferable.

As n and p in the polycyclic compound (C7), either 0 or 1 is preferable.

As specific examples of the polycyclic compound (C7), compounds shown by the following formulas (7-1) to (7-208), and the like can be given.

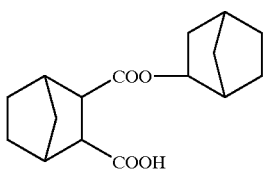

(7-1)

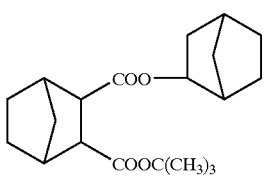

(7-2)

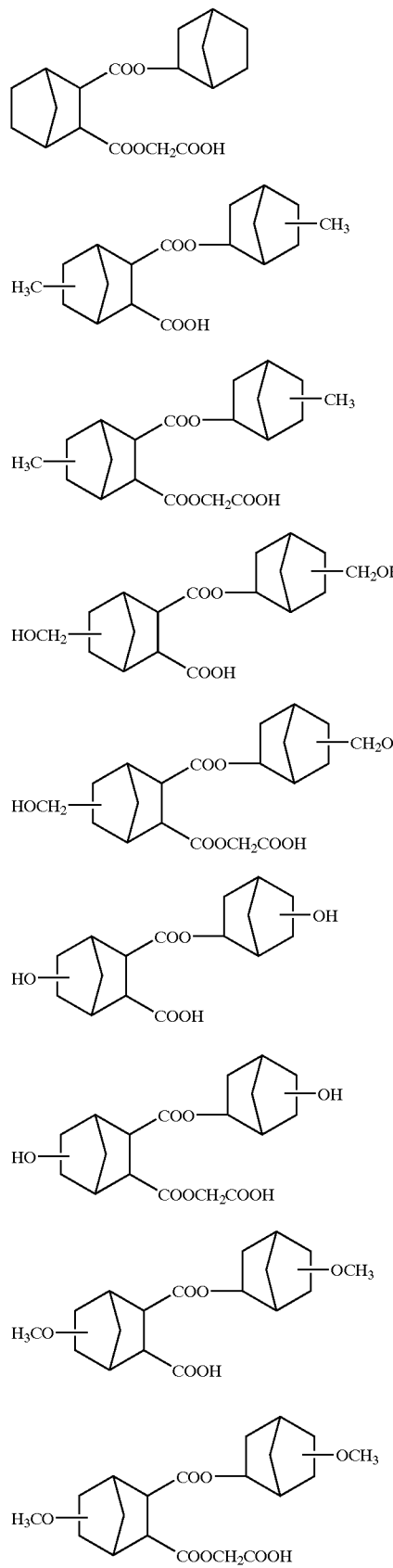

-continued
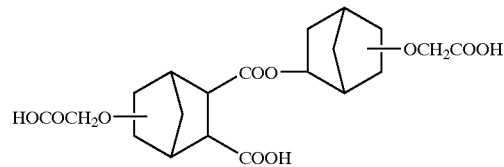
(7-21)
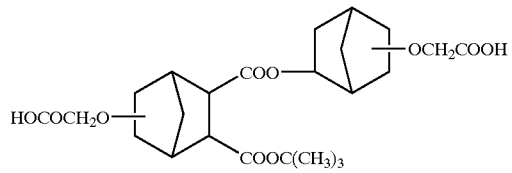
(7-22)
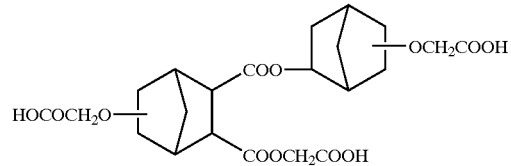
(7-23)
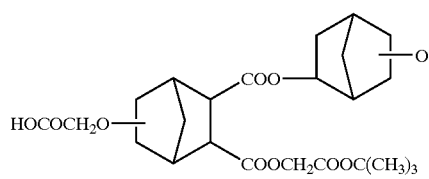
(7-24)
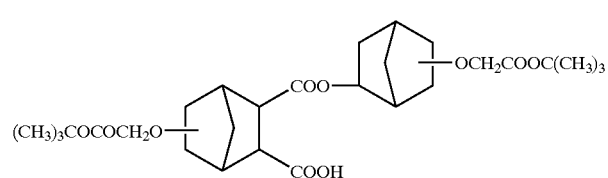
(7-25)
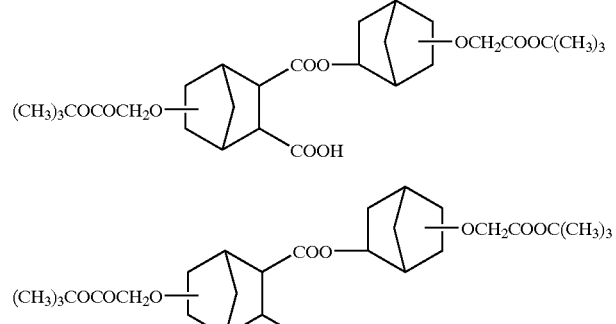
(7-26)
(7-27)
(7-28)
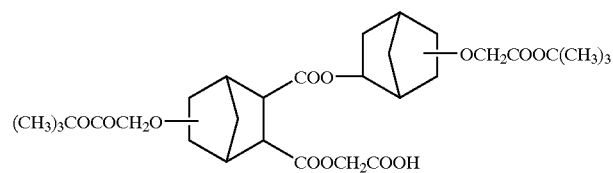
(7-29)
(7-30)
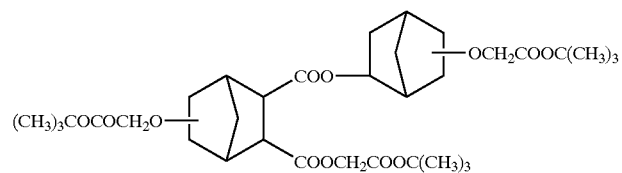
(7-31)
(7-32)
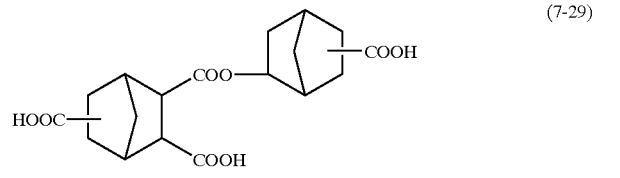
(7-33)
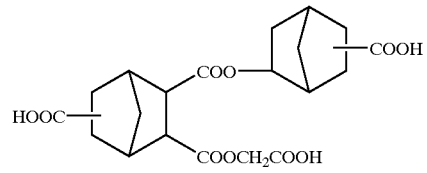
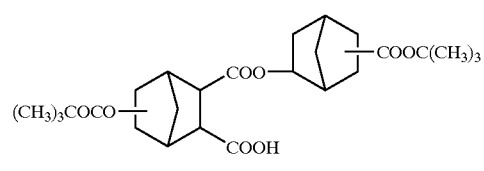
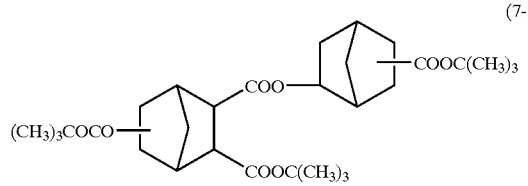
(7-34)

-continued
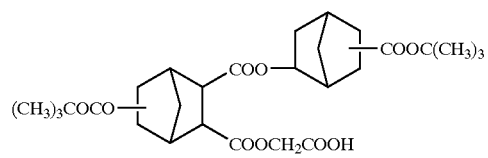
(7-35)
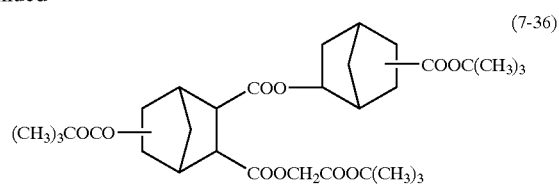
(7-36)
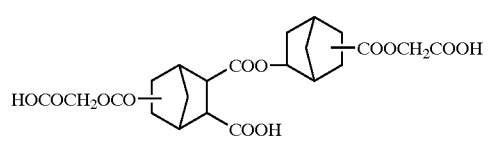
(7-37)
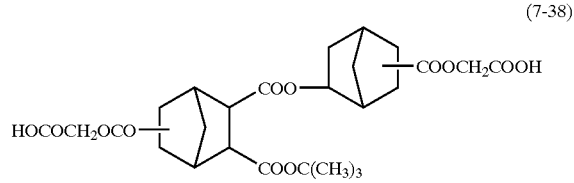
(7-38)
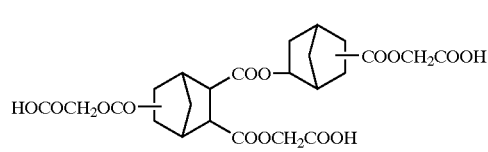
(7-39)
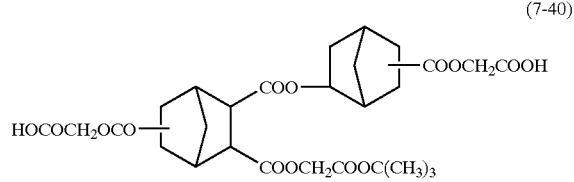
(7-40)
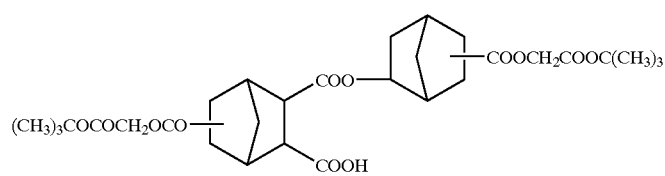
(7-41)
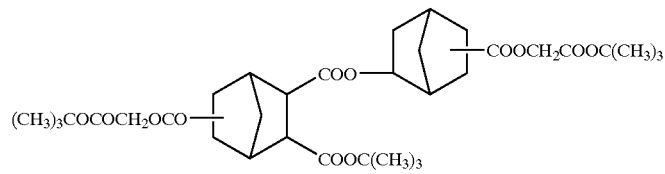
(7-42)
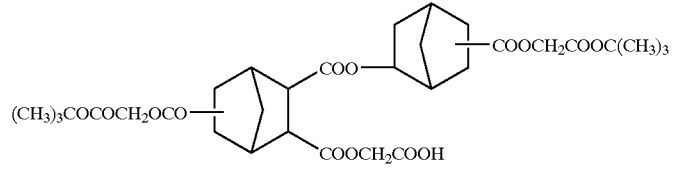
(7-43)
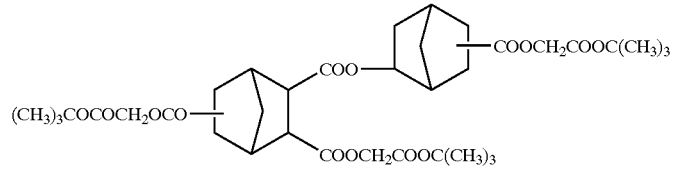
(7-44)
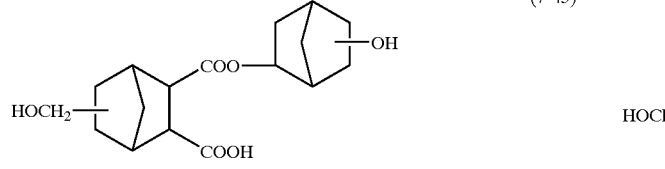
(7-45)
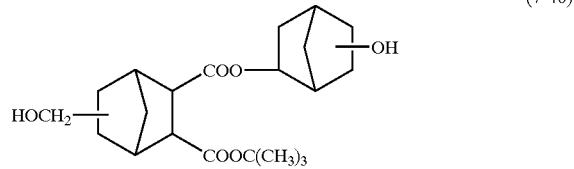
(7-46)
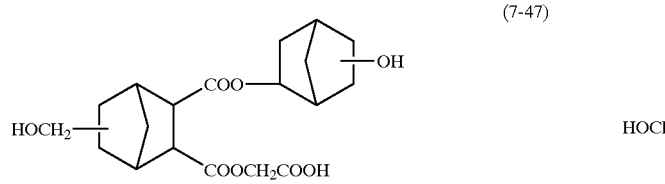
(7-47)
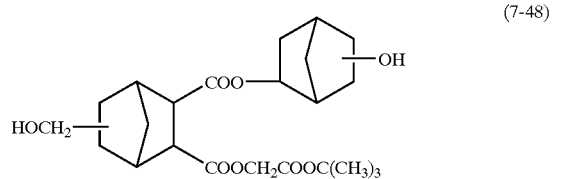
(7-48)

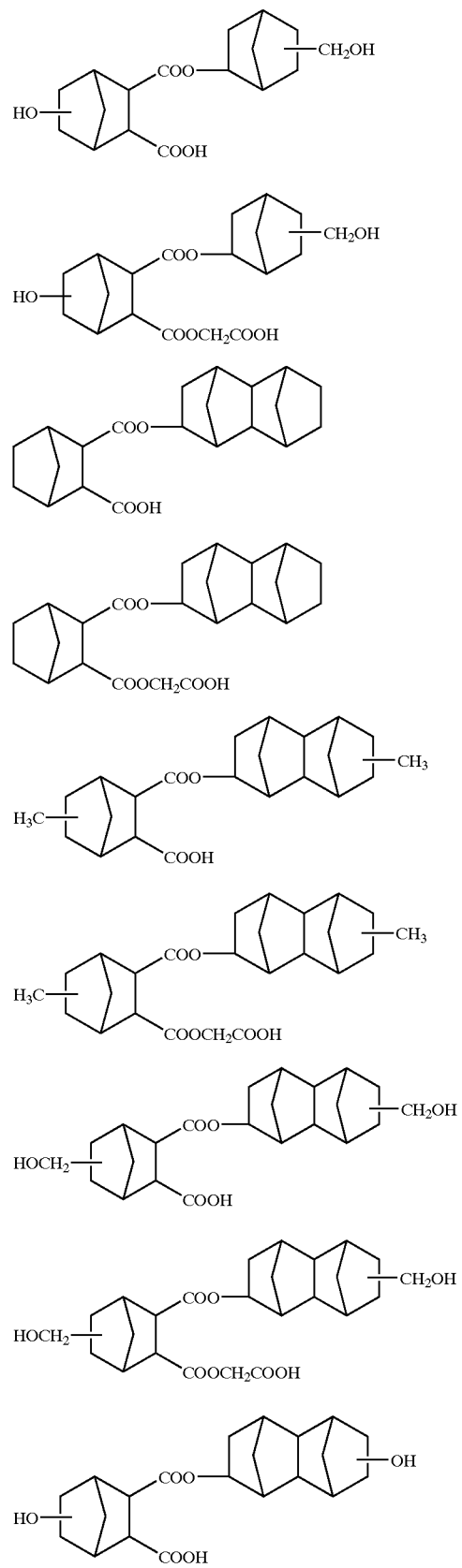

-continued
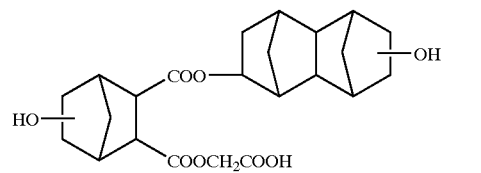
(7-67)
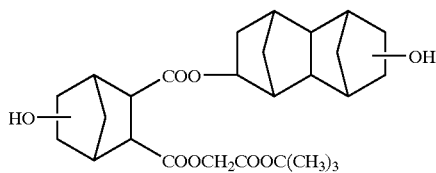
(7-68)
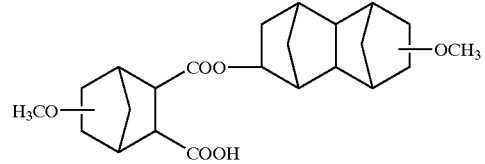
(7-69)
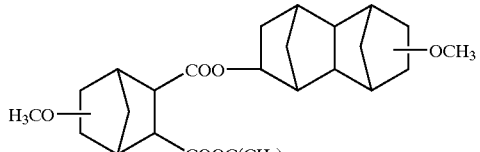
(7-70)
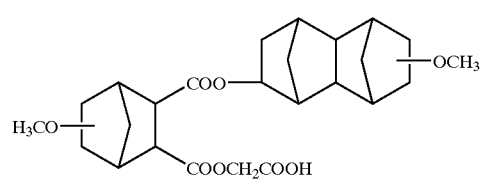
(7-71)
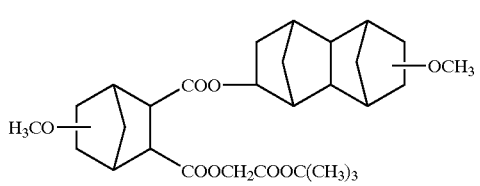
(7-72)
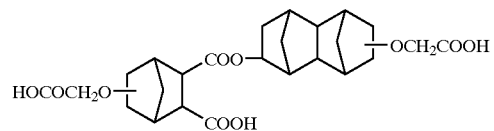
(7-73)
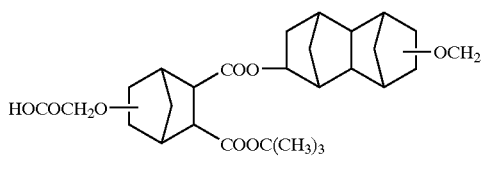
(7-74)
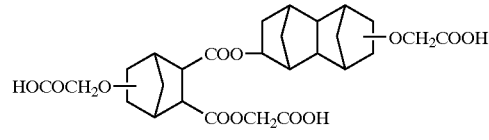
(7-75)
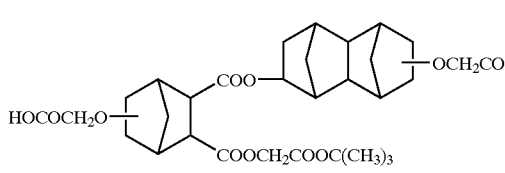
(7-76)
(7-77)
(7-78)
(7-79)
(7-80)

-continued
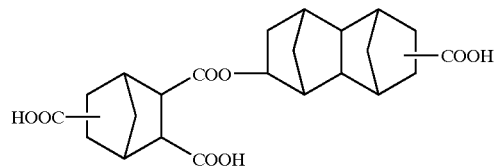
(7-81)
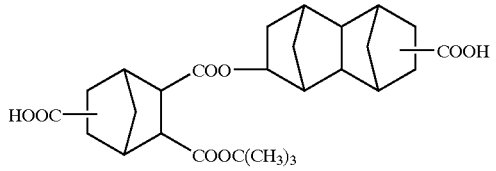
(7-82)
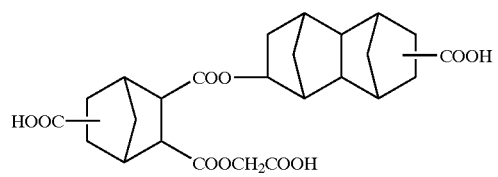
(7-83)
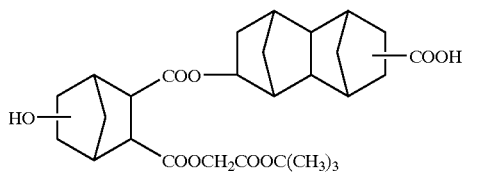
(7-84)
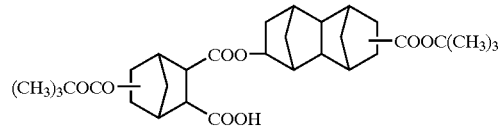
(7-85)
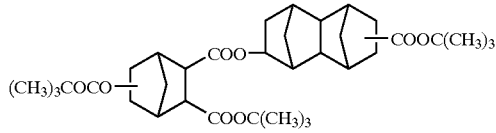
(7-86)
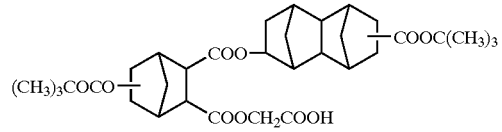
(7-87)
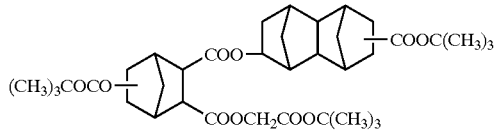
(7-88)
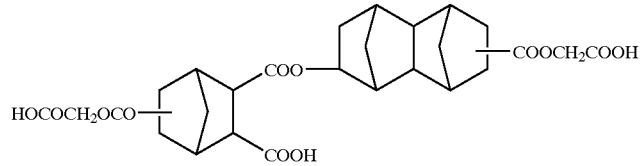
(7-89)
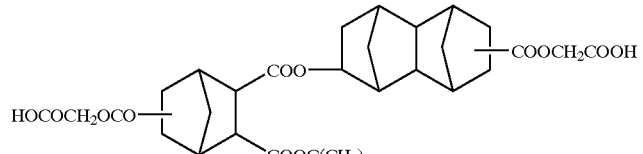
(7-90)
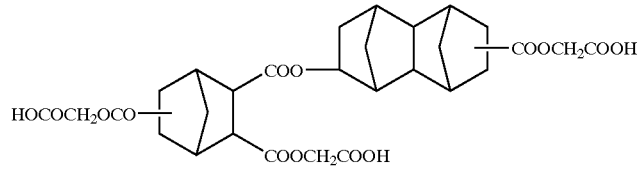
(7-91)
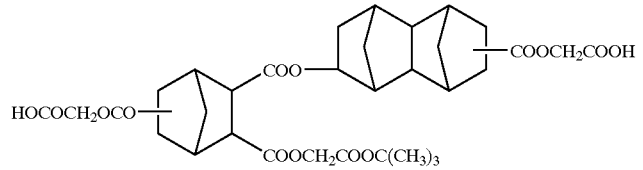
(7-92)
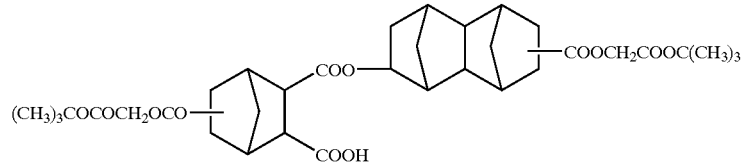
(7-93)

-continued
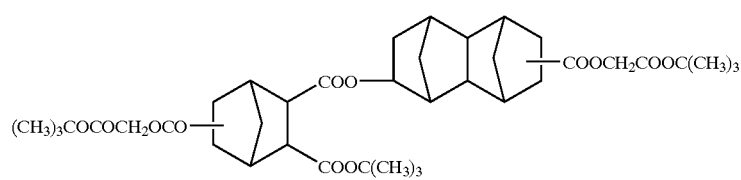 (7-94)
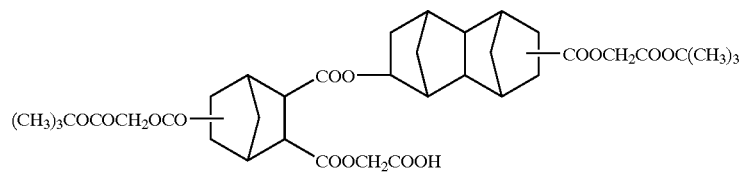 (7-95)
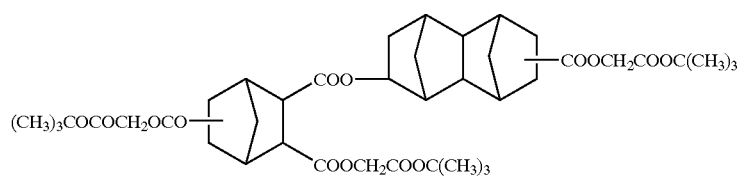 (7-96)
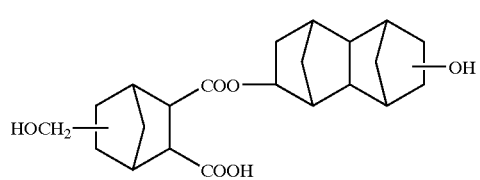 (7-97)
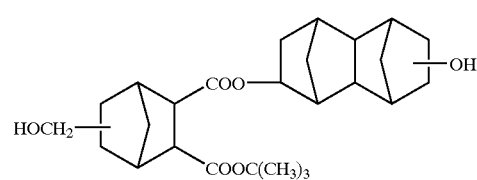 (7-98)
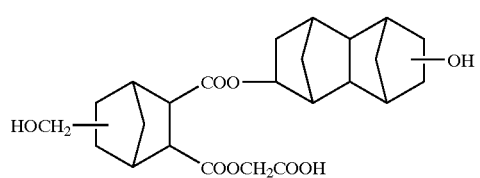 (7-99)
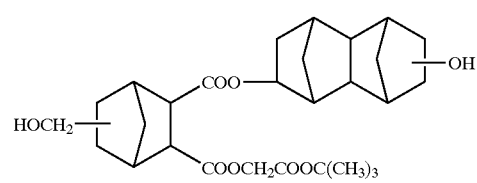 (7-100)
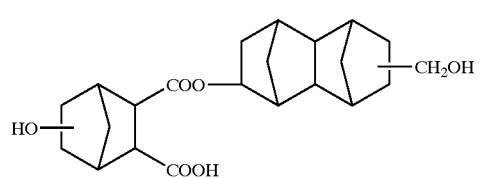 (7-101)
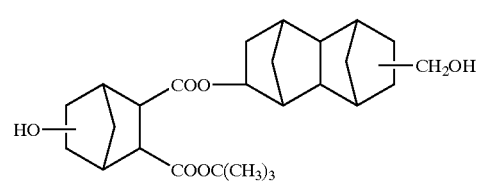 (7-102)
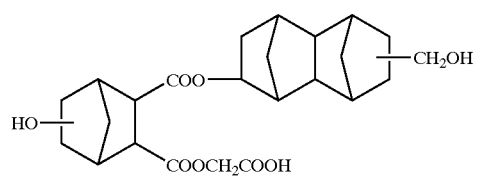 (7-103)
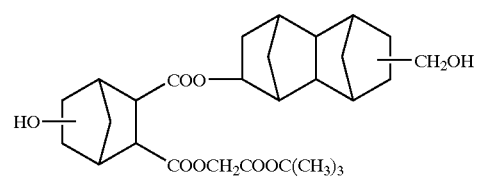 (7-104)
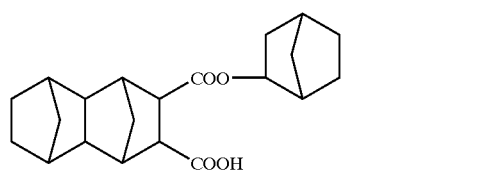 (7-105)
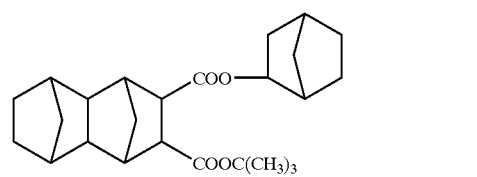 (7-106)
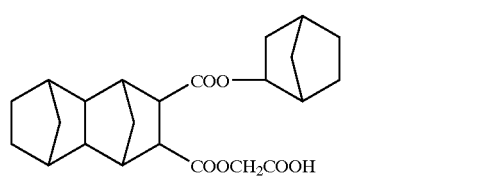 (7-107)
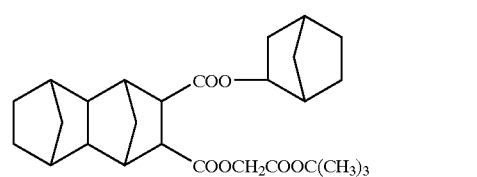 (7-108)

-continued
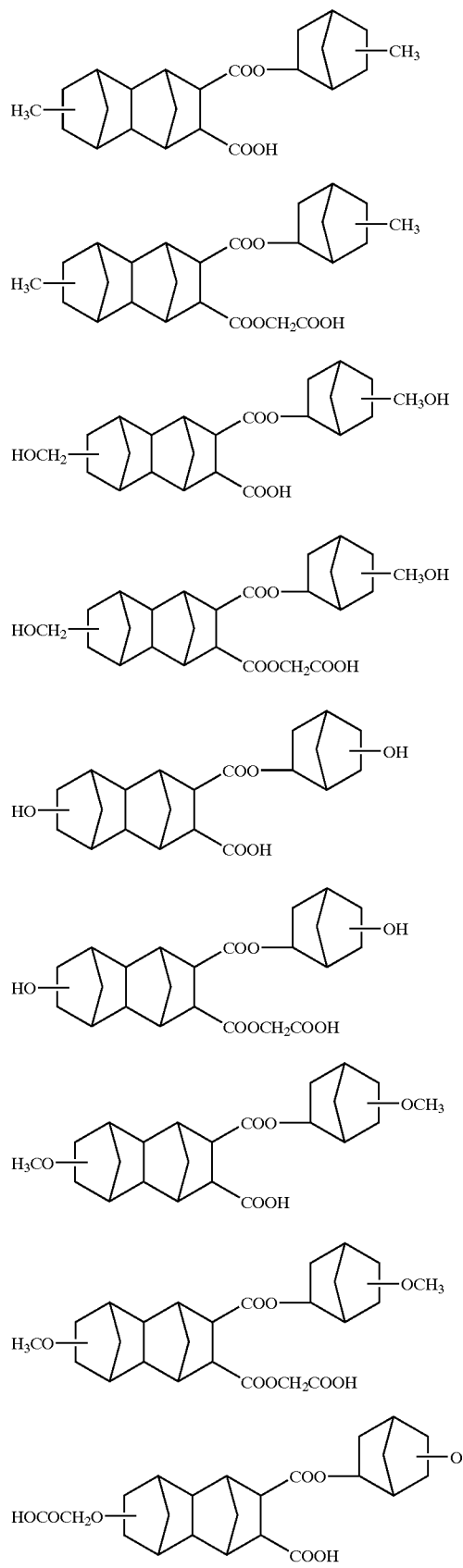
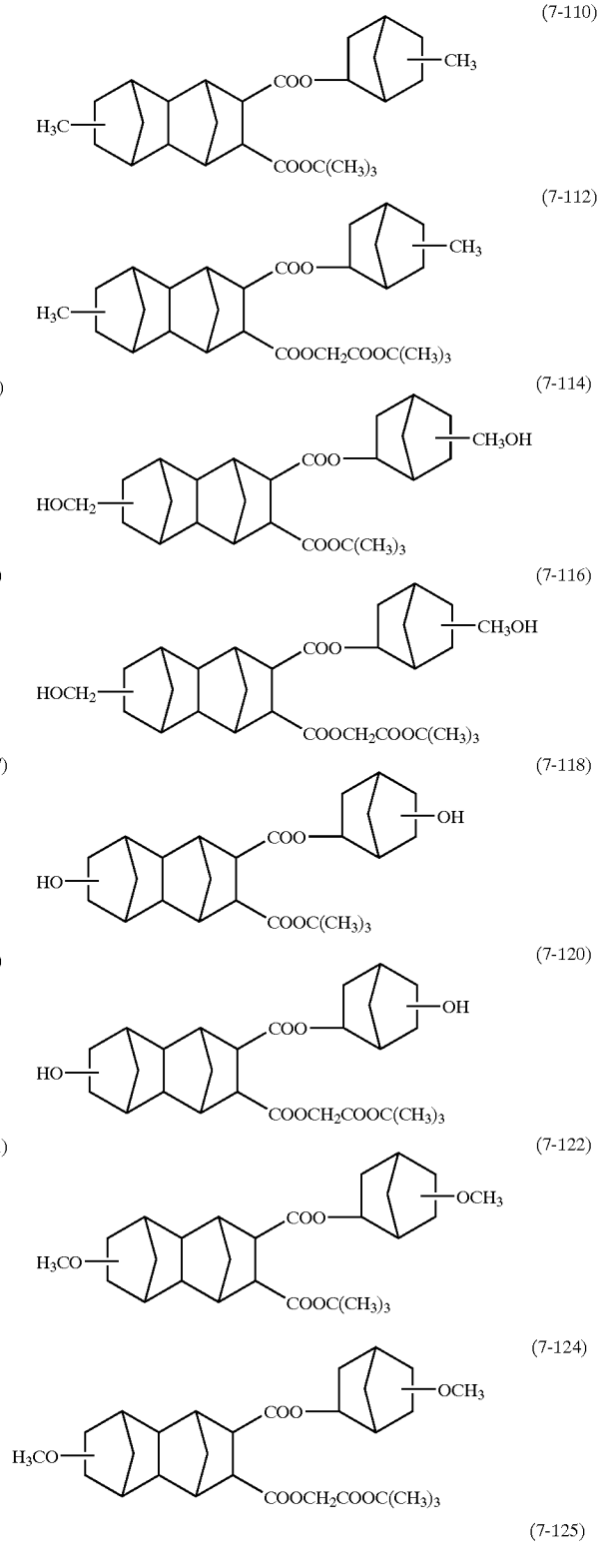

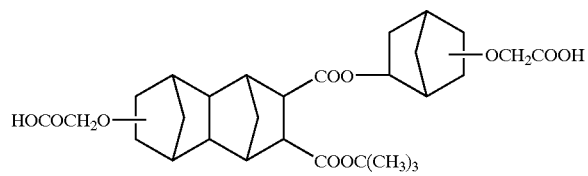
(7-126)
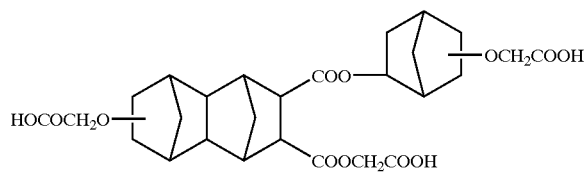
(7-127)
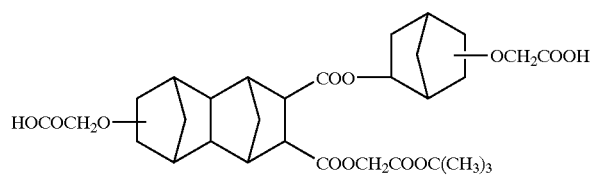
(7-128)
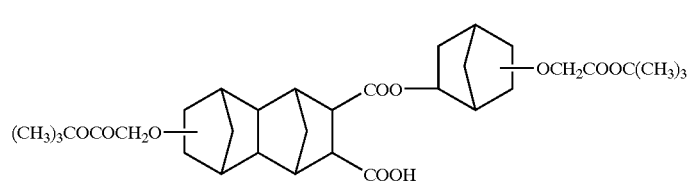
(7-129)
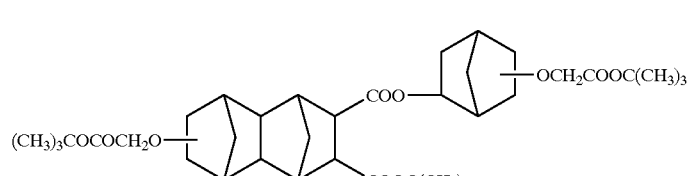
(7-130)
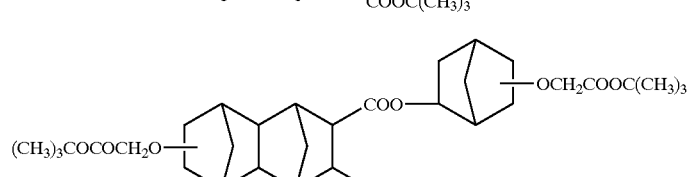
(7-131)
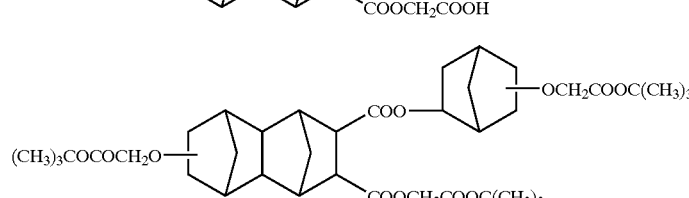
(7-132)
(7-133)
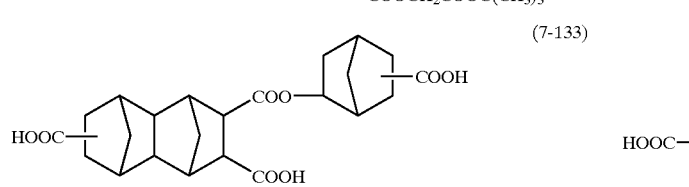
(7-134)
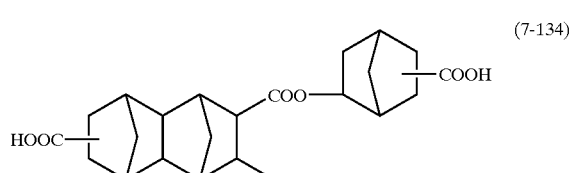
(7-135)
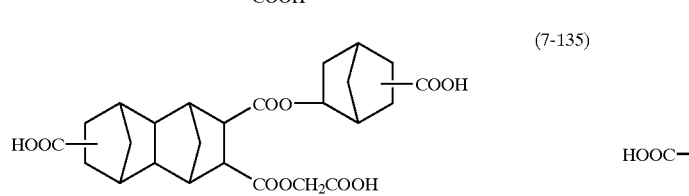
(7-136)
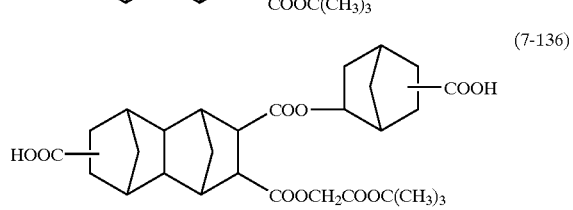

-continued
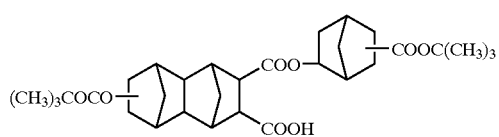 (7-137)
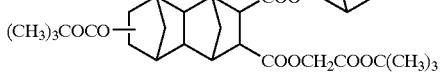 (7-138)
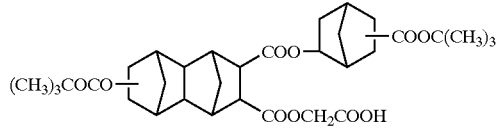 (7-139)
(7-140)
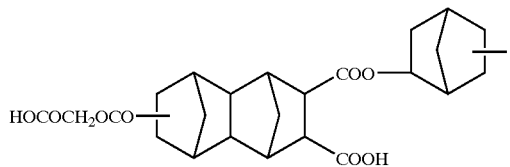 (7-141)
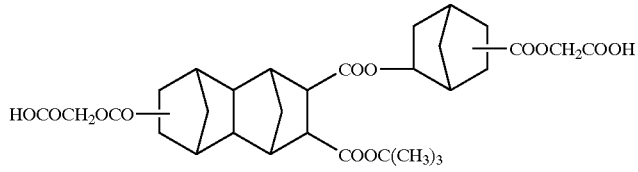 (7-142)
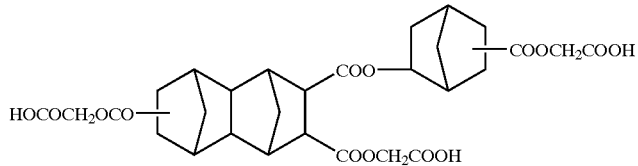 (7-143)
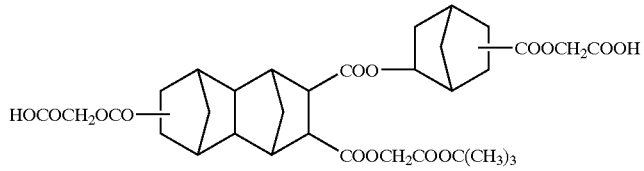 (7-144)
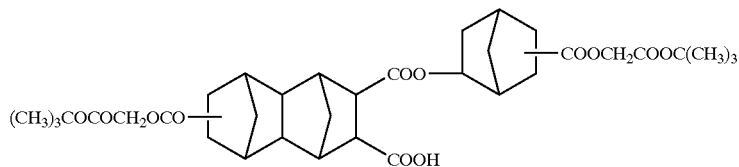 (7-145)
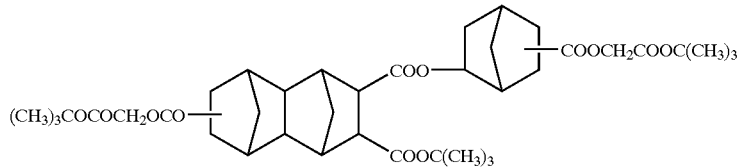 (7-146)
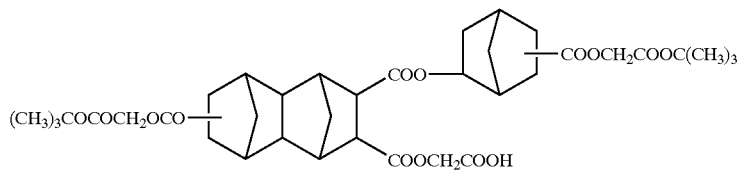 (7-147)

-continued
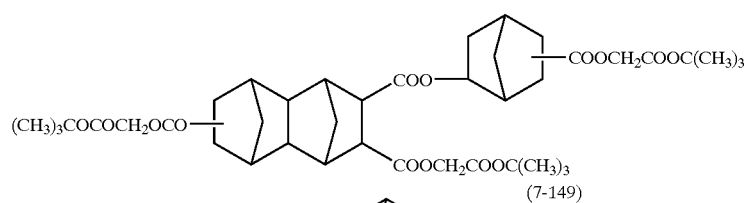 (7-148)
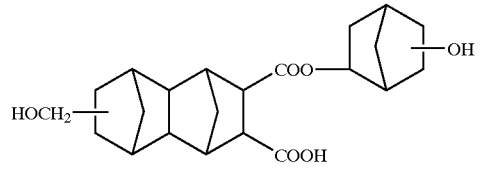 (7-149) (7-150)
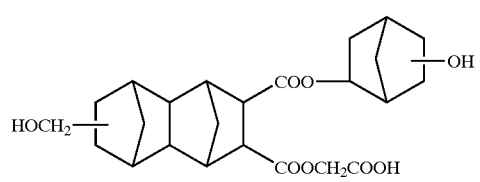 (7-151) (7-152)
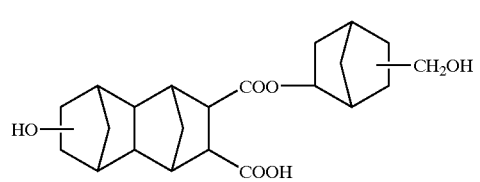 (7-153) (7-154)
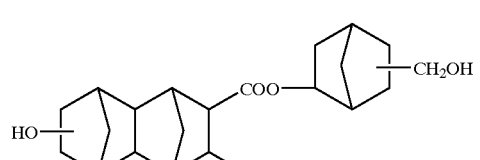 (7-155) (7-156)
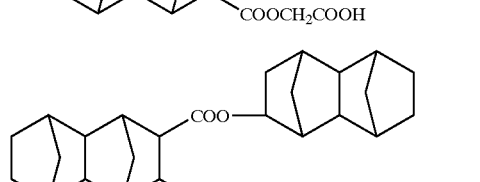 (7-157) (7-158)
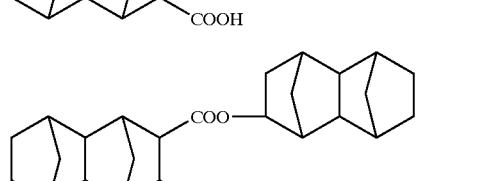 (7-159) (7-160)
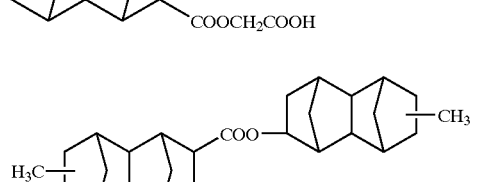 (7-161) (7-162)
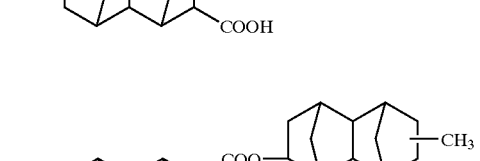 (7-163) (7-164)

-continued
(7-165) 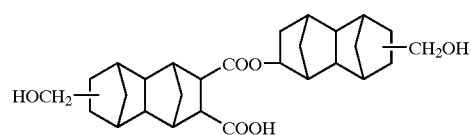
(7-166) 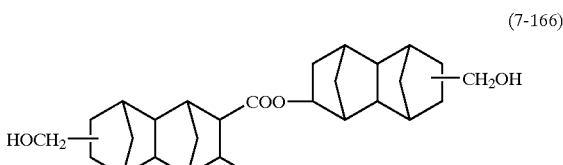
(7-167) 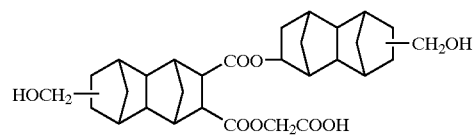
(7-168) 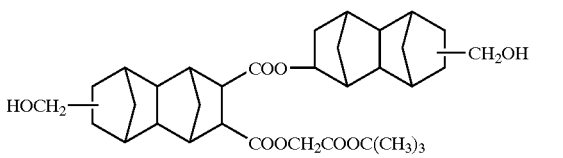
(7-169) 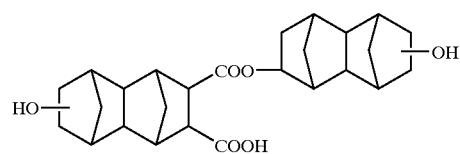
(7-170) 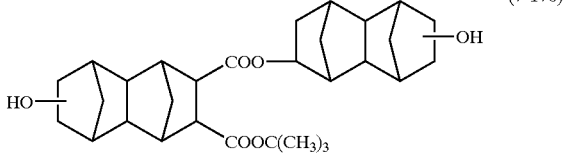
(7-171) 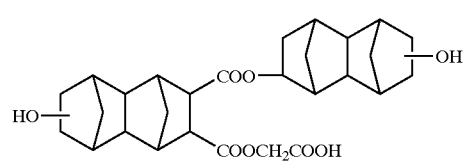
(7-172) 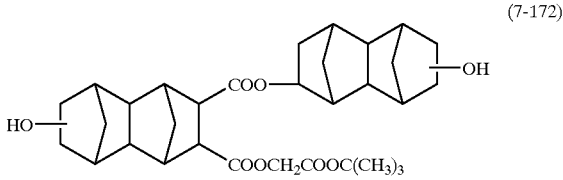
(7-173) 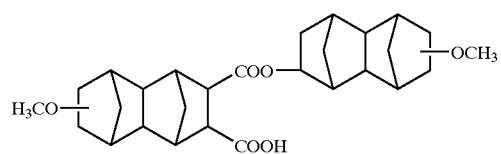
(7-174) 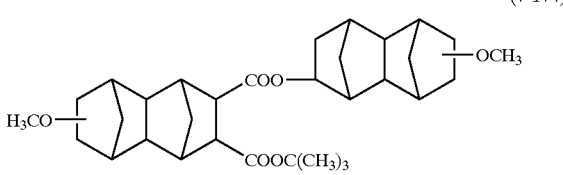
(7-175) 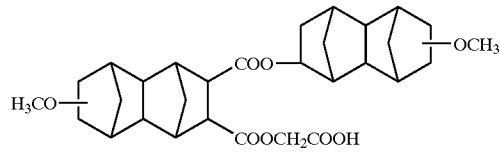
(7-176) 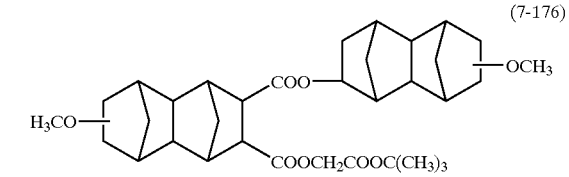
(7-177) 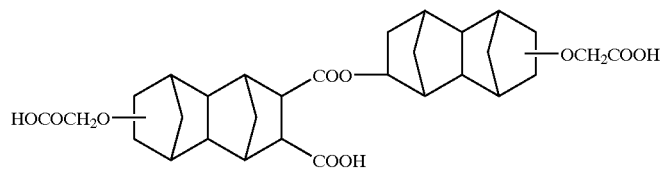
(7-178) 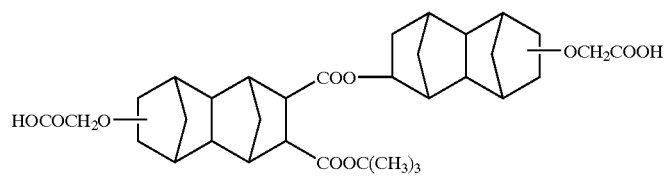
(7-179) 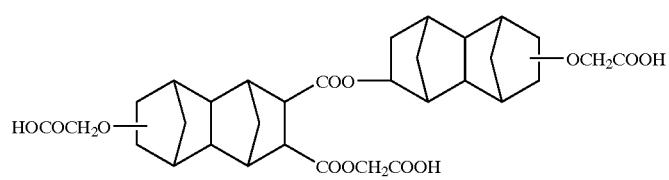

-continued
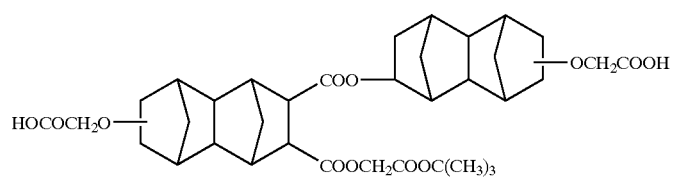 (7-180)
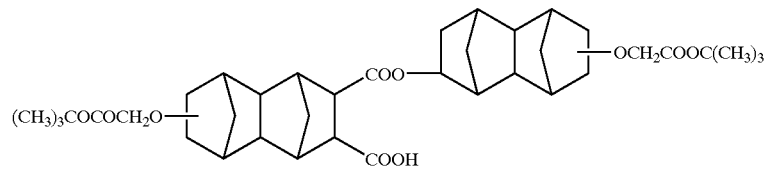 (7-181)
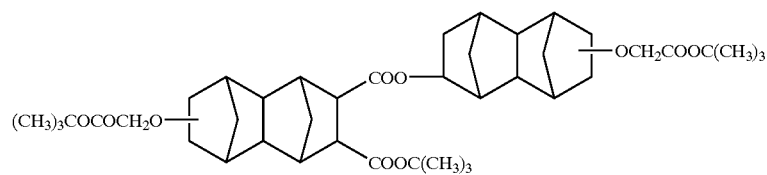 (7-182)
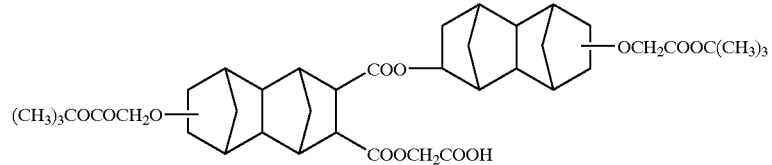 (7-183)
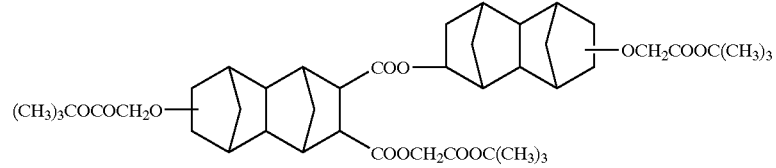 (7-184)
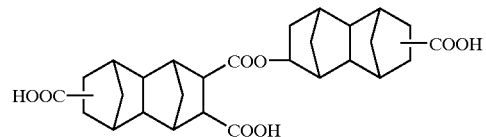 (7-185)
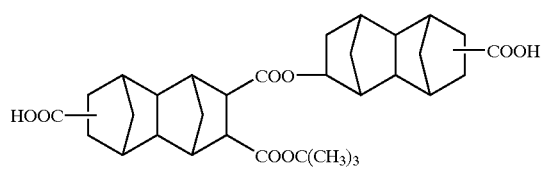 (7-186)
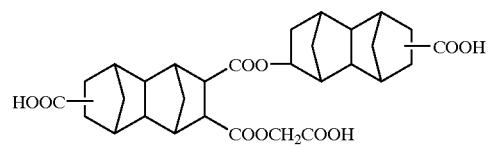 (7-187)
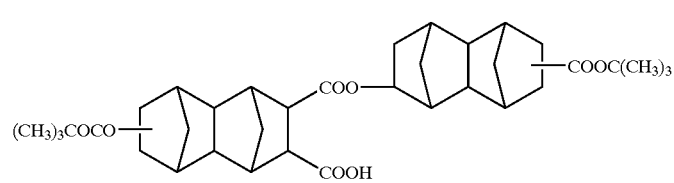 (7-188)
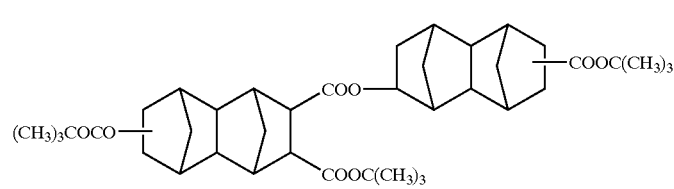 (7-189)

-continued
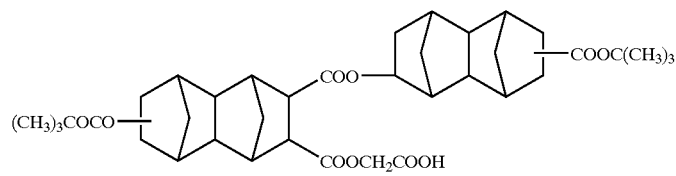
(7-191)
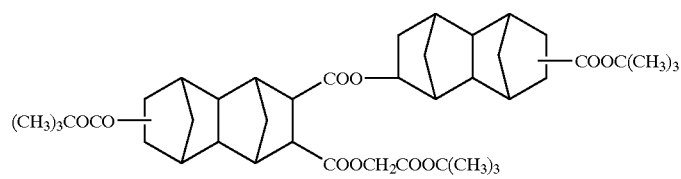
(7-192)
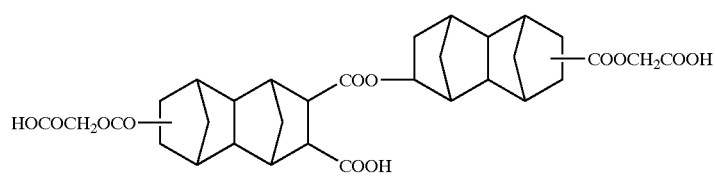
(7-193)
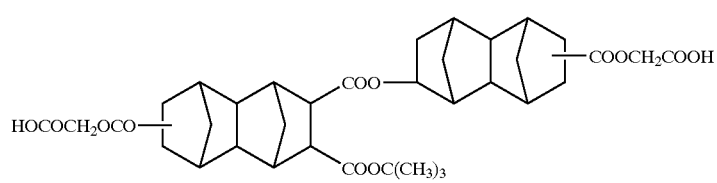
(7-194)
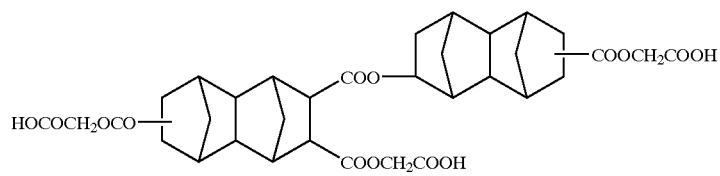
(7-195)
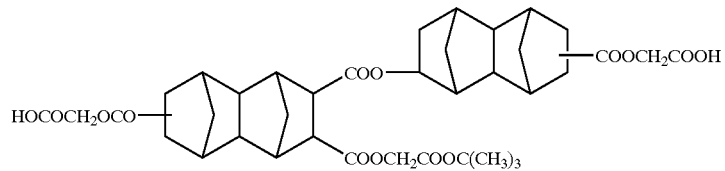
(7-196)
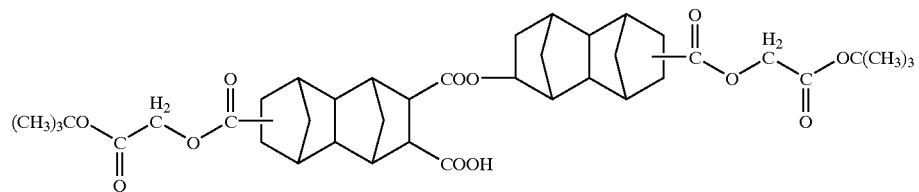
(7-197)
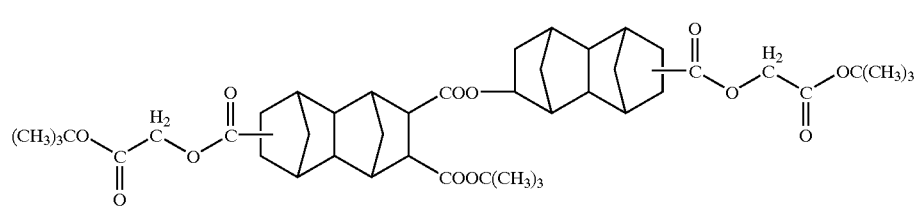
(7-198)

-continued

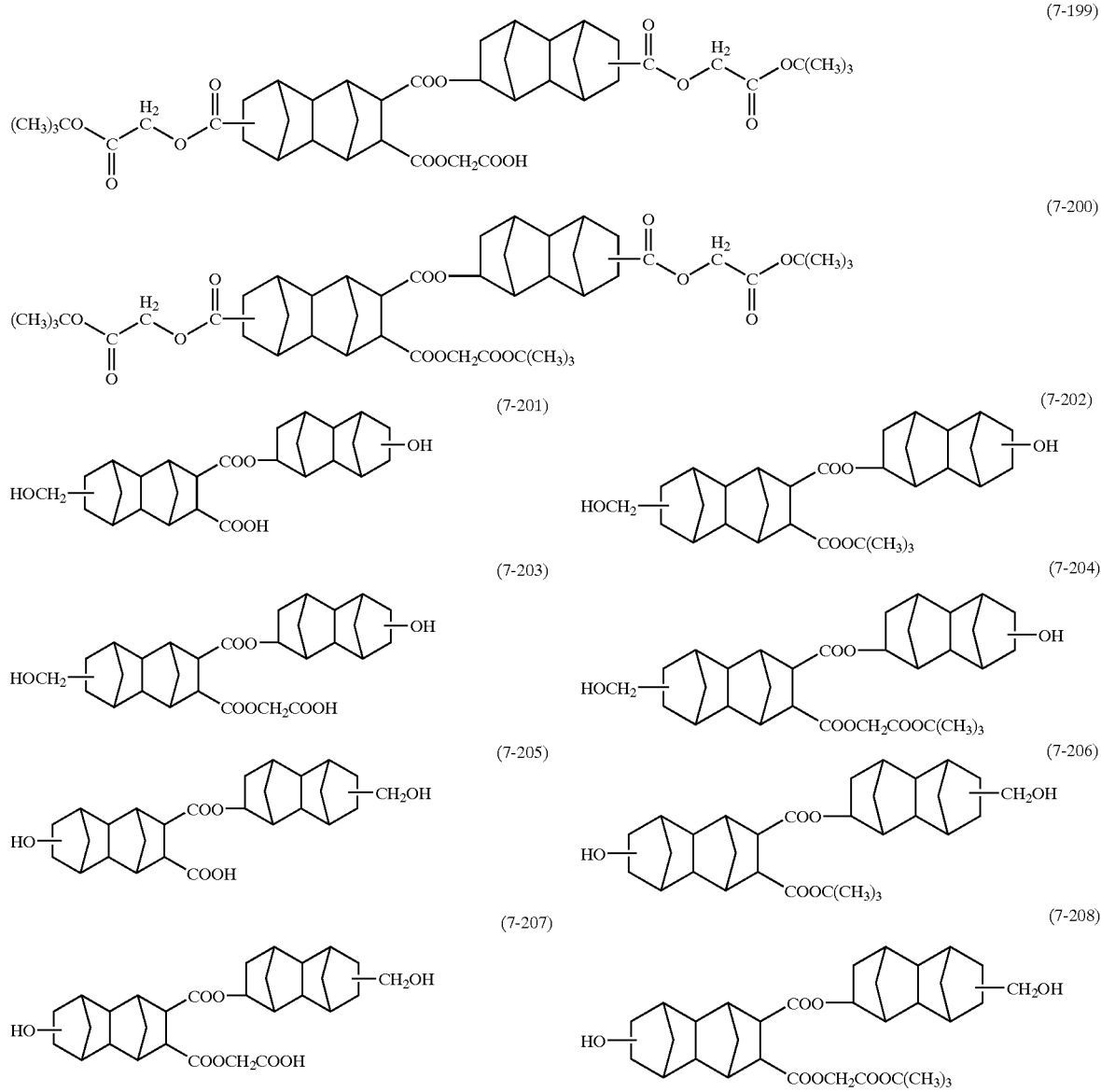

Of these polycyclic compounds (C7), the compounds shown by the formulas (7-9), (7-10), (7-12), (7-13), (7-14), (7-16), (7-25), (7-26), (7-28), (7-33), (7-34), (7-36), (7-41), (7-42), (7-44), (7-45), (7-46), (7-48), (7-49), (7-50), (7-52), (7-61), (7-62), (7-64), (7-65), (7-66), (7-68), (7-77), (7-78), (7-80), (7-85), (7-86), (7-88), (7-93), (7-94), (7-96), (7-97), (7-98), (7-100), (7-101), (7-102), (7-104), (7-113), (7-114), (7-116), (7-117), (7-118), (7-120), (7-129), (7-130), (7-132), (7-137), (7-138), (7-140), (7-145), (7-146), (7-148), (7-149), (7-150), (7-152), (7-153), (7-154), (7-156), (7-165), (7-166), (7-168), (7-169), (7-170), (7-172), (7-181), (7-182), (7-184), (7-189), (7-190), (7-192), (7-197), (7-198), (7-200), (7-201), (7-202), (7-204), (7-205), (7-206), and (7-208) are preferable. The compounds shown by the formulas (7-34), (7-104), (7-132), and (7-169) are particularly preferable.

The polycyclic compound (C7) is synthesized as follows. For example, the compound shown by the formula (7-103) is synthesized by subjecting dicyclopentadiene and allyl acetate to the Diels-Alder reaction, subjecting the resulting reaction product to an addition reaction with formic acid, reacting the resulting reaction product with hymic acid in tetrahydrofuran in the presence of triethylamine and 4-dimethylaminopyridine, subjecting the resulting reaction product to an addition reaction with formic acid, and subjecting the resulting reaction product to hydrolysis using a potassium hydroxide aqueous solution.

As examples of the linear or branched alkyl group having 1–4 carbon atoms represented by $R^{17}$, $R^{18}$, $R^{19}$, and $R^{20}$ in the polycyclic compound (C8), a methyl group, ethyl group, n-propyl group, i-propyl group, n-butyl group, 2-methylpropyl group, 1-methylpropyl group, t-butyl group, and the like can be given.

As examples of the linear or branched alkoxyl group having 1–4 carbon atoms represented by $R^{17}$, $R^{18}$, $R^{19}$, and $R^{20}$, a methoxy group, ethoxy group, n-propoxy group, i-propoxygroup, n-butoxy group, 2-methylpropoxy group, 1-methylpropoxy group, t-butoxygroup, and the like can be given.

As $R^{17}$, $R^{18}$, $R^{19}$, and $R^{20}$ in the polycyclic compound (C8), a hydrogen atom, a hydroxyl group, methyl group, ethyl group, methoxy group, ethoxy group, and the like are preferable.

As specific examples of the polycyclic compound (C8), tetrahydroabietic acid or alkyl esters of tetrahydroabietic acid such as tetrahydroabietic acid, methyl tetrahydroabietate, ethyl tetrahydroabietate, n-propyl tetrahydroabietate, i-propyl tetrahydroabietate, n-butyl tetrahydroabietate, 2-methylpropyl tetrahydroabietate, 1-methylpropyl tetrahydroabietate, t-butyl tetrahydroabietate, cyclopentyl tetrahydroabietate, and cyclohexyl tetrahydroabietate; alkoxycarbonylmethyl esters of tetrahydroabietic acid such as methoxycarbonylmethyl tetrahydroabietate, ethoxycarbonylmethyl tetrahydroabietate, n-propoxycarbonylmethyl tetrahydroabietate, i-propoxycarbonylmethyl tetrahydroabietate, n-butoxycarbonylmethyl tetrahydroabietate, 2-methylpropoxycarbonylmethyl tetrahydroabietate, 1-methylpropoxycarbonylmethyl tetrahydroabietate, t-butoxycarbonylmethyl tetrahydroabietate, cyclopentyloxycarbonylmethyl tetrahydroabietate, cyclohexyloxycarbonylmethyl tetrahydroabietate; compounds shown by the following formulas (8-1) to (8-30); and the like can be given.

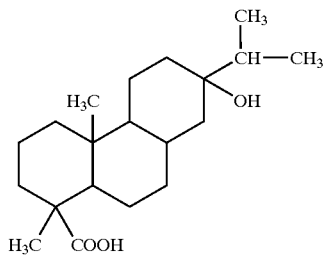
(8-1)

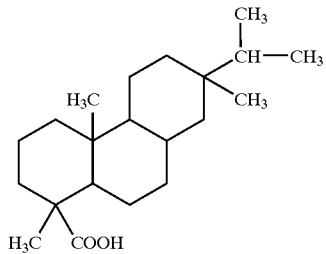
(8-2)

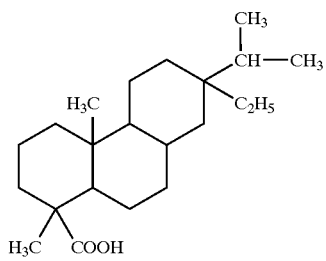
(8-3)

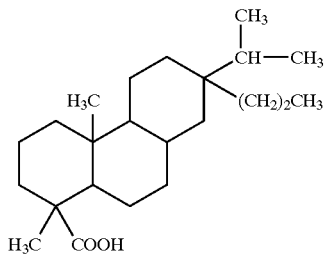
(8-4)

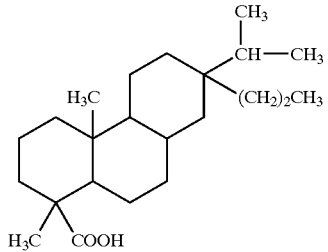
(8-5)

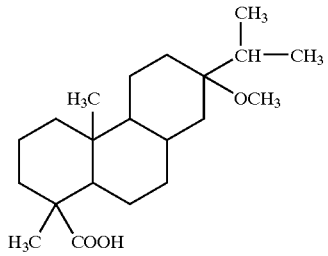
(8-6)

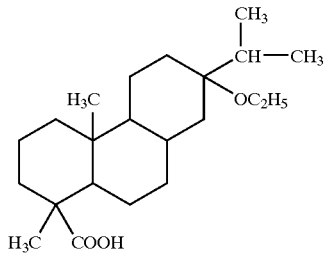
(8-7)

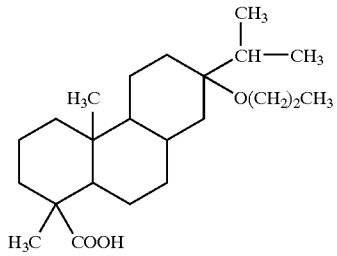
(8-8)

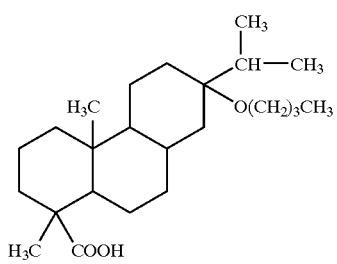
(8-9)

-continued
(8-10)
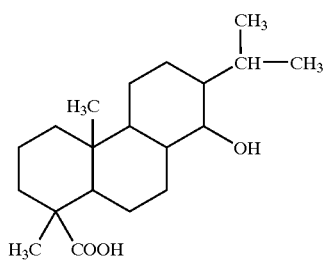
(8-11)
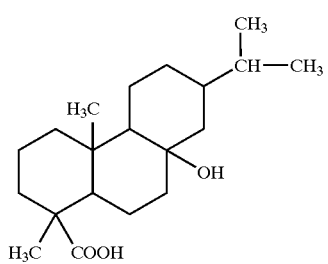
(8-12)
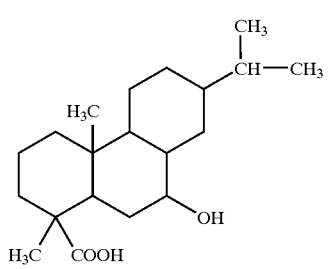
(8-13)
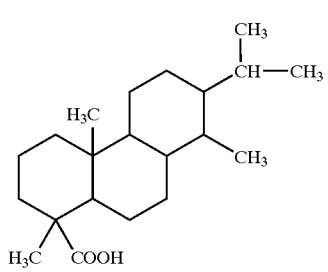
(8-14)
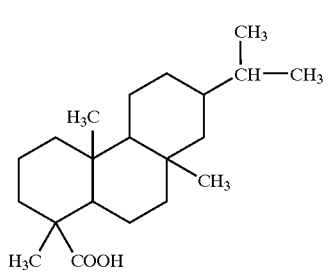
(8-15)
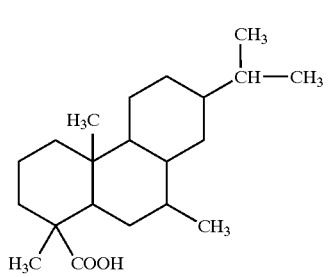
-continued
(8-16)
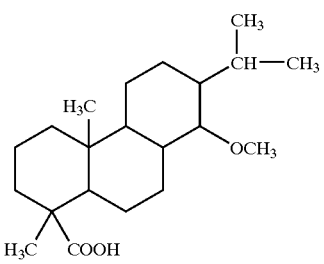
(8-17)
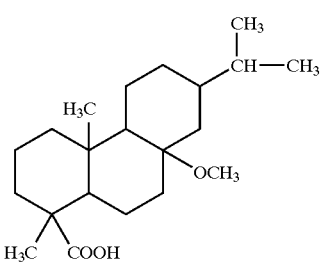
(8-18)
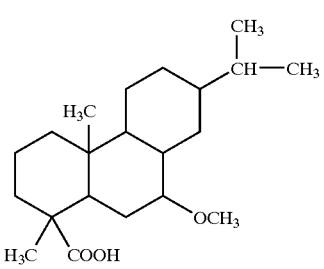
(8-19)
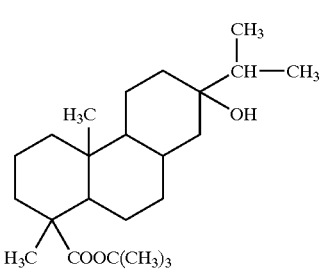
(8-20)
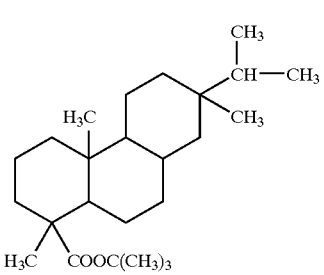
(8-21)
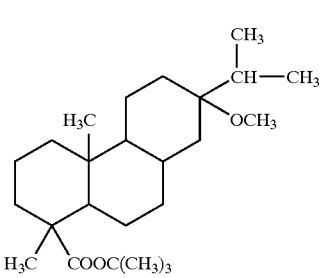

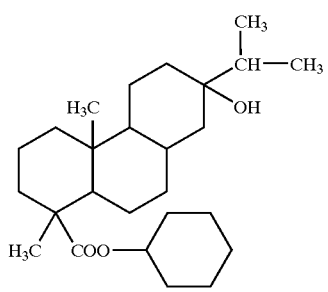 (8-22)

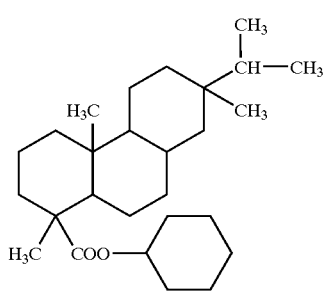 (8-23)

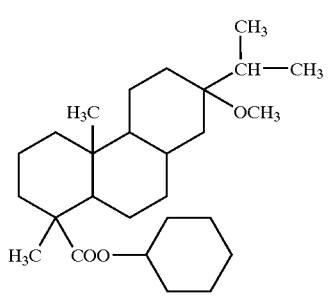 (8-24)

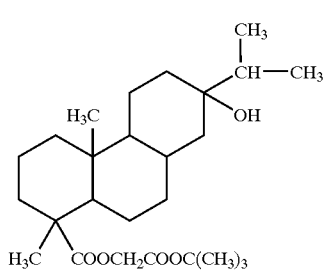 (8-25)

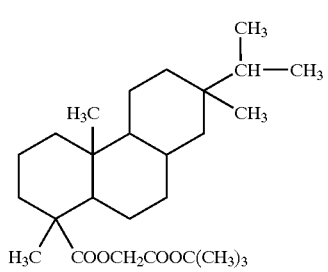 (8-26)

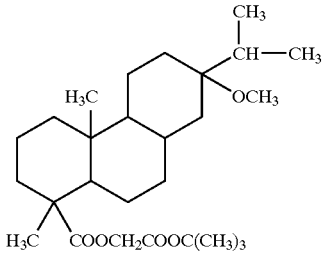 (8-27)

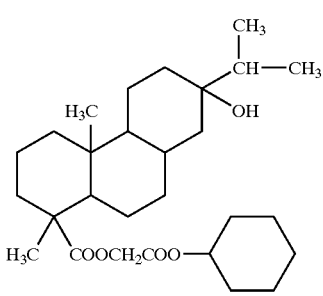 (8-28)

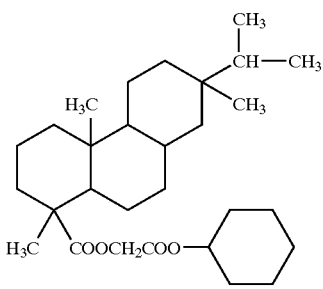 (8-29)

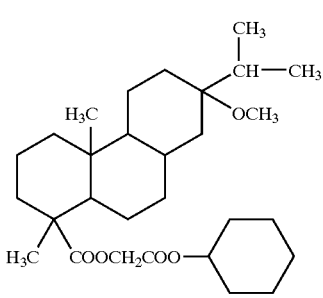 (8-30)

Of these polycyclic compounds (C8), t-butyl tetrahydroabietate, t-butoxycarbonylmethyl tetrahydroabietate, and the like are preferable.

The polycyclic compound (C8) is synthesized as follows. For example, t-butyl tetrahydroabietate is synthesized by reacting tetrahydroabietic acid with potassium t-butoxide at a high temperature in the presence of a catalyst such as thionyl chloride. t-Butoxycarbonylmethyl tetrahydroabietate is synthesized by reacting tetrahydroabietic acid with t-butyl bromoacetate in the presence of a catalyst such as potassium carbonate.

As specific examples of the polycyclic compound (C9), lithocholic acid and derivatives of lithocholic acid such as lithocholic acid, methyl lithocholate, ethyl lithocholate, n-propyl lithocholate, i-propyl lithocholate, n-butyl lithocholate, 2-methylpropyl lithocholate, 1-methylpropyl lithocholate, t-butyl lithocholate, cyclopentyl lithocholate, cyclohexyl lithocholate, γ-butyrolactone lithocholate, mevaloniclactone lithocholate, methoxycarbonylmethyl lithocholate, ethoxycarbonylmethyl lithocholate, n-propoxycarbonylmethyl lithocholate, i-propoxycarbonylmethyl lithocholate, n-butoxycarbonylmethyl lithocholate, 2-methylpropoxycarbonylmethyl lithocholate, 1-methylpropoxycarbonylmethyl lithocholate, t-butoxycarbonylmethyl lithocholate, cyclopentyloxycarbonylmethyl lithocholate, and cyclohexyloxycarbonylmethyl lithocholate; deoxycholic acid and derivatives of deoxycholic acid such as deoxycholic acid, methyl deoxycholate, ethyl deoxycholate, n-propyl deoxycholate, i-propyl deoxycholate, n-butyl deoxycholate, 2-methylpropyl deoxycholate, 1-methylpropyl deoxycholate, t-butyl deoxycholate, cyclopentyl deoxycholate, cyclohexyl deoxycholate, γ-butyrolactone deoxycholate, mevaloniclactone deoxycholate, methoxycarbonylmethyl deoxycholate, ethoxycarbonylmethyl deoxycholate, n-propoxycarbonylmethyl deoxycholate, i-propoxycarbonylmethyl deoxycholate, n-butoxycarbonylmethyl deoxycholate, 2-methylpropoxycarbonylmethyl deoxycholate, 1-methylpropoxycarbonylmethyl deoxycholate, t-butoxycarbonylmethyl deoxycholate, cyclopentyloxycarbonylmethyl deoxycholate, and cyclohexyloxycarbonylmethyl deoxycholate; ursodeoxycholic acid and derivatives of ursodeoxycholic acid such as ursodeoxycholic acid, methyl ursodeoxycholate, ethyl ursodeoxycholate, n-propyl ursodeoxycholate, i-propyl ursodeoxycholate, n-butyl ursodeoxycholate, 2-methylpropyl ursodeoxycholate, 1-methylpropyl ursodeoxycholate, t-butyl ursodeoxycholate, cyclopentyl ursodeoxycholate, cyclohexyl ursodeoxycholate, γ-butyrolactone ursodeoxycholate, mevaloniclactone ursodeoxycholate, methoxycarbonylmethyl ursodeoxycholate, ethoxycarbonylmethyl ursodeoxycholate, n-propoxycarbonylmethyl ursodeoxycholate, i-propoxycarbonylmethyl ursodeoxycholate, n-butoxycarbonylmethyl ursodeoxycholate, 2-methylpropoxycarbonylmethyl ursodeoxycholate, 1-methylpropoxycarbonylmethyl ursodeoxycholate, t-butoxycarbonylmethyl ursodeoxycholate, cyclopentyloxycarbonylmethyl ursodeoxycholate, and cyclohexyloxycarbonylmethyl ursodeoxycholate; cholic acid and derivatives of cholic acid such as cholic acid, methyl cholate, ethyl cholate, n-propyl cholate, i-propyl cholate, n-butyl cholate, 2-methylpropyl cholate, 1-methylpropyl cholate, t-butyl cholate, cyclopentyl cholate, cyclohexyl cholate, γ-butyrolactone cholate, mevaloniclactone cholate, methoxycarbonylmethyl cholate, ethoxycarbonylmethyl cholate, n-propoxycarbonylmethyl cholate, i-propoxycarbonylmethyl cholate, n-butoxycarbonylmethyl cholate, 2-methylpropoxycarbonylmethyl cholate, 1-methylpropoxycarbonylmethyl cholate, t-butoxycarbonylmethyl cholate, cyclopentyloxycarbonylmethyl cholate, and cyclohexyloxycarbonylmethyl cholate; and the like can be given.

Of these polycyclic compounds (C9), t-butyl lithocholate, γ-butyrolactone lithocholate, t-butoxycarbonylmethyl lithocholate, t-butyl deoxycholate, γ-butyrolactone deoxycholate, t-butoxycarbonylmethyl deoxycholate, t-butyl ursodeoxycholate, γ-butyrolactone ursodeoxycholate, t-butoxycarbonylmethyl ursodeoxycholate, t-butyl cholate, γ-butyrolactone cholate, and t-butoxycarbonylmethyl cholate are preferable.

The polycyclic compound (C9) is synthesized by reacting corresponding steroid carboxylic acid with t-butyl bromoacetate or the like in the presence of potassium carbonate, for example.

As the polycyclic compound (C) in the present invention, the polycyclic compound (C5), polycyclic compound (C8), polycyclic compound (C9), and the like are preferable. The polycyclic compound (C9) is particularly preferable.

In the present invention, the polycyclic compound (C) may be used either individually or in combination of two or more.

The amount of the polycyclic compound (C) to be used is usually 1–20 parts by weight, preferably 1–15 parts by weight, and still more preferably 1–10 parts by weight for 100 parts by weight of the resin (A). If the amount of the polycyclic compound (C) is less than one part by weight, the effect of decreasing the change in line width of the line pattern depending on the density of the line and space pattern may be insufficient. If the amount exceeds 20 parts by weight, heat resistance or adhesion to a substrate may be decreased.

An acid diffusion controller is preferably added to the radiation-sensitive resin composition of the present invention. The acid diffusion controller controls diffusion of an acid generated from the acid generator (B) upon exposure in the resist film and prevents unfavorable chemical reactions in the unexposed region.

The addition of the acid diffusion controller improves storage stability of the resulting radiation-sensitive resin composition and resolution of the resulting resist. Moreover, the acid diffusion controller prevents a change in the line width of the resist pattern due to a change in post-exposure delay (PED) from exposure to heat treatment. Therefore, a composition excelling greatly in process stability can be obtained.

As the acid diffusion controller, nitrogen-containing organic compounds of which the basicity does not change due to exposure or heat treatment during formation of a resist pattern are preferable.

As examples of the nitrogen-containing organic compounds, compounds shown by the following formula (10) (hereinafter referred to as "nitrogen-containing compound (a)"),

(10)

wherein $R^{24}$, $R^{25}$, and $R^{26}$ individually represent a hydrogen atom, a substituted or unsubstituted linear, branched, or cyclic alkyl group, substituted or unsubstituted aryl group, or substituted or unsubstituted aralkyl group, compounds having two nitrogen atoms in the molecule (hereinafter referred to as "nitrogen-containing compound (b)"), polyamino compounds or polymers having three or more nitrogen atoms in the molecule (hereinafter referred to as "nitrogen-containing compound (c)"), amide group-containing compounds, urea compounds, nitrogen-containing heterocyclic compounds, and the like can be given.

As examples of the nitrogen-containing compound (a), monoalkylamines such as n-hexylamine, n-heptylamine, n-octylamine, n-nonylamine, n-decylamine, and cyclohexylamine; dialkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; trialkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; bis(dialkylaminoalkyl)ethers such as bis(2-dimethylaminoethyl) ether and bis(2-diethylaminoethyl)ether; and aromatic amines such as aniline, N-methylaniline, N,N-dimethylaniline, 2-methylaniline, 3-methylaniline, 4-methylaniline, 2,6-di-t-butylaniline, 2,6-di-t-butyl-N-methylaniline, 2,6-di-t-butyl-N,N-dimethylaniline, 4-nitroaniline, diphenylamine, triphenylamine, and naphthylamine can be given.

As examples of the nitrogen-containing compound (b), ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, and the like can be given.

As examples of the nitrogen-containing compound (c), polyethyleneimine, polyallylamine, a polymer of 2-dimethylaminoethylacrylamide, and the like can be given.

As examples of the amide group-containing compound, N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-N-methyl-1-adamantylamine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole; formamide, N-methylformamide, N,N-dimethylformamide, acetamide, N-methylacetamide, N,N-dimethylacetamide, propionamide, benzamide, pyrrolidone, N-methylpyrrolidone; and the like can be given.

As examples of the urea compound, urea, methylurea, 1,1-dimethylurea, 1,3-dimethylurea, 1,1, 3,3-tetramethylurea, 1,3-diphenylurea, tri-n-butylthiourea, and the like can be given. As examples of the nitrogen-containing heterocyclic compound, imidazoles such as imidazole, benzimidazole, 4-methylimidazole, 4-methyl-2-phenylimidazole, and N-t-butoxycarbonyl-2-phenylbenzimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, acridine, and 2,2':6',2''-terpyridine; piperazines such as piperazine and 1-(2-hydroxyethyl)piperazine; pyrazine, pyrazole, pyridazine, quinoxaline, purine, pyrrolidine, piperidine, 3-piperidino-1,2-propanediol, morpholine, 4-methylmorpholine, 1,4-dimethylpiperazine, and 1,4-diazabicyclo[2.2.2]octane; and the like can be given.

Of these nitrogen-containing organic compounds, the nitrogen-containing compounds (a), amide group-containing compound, and nitrogen-containing heterocyclic compound are preferable. The N-t-butoxycarbonyl group-containing amino compound is particularly preferable.

The acid diffusion controller may be used either individually or in combination of two or more.

The amount of acid-diffusion controller to be added is usually 15 parts by weight or less, preferably 10 parts by weight or less, and still more preferably 5 parts by weight or less for 100 parts by weight of the resin (A). If the amount of the acid diffusion controller exceeds 15 parts by weight, sensitivity of the resulting resist or developability of the exposed region may be decreased. If the amount of the acid diffusion controller is less than 0.001 part by weight, the pattern shape or dimensional accuracy of the resulting resist may be decreased depending on the process conditions.

A surfactant which improves applicability, developability, and the like may be added to the radiation-sensitive resin composition of the present invention.

As examples of surfactants, nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate; commercially available products such as KP341 (manufactured by Shin-Etsu Chemical Co., Ltd.), Polyflow No. 75, No. 95 (manufactured by Kyoeisha Chemical Co., Ltd.), FTOP EF301, EF303, EF352 (manufactured by Tohkem Products Corp.), MEGAFAC F171, F173 (manufactured by Dainippon Ink and Chemicals, Inc.), Fluorad FC430, FC431 (manufactured by Sumitomo 3M, Ltd.), Asahi Guard AG710, Surflon S-382, SC-101, SC-102, SC-103, SC-104, SC-105, SC-106 (manufactured by Asahi Glass Co., Ltd.); and the like can be given.

The surfactant may be used either individually or in combination of two or more.

The amount of surfactant to be added is usually 2 parts by weight or less for 100 parts by weight of the resin (A) and the acid generator (B) in total.

As examples of other additives, halation inhibitors, adhesion promoters, storage stabilizers, anti-foaming agents, and the like can be given.

Preparation of Composition Solution

The radiation-sensitive resin composition of the present invention is made into a composition solution by dissolving the composition in a solvent so that the total solid content is usually 5–50 wt %, and preferably 5–25 wt %, and filtering the solution using a filter with a pore diameter of about 0.2 μm, for example.

As examples of solvents used for preparation of the composition solution, linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, and 2-octanone; cyclic ketones such as cyclopentanone, 3-methylcyclopentanone, cyclohexanone, 2-methylcyclohexanone, 2,6-dimethylcyclohexanone, and isophorone; propylene glycol monoalkyl ether acetates such as propylene glycol monomethyl ether acetate, propylene glycol monoethyl ether acetate, propylene glycol mono-n-propyl ether acetate, propylene glycol mono-1-propyl ether acetate, propylene glycol mono-n-butyl ether acetate, propylene glycol mono-1-butyl ether acetate, propylene glycol mono-sec-butyl ether acetate, and propylene glycol mono-t-butyl ether acetate; alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate; as well as other solvents such as n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, 2-hydroxy-2-methylethyl propionate, ethyl ethoxyacetate, ethyl hydroxyacetate, methyl 2-hydroxy-3-methylbutyrate, 3-methoxybutylacetate, 3-methyl-3-methoxybutylacetate, 3-methyl-3-methoxybutylpropionate, 3-methyl-3-methoxybutylbutyrate, ethyl acetate, n-propyl acetate, n-butyl acetate, methyl acetoacetate, ethyl acetoacetate, methylpyruvate, ethyl pyruvate, N-methyl pyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, and propylene carbonate; and the like can be given.

The solvent may be used either individually or in combination of two or more. Use of a linear or branched ketone, cyclic ketone, propylene glycol monoalkyl ether acetate, alkyl 2-hydroxypropionate, alkyl 3-alkoxypropionate, γ-butyrolactone, or the like is preferable.

Formation of Resist Pattern

The radiation-sensitive resin composition of the present invention is particularly useful as a chemically-amplified resist.

In the chemically-amplified resist, an acid-dissociable group in the resin (A) or the polycyclic compound (C) dissociates by the action of an acid generated from the acid generator (B) upon exposure to form a carboxyl group. As a result, solubility of the exposed part of the resist in an alkaline developer is increased. Therefore, the exposed part is dissolved in an alkaline developer and removed to obtain a positive-tone resist pattern.

In the case of forming a resist pattern using the radiation-sensitive resin composition of the present invention, the composition solution is applied to a substrate such as a silicon wafer or a wafer coated with aluminum, for example, using an appropriate application method such as spin coating, cast coating, and roll coating to form a resist film. The resist film is optionally pre-baked (hereinafter referred to as "PB") and exposed to form a specific resist pattern. Radiation used for exposure is appropriately selected from visible rays, ultraviolet rays, deep ultraviolet rays, X-rays, electron beams, and the like depending on the type of acid generator (B). It is particularly preferable to use deep ultraviolet rays such as an ArF excimer laser (wavelength: 193 nm), KrF excimer laser (wavelength: 248 nm), and $F_2$ excimer laser (wavelength: 157 nm).

In the present invention, it is preferable to perform a post-exposure bake (hereinafter referred to as "PEB") after exposure. The PEB enables smooth dissociation of the acid-dissociable group. The heating temperature for the PEB is usually 30–200° C., and preferably 50–170° C., although the heating conditions are changed depending on the composition of the radiation-sensitive resin composition.

In order to bring out maximum potentiality of the radiation-sensitive resin composition of the present invention, an organic or inorganic anti-reflection film may be formed on a substrate as disclosed in Japanese Patent Publication No. 6-12452, for example. Moreover, a protection film may be formed on the resist film as disclosed in Japanese Patent Publication No. 5-188598 or the like in order to prevent the effects of basic impurities and the like in an environmental atmosphere. These techniques may be employed in combination.

The exposed resist film is then developed using an alkaline developer to form a predetermined resist pattern.

As examples of an alkali developer used for development, it is preferable to use an alkaline aqueous solution prepared by dissolving at least one alkaline compound such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, and 1,5-diazabicyclo-[4.3.0]-5-nonene.

The concentration of the alkaline aqueous solution is usually 10 wt % or less. If the concentration of the alkaline aqueous solution exceeds 10 wt %, an unexposed part may be dissolved in the developer.

Organic solvents may be added to the alkaline aqueous solution. As examples of organic solvents, ketones such as acetone, methyl ethyl ketone, methyl i-butyl ketone, cyclopentanone, cyclohexanone, 3-methylcyclopentanone, and 2,6-dimethylcyclohexanone; alcohols such as methylalcohol, ethylalcohol, n-propylalcohol, i-propylalcohol, n-butylalcohol, t-butylalcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide; and the like can be given.

These organic solvents may be used either individually or in combination of two or more.

The amount of the organic solvent to be used is preferably 100 vol % or less of the alkaline aqueous solution. If the amount of the organic solvent exceeds 100 vol %, the exposed part may remain undeveloped due to a decrease in developability.

An appropriate amount of surfactant or the like may be added to the alkaline aqueous solution.

The resist film is generally washed with water after development using the alkaline aqueous solution.

EXAMPLES

The present invention is described below in more detail by examples. However, these examples should not be construed as limiting the present invention. In the examples, "part" refers to "part by weight" unless otherwise indicated.

Measurement and evaluation in the examples and comparative examples were carried out according to the following procedures.

Mw:

The Mw was measured by gel permeation chromatography (GPC) using GPC columns (manufactured by Tosoh Corp., G2000H$^{XL}$×2, G3000H$^{XL}$×1, G4000H$^{XL}$×1) under the following conditions. Flow rate: 1.0 ml/min., eluate: tetrahydrofuran, column temperature: 40° C., standard reference material: monodispersed polystyrene Radiation Transmittance:

A composition solution was applied to a quartz plate by spin coating and post-baked on a hot plate at 90° C. for 60 seconds to obtain a resist film with a thickness of 0.34 μm. The radiation transmittance of the resist film was calculated from the absorbance at a wavelength of 193 nm and was employed as a standard for transparency in the deep UV ray region.

Sensitivity:

A composition solution was applied to a silicon wafer on which an ARC25 film with a thickness of 820 angstroms (manufactured by Brewer Science Inc.) was formed, or a silicon wafer (SiON) on which a silicon oxynitride film which was prepared to exhibit an anti-reflection effect at a wavelength of 193 nm was formed by spin coating. The composition solution was post-baked on a hot plate under conditions shown in Table 2 to obtain a resist film with a thickness of 0.34 μm. The resist film was exposed through a mask pattern using an ArF excimer laser exposure apparatus (manufactured by Nikon Corp., lens numerical aperture: 0.55, wavelength: 193 nm). After performing PEB under the conditions shown in Table 2, the resist film was developed at 25° C. for 60 seconds in a 2.38 wt % tetramethylammonium hydroxide aqueous solution, washed with water, and dried to form a positive-tone resist pattern. An optimum dose (1L1S) at which a 1:1 line and space pattern (1L1S) with a line width of 160 nm was formed was taken as sensitivity. Line width difference depending on density:

The resist pattern was exposed at an optimum dose (1L10S) at which a 1:10 line and space pattern (1L10S) with a line width of 160 nm was formed. A line width CD1 of the line pattern of a line and space pattern (1L10S) with a line width of 160 nm, and a line width CD2 of a line pattern of a line and space pattern (1L1.5S) with a line width of 160 nm were measured using a scanning electron microscope. The difference between CD1 and CD2 (CD1-CD2) was evaluated as the line width difference depending on density according to the following standard.

Good: CD1-CD2<20 nm

Bad: CD1-CD2=>20 nm

Resolution:

Minimum dimensions of the resist pattern, resolved at the optimum dose (1L1S) was taken as resolution.

Synthesis Example 1

22.50 g of norbornane lactone methacrylate (methacrylate corresponding to the recurring unit (I-1) in which X is a methylene group, R is a methyl group, and $R^2$ is a hydrogen atom), 26.36 g of 2-methyl-2-adamantyl methacrylate, and 1.15 g of methacrylic acid were dissolved in 150 g tetrahydrofuran in a nitrogen atmosphere. After the addition of 4.14 g of dimethyl 2,2'-azobis (isobutylate) and 1.36 g of n-dodecylmercaptan, the mixture was polymerized at 70° C. for four hours. After cooling, the reaction solution was poured into 1.5 l of methanol to coagulate the resin. The coagulated resin was collected by filtration, washed, and dried for 24 hours under vacuum to obtain 45 g of a white powder resin (yield: 90 wt %).

The Mw of the resin was 12,000. As a result of composition analysis by $^{13}$C-NMR, the copolymerization molar ratio of norbornane lactone methacrylate/2-methyl-2-adamantyl methacrylate/methacrylic acid was 45.3/50.2/4.5.

The resin is referred to as "resin (A-1)".

Synthesis Example 2

11.98 g of norbornane lactone methacrylate, 22.75 g of 2-methyl-2-adamantyl methacrylate, and 15.29 g of 3-hydroxy-1-adamantyl methacrylate were dissolved in 150 g of tetrahydrofuran in a nitrogen atmosphere. After the addition of 3.97 g of dimethyl 2,2'-azobis(isobutylate) and 1.30 g of n-dodecylmercaptan, the mixture was polymerized at 70° C. for four hours. After cooling, the reaction solution was poured into 1.5 l of methanol to coagulate the resin. The coagulated resin was collected by filtration, washed, and dried for 24 hours under vacuum to obtain 42 g of a white powder resin (yield: 84 wt %).

The Mw of the resin was 13,000. As a result of composition analysis by $^{13}$C-NMR, the copolymerization molar ratio of norbornane lactone methacrylate/2-methyl-2-adamantyl methacrylate/3-hydroxy-1-adamantyl methacrylate was 25.3/44.5/30.2.

The resin is referred to as "resin (A-2)".

Synthesis Example 3

21.81 g of cyclohexyl lactone methacrylate (methacrylate corresponding to the recurring unit (I-2) in which $R^3$ is a methyl group and $R^4$ is a hydrogen atom), 27.01 g of 2-methyl-2-adamantyl methacrylate, and 1.18 g of methacrylic acid were dissolved in 150 g tetrahydrofuran in a nitrogen atmosphere. After the addition of 4.24 g of dimethyl 2,2'-azobis(isobutylate) and 1.39 g of n-dodecylmercaptan, the mixture was polymerized at 70° C. for four hours. After cooling, the reaction solution was poured into 1.5 l of methanol to coagulate the resin. The coagulated resin was collected by filtration, washed, and dried for 24 hours under vacuum to obtain 44 g of a white powder resin (yield: 88 wt %).

The Mw of the resin was 12,300. As a result of composition analysis by $^{13}$C-NMR, the copolymerization molar ratio of norbornane lactone methacrylate/2-methyl-2-adamantyl methacrylate/methacrylic acid was 45.2/49.8/5.0.

The resin is referred to as "resin (A-3)".

Synthesis Example 4

21.81 g of norbornane lactone methacrylate, 27.08 g of 2-methyl-2-adamantyl methacrylate, and 1.11 g of methacrylic acid were dissolved in 150 g of tetrahydrofuran in a nitrogen atmosphere. After the addition of 4.01 g of dimethyl 2,2-azobis(isobutylate) and 1.31 g of n-dodecyimercaptan, the mixture was polymerized at 70° C. for four hours. After cooling, the reaction solution was poured into 1.5 l of methanol to coagulate the resin. The coagulated resin was collected by filtration, washed, and dried for 24 hours under vacuum to obtain 40 g of a white powder resin (yield: 80 wt %).

The Mw of the resin was 12,800. As a result of composition analysis by $^{13}$C-NMR, the copolymerization molar ratio of norbornane lactone methacrylate/2-methyl-2-adamantyl methacrylate/methacrylic acid was 44.3/50.2/5.5.

The resin is referred to as "resin (A-4)".

Synthesis Example 5

21.0 g of β-methacryloyloxy-γ-butyrolactone and 29.0 g of 2-methyl-2-adamantyl methacrylate were dissolved in 50 g of tetrahydrofuran to obtain a homogeneous solution. Nitrogen was bubbled through the solution for 30 minutes. After the addition of 2.4 g of azobisisobutyronitrile as a polymerization initiator, the mixture was stirred at 65° C. for six hours. The reaction solution was cooled to room temperature and diluted with 50 g of tetrahydrofuran. The solution was poured into 1,000 ml of n-hexane. A precipitated resin was collected by filtration, washed, and dried to obtain a white powder resin.

The Mw of the resin was 9, 700. The copolymerization molar ratio of β-methacryloyloxy-γ-butyrolactone/2-methyl-2-adamantyl methacrylate was 50/50.

The resin is referred to as "resin (A-5)".

Synthesis Example 6

21.29 g of norbornane lactone methacrylate (methacrylate corresponding to the recurring unit (I-1) in which X is a methylene group, $R^1$ is a methyl group, and $R^2$ is a hydrogen atom), 27.74 g of 2-methyl-2-adamantyl methacrylate, and 0.97 g of methacrylic acid were dissolved in 100 g 2-butanone. Then, 1.04 g of dimethyl 2,2'-azobis (isobutylate) was added to the mixture to prepare a monomer solution. A 500 mL three-neck flask in which 50 g of 2-butanon was placed was purged with nitrogen for 30 minutes. After purging with nitrogen, the flask was heated to 80° C. while stirring. The monomer solution was added dropwise to the flask using a dropping funnel for three hours. The monomers were polymerized for six hours beginning once dripping of the monomer solution commenced. After polymerization, the polymer solution was cooled with water to 30° C. or less and poured into 1000 g of methanol to coagulate the polymer solution. The resulting resin was filtered, washed, and dried for 24 hours using a vacuum drier to obtain 43 g of a white powder resin (yield: 86 wt %)

The Mw of the resin was 11,800. As a result of composition analysis by $^{13}$C-NMR, the copolymerization molar ratio of norbornane lactone methacrylate/2-methyl-2-adamantyl methacrylate/methacrylic acid was 47.1/47.9/5.0.

The resin is referred to as "resin (A-6)".

Synthesis Example 7

26.84 g of norbornane lactone methacrylate (methacrylate corresponding to the recurring unit (I-1) in which X is a methylene group, $R^1$ is a methyl group, and $R^2$ is a hydrogen atom) and 23.16 g of 2-methyl-2-adamantyl methacrylate were dissolved in 100 g 2-butanone. Then, 1.01 g of dimethyl 2,2'-azobis(isobutylate) was added to the mixture to prepare a monomer solution. A 500 mL three-neck flask in which 50 g of 2-butanon was placed was purged with nitrogen for 30 minutes. After purging with nitrogen, the flask was heated to 80° C. while stirring. The monomer solution was added dropwise to the flask using a dropping funnel for three hours. The monomers were polymerized for six hours beginning once dripping of the monomer solution commenced. After polymerization, the polymer solution was cooled with water to 30° C. or less and poured into 1000 g of methanol to coagulate the polymer solution. The resulting resin was filtered, washed, and dried for 24 hours using a vacuum drier to obtain 42 g of a white powder resin (yield: 84 wt %).

The Mw of the resin was 11, 900. As a result of composition analysis by $^{13}$C-NMR, the copolymerization molar ratio of norbornane lactone methacrylate/2-methyl-2-adamantyl methacrylate was 58.8/41.2.

The resin is referred to as "resin (A-7)".

Examples 1–8 and Comparative Examples 1–5

Composition solutions consisting of components shown in Table 1 were evaluated. The evaluation results are shown in Table 3.

Components other than the resins (A-1) to (A-7) shown in Table 1 are as follows.

Acid Generator (B)
B-1: 4-n-butoxy-1-naphthyltetrahydrothiophenium nonafluoro-n-butanesulfonate
B-2: 4-n-butoxy-1-naphthyltetrahydrothiophenium perfluoro-n-octanesulfonate
B-3: bis(4-t-butylphenyl)iodonium nonafluoro-n-butanesulfonate
B-4: nonafluoro-n-butanesulfonylbicyclo[2.2.1]hept-5-ene-2,3-dicarbodiimide Polycyclic Compound (C)
C-1: t-butyl deoxycholate
C-2: t-butoxycarbonylmethyl deoxycholate
C-3: t-butoxycarbonylmethyl lithocholate Acid Diffusion Controller
D-1: N-t-butoxycarbonyl-2-phenylbenzimidazole
D-2: N-t-butoxycarbonyldicyclohexylamine
D-3: 2,2':6',2''-terpyridine Solvent
E-1: propylene glycol monomethyl ether acetate
E-2: 2-heptanone
E-3: γ-butyrolactone
E-4: cyclohexanone

TABLE 1

|  | Resin (A) (part) | Acid generator (B) (part) | Polycyclic compound (C) (part) | Acid diffusion controller (part) | Solvent (part) |
|---|---|---|---|---|---|
| Example 1 | A-1 (95) | B-1 (4) | C-1 (5) | D-1 (0.3) | E-1 (790) E-3 (60) |
| Example 2 | A-1 (92) | B-2 (5) | C-2 (8) | D-2 (0.3) | E-1 (790) E-3 (60) |
| Example 3 | A-2 (96) | B-3 (2) B-4 (3) | C-2 (4) | D-3 (0.2) | E-2 (730) E-4 (100) |
| Example 4 | A-3 (95) | B-2 (5) | C-1 (5) | D-1 (0.3) | E-1 (790) E-3 (60) |

TABLE 1-continued

|  | Resin (A) (part) | Acid generator (B) (part) | Polycyclic compound (C) (part) | Acid diffusion controller (part) | Solvent (part) |
|---|---|---|---|---|---|
| Example 5 | A-4 (94) | B-1 (5) | C-3 (6) | D-2 (0.3) | E-1 (790) E-3 (60) |
| Example 6 | A-5 (90) | B-1 (2.5) | C-1 (10) | D-2 (0.2) | E-2 (430) E-4 (100) |
| Example 7 | A-6 (92) | B-2 (5) | C-2 (8) | D-1 (0.29) | E-1 (740) E-3 (40) |
| Example 8 | A-7 (92) | B-2 (5) | C-2 (8) | D-1 (0.23) | E-1 (740) E-3 (40) |
| Comparative Example 1 | A-1 (100) | B-1 (4) | — | D-1 (0.3) | E-1 (790) E-3 (60) |
| Comparative Example 2 | A-1 (100) | B-2 (5) | — | D-2 (0.3) | E-1 (790) E-3 (60) |
| Comparative Example 3 | A-2 (100) | B-3 (2) B-4 (3) | — | D-3 (0.2) | E-2 (730) E-4 (100) |
| Comparative Example 4 | A-3 (100) | B-2 (5) | — | D-1 (0.3) | E-1 (790) E-3 (60) |
| Comparative Example 5 | A-4 (100) | B-1 (5) | — | D-2 (0.3) | E-1 (790) E-3 (60) |

TABLE 2

|  | Thickness of resist film (μm) | Substrate | PB Temp. (° C.) | PB Time (sec) | PEB Temp. (° C.) | PEB Time (sec) |
|---|---|---|---|---|---|---|
| Example 1 | 0.34 | ARC25 | 130 | 90 | 130 | 90 |
| Example 2 | 0.34 | SiON | 130 | 90 | 130 | 90 |
| Example 3 | 0.34 | ARC25 | 130 | 90 | 130 | 90 |
| Example 4 | 0.34 | ARC25 | 130 | 90 | 130 | 90 |
| Example 5 | 0.34 | ARC25 | 130 | 90 | 130 | 90 |
| Example 6 | 0.34 | ARC25 | 130 | 90 | 130 | 90 |
| Example 7 | 0.34 | ARC25 | 130 | 90 | 130 | 90 |
| Example 8 | 0.34 | ARC25 | 130 | 90 | 130 | 90 |
| Comparative Example 1 | 0.34 | ARC25 | 130 | 90 | 130 | 90 |
| Comparative Example 2 | 0.34 | ARC25 | 130 | 90 | 130 | 90 |
| Comparative Example 3 | 0.34 | ARC25 | 130 | 90 | 130 | 90 |
| Comparative Example 4 | 0.34 | ARC25 | 130 | 90 | 130 | 90 |
| Comparative Example 5 | 0.34 | ARC25 | 130 | 90 | 130 | 90 |

TABLE 3

|  | Radiation transmittance (193 nm, %) | Sensitivity (J/m²) | Line width difference (nm) | Resolution (μm) |
|---|---|---|---|---|
| Example 1 | 79 | 254 | 15 (good) | 0.16 |
| Example 2 | 72 | 246 | 6 (good) | 0.16 |
| Example 3 | 75 | 251 | 12 (good) | 0.16 |
| Example 4 | 73 | 229 | 11 (good) | 0.16 |
| Example 5 | 71 | 248 | 9 (good) | 0.16 |
| Example 6 | 69 | 120 | 20 (good) | 0.15 |
| Example 7 | 72 | 216 | 9 (good) | 0.16 |
| Example 8 | 72 | 380 | −2 (good) | 0.14 |
| Comparative Example 1 | 77 | 254 | 25 (bad) | — |
| Comparative Example 2 | 71 | 247 | 22 (bad) | — |
| Comparative Example 3 | 73 | 250 | 31 (bad) | — |
| Comparative Example 4 | 72 | 227 | 34 (bad) | — |
| Comparative Example 5 | 70 | 245 | 23 (bad) | — |

The radiation-sensitive resin composition of the present invention is used as a chemically-amplified resist sensitive to radiation, particularly deep ultraviolet rays represented by an ArF excimer laser (wavelength: 193 nm), KrF excimer laser (wavelength: 248 nm), and an $F_2$ excimer laser (wavelength: 157 nm). The radiation-sensitive resin composition is capable of forming a minute line pattern even if the space of a line and space pattern is wide, and does not show a large change in line width due to a proximity effect between the lines even at a pitch size up to a semi-dense region (about 1L1.5S, for example). Moreover, the radiation-sensitive resin composition excels in transparency to radiation, sensitivity, resolution, and the like. Therefore, the radiation-sensitive resin composition can be suitably used in the manufacture of semiconductor devices which are expected to become more and more miniaturized.

Obviously, numerous modifications and variations of the present invention are possible in light of the above teachings. It is therefore to be understood that, within the scope of the appended claims, the invention may be practiced otherwise than as specifically described herein.

What is claimed is:

1. A radiation-sensitive resin composition comprising:
   (A) a resin which comprises at least one recurring unit selected from the group consisting of recurring units (I-1), (I-2), and (I-3) shown by the following formula (1), and a recurring unit (II) shown by the following formula (2), and is insoluble or scarcely soluble in alkali, but becomes alkali soluble by action of an acid,

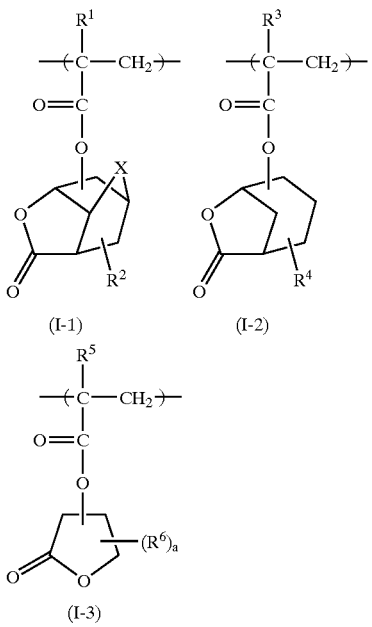

(I-1)    (I-2)

(I-3)

wherein $R^1$, $R^3$, and $R^5$ individually represent a hydrogen atom or a methyl group, and $R^2$, $R^4$, and $R^6$ individually represent a hydrogen atom or a linear or branched alkyl group having 1–4 carbon atoms, X represents a methylene group, an oxygen atom, or a sulfur atom, and a is an integer of 1–5,

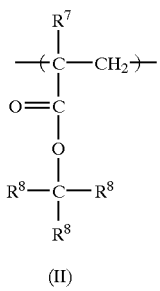

(II)

wherein $R^7$ represents a hydrogen atom or a methyl group, each $R^8$ individually represents a monovalent alicyclic hydrocarbon group having 4–20 carbon atoms or a derivative thereof, or a linear or branched alkyl group having 1–4 carbon atoms, provided that at least one $R^8$ represents a monovalent alicyclic hydrocarbon group having 4–20 carbon atoms or a derivative thereof, or two $R^8$s form, in combination with the carbon atom to which the two $R^8$s bond, a divalent alicyclic hydrocarbon group having 4–20 carbon atoms or a derivative thereof, with the remaining $R^8$ being a linear or branched alkyl group having 1–4 carbon atoms or a monovalent alicyclic hydrocarbon group having 4–20 carbon atoms or a derivative thereof;

(B) a photoacid generator; and (C) a polycyclic compound selected from the group consisting of compounds shown by the following formulae(5) to (8):

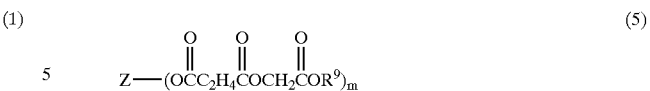

wherein $R^9$ is the same as defined for the formula (4), Z represents a hydrocarbon group with a valence of m which has a polycyclic carbon ring in which the number of carbon atoms which make up the ring is 6–20 or a derivative thereof, and m is an integer of 1–4;

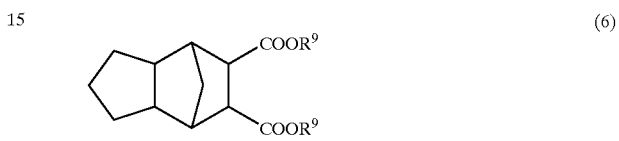

wherein $R^9$ is the same as defined for the formula (4);

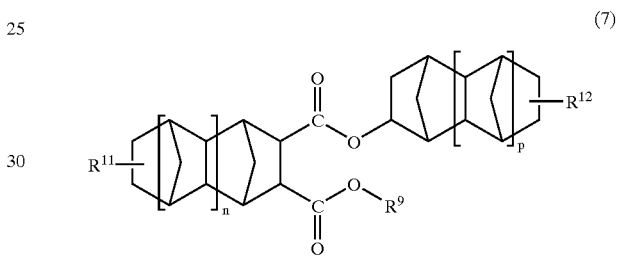

wherein $R^9$ is the same as defined for the formula (4) and $R^{11}$ and $R^{12}$ individually represent a hydrogen atom, a linear or branched alkyl group having 1–4 carbon atoms, a linear or branched hydroxyalkyl group having 1–4 carbon atoms, —$OR^{13}$, wherein $R^{13}$ represents a hydrogen atom, a linear or branched alkyl group having 1–4 carbon atoms, or —$CH_2COOR^{14}$, wherein $R^{14}$ represents a hydrogen atom or an alkyl group having 1–4 carbon atoms, or —$COOR^{15}$, wherein $R^{15}$, represents a hydrogen atom, a substituted or unsubstituled alkyl group having 1–20 carbon atoms, or —$CH_2COOR^{16}$, wherein $R^{16}$ represents a hydrogen atom or an alkyl group having 1–18 carbon atoms, and n and p are integers of 0–2;

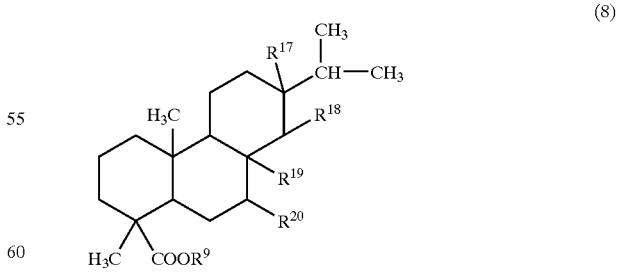

wherein $R^9$ is the same as defined for the formula (4) and $R^{17}$, $R^{18}$, $R^{19}$, and $R^{20}$ individually represent a hydrogen atom, a hydroxyl group, a linear or branched alkyl group having 1–4 carbon atoms, or a linear or branched alkoxyl group having 1–4 carbon atoms.

2. The radiation-sensitive resin composition according to claim 1, wherein at least one recurring unit selected from the group consisting of the recurring units (I-1), (I-2), and (I-3) shown by the formula (1) is the recurring unit (I-1).

3. The radiation-sensitive resin composition according to claim 1, wherein the group —COOC($R^8$)$_3$ in the recurring unit (II) is at least one group selected from the group consisting of a t-butoxycarbonyl group and groups of the following formulas (i-1), (i-2), (i-10),(i-11),(i-13),(i-14),(i-16),(i-17),(i-34),(i-35),(i-40),(i-41),(i-43), (i-47),(i-48), and (i-49), (i-1)
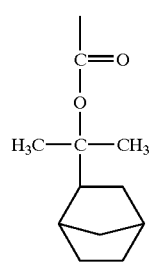

(i-2)
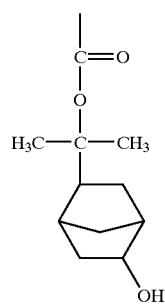

(i-10)
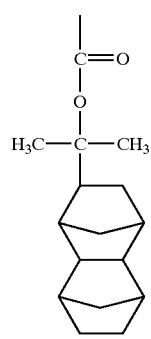

(i-11)
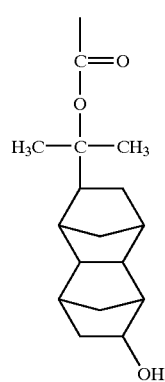

-continued (i-13)
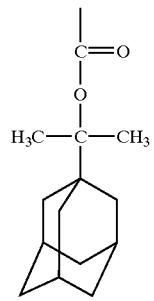

(i-14)
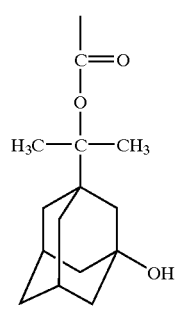

(i-16)
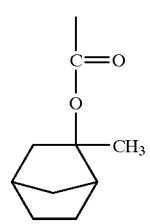

(i-17)
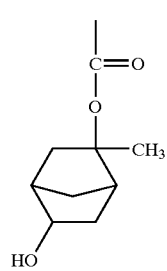

(i-34)
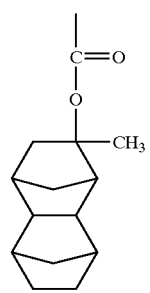

-continued (i-35) 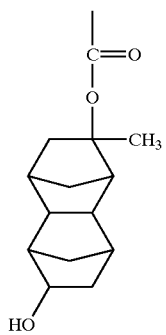

(i-40) 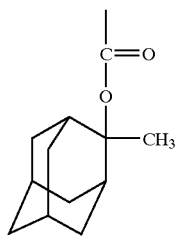

(i-41) 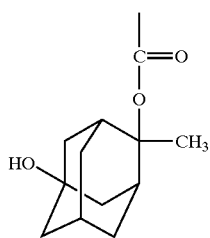

(i-43) 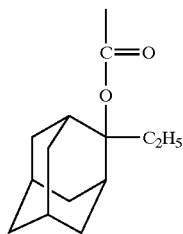

-continued (i-47) 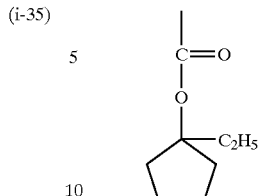

(i-48) 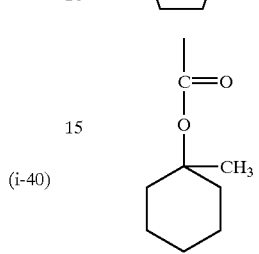

(i-49) 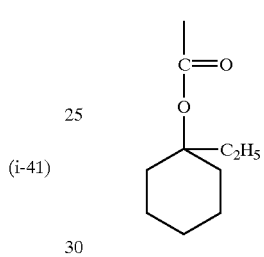

4. The radiation-sensitive resin composition according to claim 1, wherein the resin (A) further comprises at least one recurring unit other than the recurring units (I-1), (I-2), (I-3), and (II).

5. The radiation-sensitive resin composition according to claim 1, wherein the photoacid generator (B) is at least one compound selected from the group consisting of onium salt compounds, halogen-containing compounds, diazoketone compounds, sulfone compounds, and sulfonic acid compounds.

6. The radiation-sensitive resin composition according to claim 1, wherein the amount of the photoacid generator (B) is 1–20 parts by weight for 100 parts by weight of the resin (A).

* * * * *